US009991257B2

(12) United States Patent
Park et al.

(10) Patent No.: US 9,991,257 B2
(45) Date of Patent: Jun. 5, 2018

(54) SEMICONDUCTOR DEVICE HAVING FIN ACTIVE REGIONS AND METHOD OF FABRICATING THE SAME

(71) Applicant: Samsung Electronics Co., Ltd., Suwon-si (KR)

(72) Inventors: Miseon Park, Daegu (KR); Jongryeol Yoo, Osan-si (KR); Hyunjung Lee, Suwon-si (KR); Yong-Suk Tak, Seoul (KR); Bonyoung Koo, Suwon-si (KR); Sunjung Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 3 days.

(21) Appl. No.: 15/013,969

(22) Filed: Feb. 2, 2016

(65) Prior Publication Data

US 2016/0315081 A1    Oct. 27, 2016

(30) Foreign Application Priority Data

Apr. 21, 2015  (KR) .................. 10-2015-0056097

(51) Int. Cl.
*H01L 27/088* (2006.01)
*H01L 29/06* (2006.01)
(Continued)

(52) U.S. Cl.
CPC .. *H01L 27/0886* (2013.01); *H01L 21/823425* (2013.01); *H01L 21/823431* (2013.01); *H01L 29/0649* (2013.01); *H01L 29/0847* (2013.01); *H01L 29/161* (2013.01); *H01L 29/41791* (2013.01)

(58) Field of Classification Search
CPC ............ H01L 21/76289; H01L 21/764; H01L 21/2022; H01L 21/2036; H01L 21/76248; H01L 21/76262; H01L 21/76272; H01L 21/76278; H01L 21/76297; H01L 21/76205; H01L 21/76224; H01L 21/76264
See application file for complete search history.

(56) References Cited

U.S. PATENT DOCUMENTS 8,703,556 B2    4/2014 Kelly et al.
9,029,930 B2    5/2015 Kelly et al.
(Continued)

FOREIGN PATENT DOCUMENTS

KR    10-137645    3/2014

*Primary Examiner* — Julio J Maldonado
*Assistant Examiner* — Stanetta Isaac
(74) *Attorney, Agent, or Firm* — Muir Patent Law, PLLC

(57) ABSTRACT

A semiconductor device may include fin active regions extending parallel to each other on a substrate, an isolation region between the fin active regions, gate patterns intersecting the fin active regions and extending parallel to each other, source/drain areas on the fin active regions between the gate patterns and fin active region spacers contacting side surfaces of the fin active regions and formed over a surface of the isolation region between the fin active regions. Uppermost levels of the fin active region spacers may be higher than interfaces between the fin active regions and the source/drain areas. The upper surface of the isolation region may be lower than bottom surfaces of the source/drain areas.

18 Claims, 43 Drawing Sheets

(51) Int. Cl.
  *H01L 29/161* (2006.01)
  *H01L 29/08* (2006.01)
  *H01L 29/417* (2006.01)
  *H01L 21/8234* (2006.01)

(56) References Cited

U.S. PATENT DOCUMENTS

2013/0341631 A1* 12/2013 Maeda ................. H01L 29/045
                                                      257/64
2014/0061734 A1   3/2014 Basker et al.
2014/0065782 A1*  3/2014 Lu ........................ H01L 29/785
                                                      438/294
2014/0183605 A1   7/2014 Mochizuki et al.
2014/0319581 A1  10/2014 Sung et al.
2015/0303118 A1* 10/2015 Wang ............. H01L 21/823481
                                                      257/401

* cited by examiner

SEMICONDUCTOR DEVICE HAVING FIN ACTIVE REGIONS AND METHOD OF FABRICATING THE SAME

CROSS-REFERENCE TO RELATED APPLICATION

This application claims under 35 U.S.C. § 119 priority to and the benefit of Korean Patent Application No. 10-2015-0056097 filed on Apr. 21, 2015, the entire disclosure of which is incorporated by reference herein.

BACKGROUND

Technical Field

Embodiments of the inventive concept relate to a semiconductor device having fin active regions and a method of fabricating the same.

Description of Related Art

As the degree of integration of semiconductor devices increases, contact areas of epitaxial growth source/drain areas on fin active regions have been reduced by narrowing widths and intervals of the fin active regions. Accordingly, various methods for reducing the contact resistance have been studied.

SUMMARY

Embodiments of the inventive concept provide a semiconductor device in which contact resistance is reduced by increasing a contact area of a contact pattern.

Other embodiments of the inventive concept provide a method of fabricating the semiconductor device.

Other embodiments of the inventive concept provide electronic devices including the semiconductor device.

In accordance with an aspect of the inventive concept, a semiconductor device includes fin active regions extending parallel to each other on a substrate, an isolation region disposed between the fin active regions, gate patterns crossing the fin active regions and extending parallel to each other, source/drain areas on the fin active regions between the gate patterns and fin active region spacers on the isolation region between the fin active regions and contacting side surfaces of the fin active regions. Uppermost levels of the fin active region spacers are higher than interfaces between the fin active regions and the source/drain areas. The interface between the isolation region and the fin active spacers are lower than bottom surfaces of the source/drain areas.

In accordance with another aspect of the inventive concept, a semiconductor device includes fin active regions extending parallel to each other in a first direction on a substrate, the fin active regions including first and second outermost fin active regions and inner fin active regions between the first and second outermost fin active regions, an isolation region disposed adjacent to the fin active regions, gate patterns on first portions of fin active regions, source/drain areas contacting second portions of the fin active regions and inner fin active region spacers on side surfaces of the inner fin active regions. Side surfaces of the inner fin active region spacers are in contact with the side surfaces of the inner fin active regions. Bottom surfaces of the inner fin active region spacers are in contact with a surface of the isolation region. Uppermost levels of the inner fin active region spacers are higher than top surfaces of the second portions of the fin active regions.

In accordance with still another aspect of the inventive concept, a semiconductor device includes a strain buffer layer on a substrate, fin active regions extending parallel to each other in a first direction on the strain buffer layer, an isolation region on the strain buffer layer between the fin active regions and a surface of the isolation region is lower than top surfaces of the fin active regions, gate patterns disposed on the fin active regions and extending parallel to each other in a second direction perpendicular to the first direction, epitaxial material on the fin active regions between the gate patterns, inner fin active region spacers between the fin active regions and outer fin active region spacers on outer side surfaces of outermost fin active regions of the fin active regions. Horizontal widths of the inner fin active region spacers are substantially the same as intervals between the fin active regions. Uppermost levels of the inner fin active region spacers are higher than interfaces between the fin active regions and the epitaxial material and higher than uppermost levels of the outer fin active region spacers.

In accordance with yet another aspect of the inventive concept, a semiconductor device includes a strain buffer layer formed on a substrate and including single crystalline silicon germanium (SiGe), a fin active region formed on the strain buffer layer and including single crystalline silicon germanium (SiGe), an isolation region surrounding the fin active regions, a gate pattern crossing the fin active regions and extending onto the isolation region, epitaxial material disposed on the fin active region at both sides of the gate pattern, and a fin active region spacer on a side surface of the fin active region. A lower side surface of the fin active region spacer is in contact with the side surface of the fin active region. A bottom surface of the fin active region spacer is in contact with the isolation region. An upper portion of the fin active region spacer protrudes above a top surface of the fin active region. A bottom surface of the epitaxial material is lower than an uppermost level of the fin active region spacer and higher than a surface of the isolation region.

According to another embodiment of the disclosure, a semiconductor device includes a fin active pattern formed on a substrate, an isolation pattern surrounding the fin active pattern, a gate pattern that crosses the fin active pattern, source/drain patterns formed on the fin active pattern at both sides of the gate pattern, fin active region spacers formed on the isolation pattern at both sides of the fin active pattern and contacting the fin active pattern, wherein uppermost levels of the fin active region spacers are higher than interfaces between the fin active pattern and the source/drain patterns, and an upper portion of the fin active pattern protrudes above the isolation pattern.

The source/drain patterns may protrude over the fin active region spacers. The source/drain patterns may be connected to each other over the fin active region spacers. A gap may be formed between the source/drain patterns and the fin active region spacers, and the gap may be a vacuum or filled with a gas. A portion of the isolation pattern may be exposed to the gap between the fin active region spacers. The source/drain patterns may include a first epitaxial layer formed on the fin-shaped active pattern, and a second epitaxial layer formed on the first epitaxial layer. The second epitaxial layer may be protruding over the fin active region spacers, the protruding portion of the second epitaxial layer has a polygonal cross-section, and the width of the polygonal cross-section is 60 nm or less. The protruding portion of the second epitaxial layer may be merged with an adjacent protruding portion of a second epitaxial layer, and the horizontal width of the merged portion is 30 nm or less. The fin active region spacers may include a first fin active region spacer formed on a first side of the fin active pattern and a second fin active region spacer formed on a second side surface of the fin active pattern. The height of the first fin active region spacer may be greater than the height of the second fin active region spacer. The heights of the first fin active region spacer and the second fin active region spacer may be 30 nm or less. The semiconductor device may further include contact plugs formed on the source/drain patterns, and gate spacers formed between the gate pattern and the contact plugs. The gate spacers may be formed of the same layer as the fin active region spacers.

Details of other embodiments are included in the detailed description and drawings.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference numerals denote the same respective parts throughout the different views. The drawings are not necessarily to scale, emphasis instead being placed upon illustrating the principles of the inventive concept. In the drawings.

DETAILED DESCRIPTION

Figure 1:
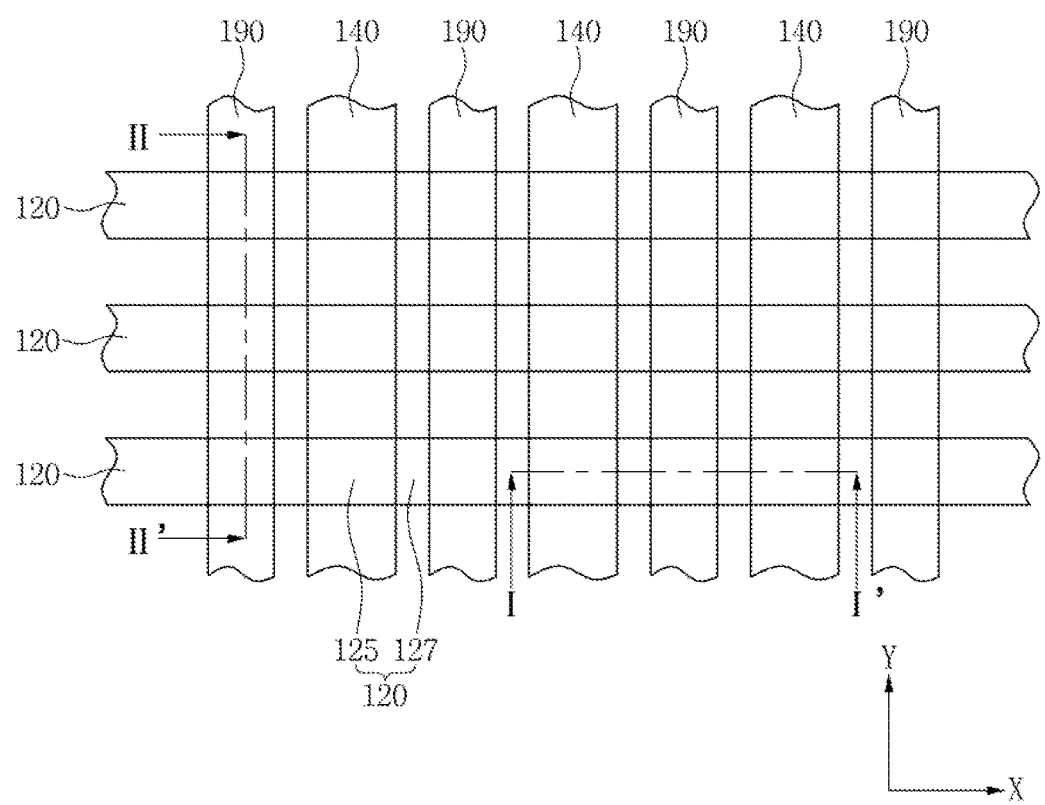
FIG. 1 is a layout showing a semiconductor device according to an embodiment of the inventive concept.

Various exemplary embodiments will now be described more fully with reference to the accompanying drawings. The inventive concept disclosed herein may, however, be embodied in different forms and should not be construed as limited to the exemplary embodiments set forth herein. Rather, these embodiments are provided so that this disclosure is thorough and complete and fully conveys the inventive concept to those skilled in the art.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular form may number one or more unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there is no intervening element or layer present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

As used herein, a semiconductor device may refer to any of the various devices such as shown in FIGS. 1-22, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1 is a layout illustrating a semiconductor device according to an embodiment of the inventive concept.

Referring to FIG. 1, a semiconductor device according to an embodiment of the inventive concept may include fin active regions 120 extending parallel to each other in an X direction, and gate patterns 140 configured to vertically intersect the fin active regions 120 and extending parallel to each other in a Y direction, and contact patterns 190 configured to be located between the gate patterns 140 and vertically intersecting the fin active regions 120 and extending parallel to each other in the Y direction. The fin active regions 120 may include channel areas 125 and source/drain areas 127. For example, the source/drain areas 127 may be formed on the fin active regions 120. The channel areas 125 may overlap the gate patterns 140. The source/drain areas 127 may overlap the contact patterns 190. The fin active regions 120 may also be referred to as fin-shaped active patterns, and the source/drain areas 127 may also be referred to as source/drain patterns.

Figure 2:
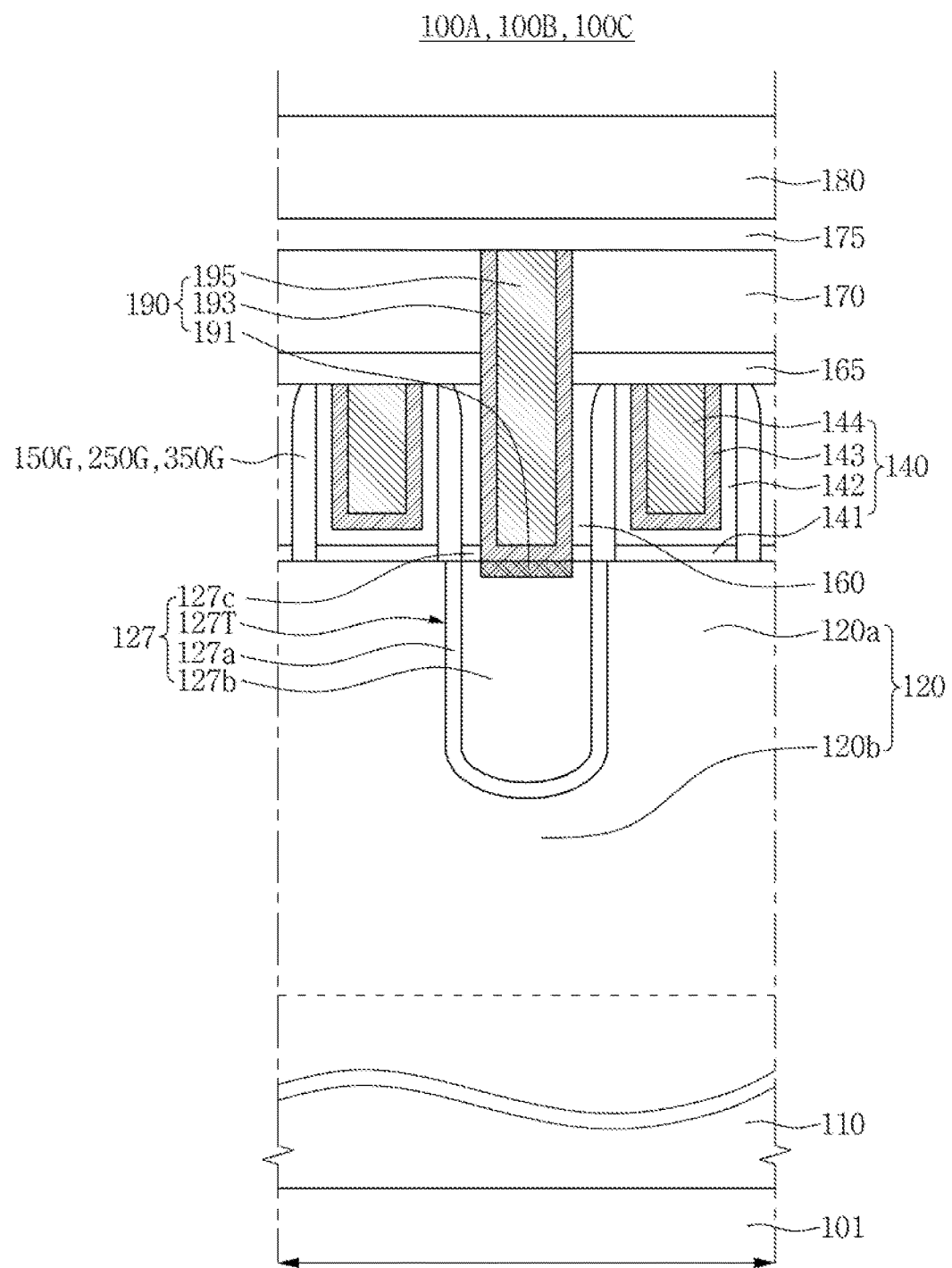
FIGS. 2 to 4B are cross-sectional views taken along lines I-I' and II-II' of FIG. 1 for describing a semiconductor device according to various embodiments of the inventive concept.
Figure 3A:
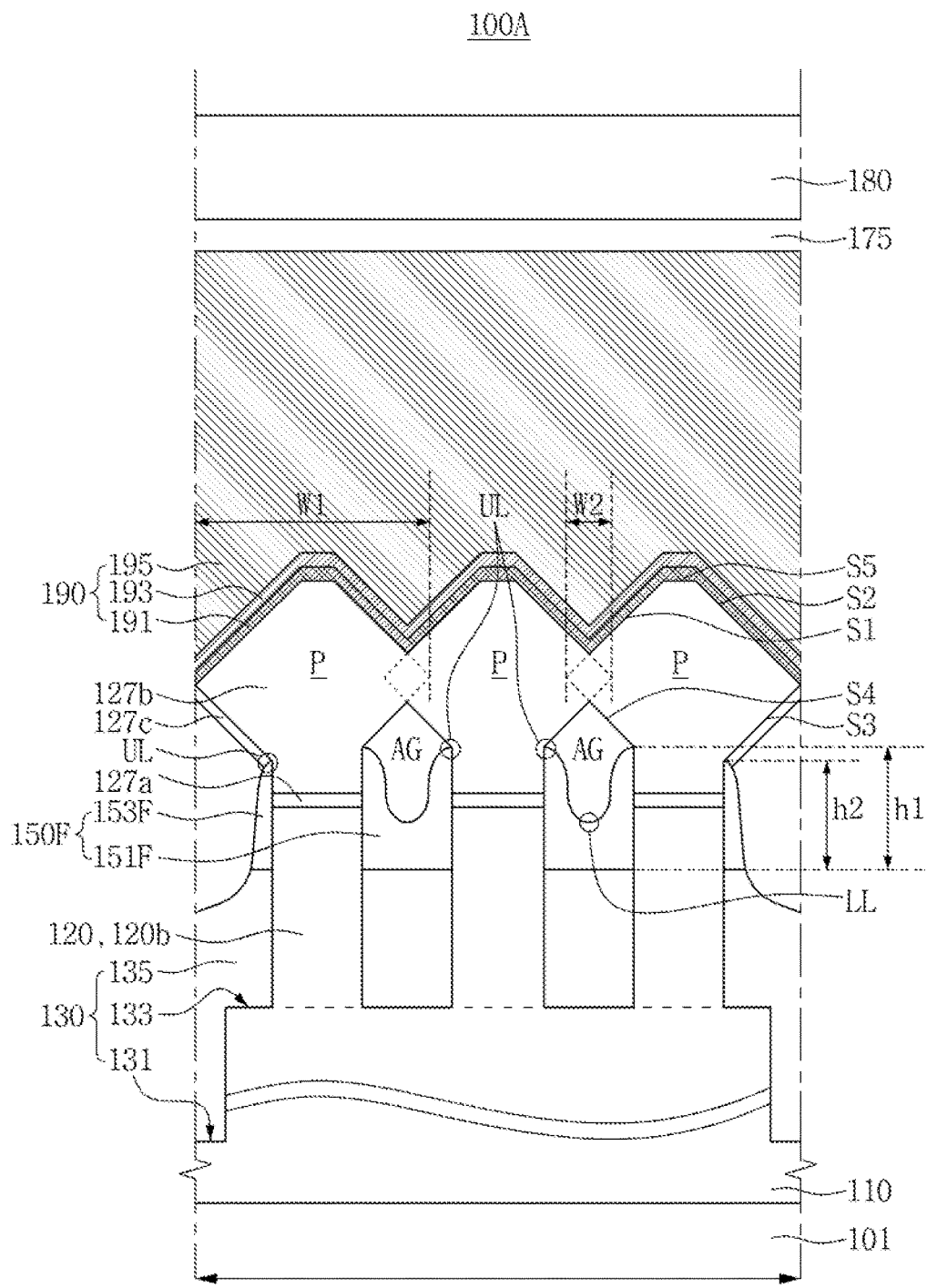

FIG. 2 shows a cross-sectional view illustrating semiconductor devices 100A, 100B, 100C according to various embodiments of the inventive concept, FIG. 3A shows a cross-sectional view illustrating a semiconductor device 100A according to an embodiment of the inventive concept. For example, FIG. 2 show a cross-sectional view taken along line I-I' of FIG. 1, and FIG. 3A shows a cross-sectional view taken along line II-II' of FIG. 1.

Referring to FIGS. 1, 2 and 3A, a semiconductor device 100A in accordance with an embodiment of the inventive concept may include a substrate 101, a strain buffer layer 110, the fin active regions 120, an isolation region 130, the gate patterns 140, and the contact patterns 190. As shown in FIG. 1, the fin active regions may be clustered in a group or an array. The semiconductor device 100A may further include gate spacers 150G on both side surfaces of the gate patterns 140 and fin active region spacers 150F on both side surfaces of the fin active regions 120. The fin active region spacers 150F may include inner fin active region spacers 151F between adjacent fin active regions 120 and outer fin active region spacers 153F on outer side surfaces of outermost fin active regions 120 of the group of fin active regions 120. The isolation region 130 may include a deep trench 131, a shallow trench 133, and trench insulator 135 that fully fills the deep trench 131 and partially fills the shallow trench 133. A deep trench 131 may be formed on either side of the group of fin active regions 120. The isolation region 130 may also be referred to as an isolation pattern.

The substrate 101 may include a single crystalline semiconductor substrate such as a silicon wafer or a silicon-on-insulator (SOI) wafer.

The strain buffer layer 110 may be formed on the substrate 101. The strain buffer layer 110 may include epitaxial growth single crystalline silicon germanium (SiGe). For example, the strain buffer layer 110 may include SiGe having germanium less than or equal to 50%.

The fin active regions 120 may be formed on the strain buffer layer 110. Vertical thicknesses of the fin active regions 120 may be smaller than a vertical thickness of the strain buffer layer 110. The vertical thicknesses of the fin active regions 120 may denote distances from bottom surfaces of the fin active regions 120 in contact with the strain buffer layer 110 to top surfaces of the fin active regions 120 in contact with the gate patterns 140. The vertical thickness of the strain buffer layer 110 may denote a distance from a bottom surface of the strain buffer layer 110 in contact with the substrate 101 to a top surface of the strain buffer layer 110 in contact with the bottom surfaces of the fin active regions 120. For example, the vertical thickness of the strain buffer layer 110 may be about 1 um to 2 um, and the vertical thickness of the fin active regions 120 may be about 50 nm.

The fin active regions 120 may include epitaxial growth single crystalline silicon germanium (SiGe). The germanium content of the fin active regions 120 may be higher than the germanium content of the strain buffer layer 110. For example, the fin active regions 120 may include single crystalline silicon germanium (SiGe) having germanium in a range of 20% to 60%.

The fin active regions 120 may include first portions 120a overlapping the gate patterns 140 and second portions 120b not overlapping the gate patterns 140. The first portions 120a of the fin active regions 120 may include the channel areas 125. The second portions 120b of the fin active regions 120 may include the source/drain areas 127.

The channel areas 125 may be formed in the first portions 120a of the fin active regions.

The source/drain areas 127 may be formed in the second portions 120b of the fin active regions 120. For example, the source/drain areas 127 may be formed between the channel areas 125. The source/drain areas 127 may include source/drain trenches 127T, first epitaxial layers 127a, second epitaxial layers 127b, and third epitaxial layers 127c.

The source/drain trenches 127T may be formed in the second portions 120b of the fin active regions 120 from the top surfaces of the fin active regions 120 toward the top surface of the strain buffer layer 110. Referring to FIG. 2, bottom surfaces B of the source/drain trenches 127T may have a round shape. Inner sidewalls of the source/drain trenches 127T may vertically overlap the gate spacers 150G. Referring to FIG. 3A, the bottom surfaces B of the source/drain trenches 127T, i.e. top surfaces of the second portions 120b of the fin active regions 120, may be located at a higher level than a top surface of the isolation region 130. In certain embodiments, the bottom surfaces B of the source/drain trenches 127T, i.e. top surfaces of the second portions 120b of the fin active regions 120, may be located at a lower level than an uppermost level UL of top surfaces of the inner fin active region spacers 151F and an uppermost level UL of the outer fin active region spacers 153F. In some embodiments, the top surfaces of the second portions 120b of the fin active regions 120 may be located at a higher level than a lowermost level LL of the top surfaces of the inner fin active region spacers 151F.

The first epitaxial layers 127a may be conformally formed on inner walls of the source/drain trenches 127T. Referring to FIG. 3A, the first epitaxial layers 127a may have line-shaped or bar-shaped longitudinal sections. The first epitaxial layers 127a may include epitaxial growth single crystalline silicon germanium (SiGe). The germanium content of the first epitaxial layers 127a may be higher than the germanium content of the fin active regions 120. For example, the first epitaxial layers 127a may include single crystalline silicon germanium (SiGe) having germanium in a range of 25% to 65%. For example, the bottom surfaces of the first epitaxial layers 127a may form bottom surfaces of the source/drain areas.

The second epitaxial layers 127b may be formed on the first epitaxial layers 127a to fill the source/drain trenches 127T. Referring to FIG. 3A, the second epitaxial layers 127b may include epitaxial growth protruding parts P on the fin active region spacers 150F. The protruding parts P of the second epitaxial layers 127b may have polygon-shaped longitudinal sections. For example, the protruding parts P may have five surfaces. For example, the protruding parts P may include first upper surfaces S1, second upper surfaces S2, first lower surfaces S3, second lower surfaces S4, and third upper surfaces S5 connecting upper ends of the first upper surfaces S1 to upper end of the second upper surfaces S2. The first upper surfaces S1, the second upper surfaces S2, the first lower surfaces S3, and the second lower surfaces S4 may have inclined planes, for example, {111} crystallographic orientation planes. The first upper surfaces S1 may be parallel to the first lower surfaces S3 in a first diagonal direction. The second upper surfaces S2 may be parallel to the second lower surfaces S4 in a second diagonal direction perpendicular to the first diagonal direction. The third upper surfaces S5 may be parallel to the top surfaces of the second portions 120b of the fin active regions 120. For example, upper ends of the second epitaxial layers 127b may be substantially flat. For example, the second epitaxial layers 127b form parts of the source/drain areas, and the protruding parts P of the second epitaxial layers 127b form parts of the source/drain areas. Therefore, the description of the protruding parts P of the second epitaxial layers 127b is applied to the description of the source/drain areas. For example, the source/drain areas have protruding parts P having polygonal cross-sections and the protruding parts P of the source/drain areas have upper surfaces S1 and S2, and lower surfaces S3 and S4.

Further, the protruding parts P may be connected to each other in a bridge shape. For example, lower ends of the first upper surfaces S1 may be connected to lower ends of the second upper surfaces S2 of adjacent protruding parts P, and upper ends of the first lower surfaces S3 may be connected to upper ends of the second lower surfaces S4 of adjacent protruding parts P.

A first upper surface S1, a second upper surface S2, a first lower surface S3, and a second lower surface S4 of the protruding parts P epitaxially grown on the outer fin active region spacers 153F may grow relatively long in a lateral direction. This may be because the uppermost level UL of the outer fin active region spacer 153F is located at a lower level than the uppermost level UL of the inner fin active region spacers 151F.

Referring to FIG. 3A, horizontal widths W1 of each of the second epitaxial layers 127b may be less than or equal to 60 nm. The horizontal widths W1 of the second epitaxial layers 127b may denote distances between lateral vertices of each of the second epitaxial layers 127b. Horizontal widths W2 of merged portions of the second epitaxial layers 127b may be less than or equal to 30 nm. The merged portions of the second epitaxial layers 127b are indicated by dotted lines in FIG. 3A. When horizontal widths W2 of the merged portions of the second epitaxial layers 127b exceed 30 nm, contact resistance may be increased by reducing contact areas of the contact patterns 190 by reducing lateral lengths of the first upper surfaces S1 and the second upper surface S2 of the second epitaxial layers 127b that contact the contact patterns 190.

The second epitaxial layers 127b may include epitaxial growth single crystalline silicon germanium (SiGe). The germanium content of the second epitaxial layers 127b may be higher than the germanium content of the first epitaxial layers 127a. For example, the second epitaxial layers 127b may include single crystalline silicon germanium (SiGe) having germanium in a range of 30% to 100%.

The third epitaxial layers 127c may be partially conformally formed on the second epitaxial layers 127b. For example, referring to FIG. 2, the third epitaxial layers 127c may be formed on the second epitaxial layers 127b to contact side surfaces of the contact patterns 190. Referring to FIG. 3A, in certain embodiments, the third epitaxial layers 127c may be formed on a part of the lower surfaces of the second epitaxial layers 127b. For example, the third epitaxial layers 127c may be only formed on the first lower surface S3 and the second lower surface S4 that growing on the outer fin active region spacers 153F. In certain embodi-ments, the third epitaxial layers 127c may not be formed on the first lower surface S3 and the second lower surface S4 that growing on the inner fin active region spacers 151F. In certain embodiments, the third epitaxial layers 127c may be formed on the upper surfaces S1 and/or S2 of the protruding parts P of the second epitaxial layers 127b. The third epitaxial layers 127c may include epitaxial growth single crystalline silicon germanium (SiGe) or single crystalline silicon (Si). The germanium content of the third epitaxial layers 127c may be lower than the germanium content of the second epitaxial layers 127b.

The isolation region 130 may surround lower portions of the fin active regions 120 to define the fin active regions 120. Accordingly, the lower portions of the fin active regions 120 may be in contact with the isolation region 130, and upper portions of the fin active regions 120 may protrude above a top surface of the isolation region 130.

The top surface of the isolation region 130 may be located at a lower level than the bottom surfaces B of the source/drain trenches 127T, i.e. top surfaces of the second portions 120b of the fin active regions 120. The isolation region 130 may include an insulating material such as silicon oxide.

The gate patterns 140 may be formed on the first portions 120a of the fin active regions 120. The gate patterns 140 may include surface insulating patterns 141, gate insulating patterns 142, gate barrier patterns 143, and gate electrode patterns 144.

The surface insulating patterns 141 may be conformally formed on the first portions 120a of the fin active regions 120. Referring to FIG. 2, the surface insulating patterns 141 may have horizontal bar-shaped longitudinal sections. The surface insulating patterns 141 may include a natural oxide layer that is formed by oxidizing the surfaces of the fin active regions 120, thermally oxidized silicon, or silicon oxide that is deposited by performing an ALD process. In certain embodiments, the surface insulating patterns 141 may be omitted.

The gate insulating patterns 142 may be formed on the surface insulating patterns 141. Referring to FIG. 2, the gate insulating patterns 142 may have U-shaped longitudinal sections. For example, outer side surfaces of the gate insulating patterns 142 may be in contact with inner side surfaces of the gate spacers 150G. The gate insulating patterns 142 may include a high-k dielectric insulator, such as hafnium oxide (HfO), taluminum oxide (AlO), zirconium oxide (ZrO), lanthanum oxide (LaO), or another metal oxide.

The gate barrier patterns 143 may be formed on the gate insulating patterns 142. Referring to FIG. 2, the gate barrier patterns 143 may have U-shaped longitudinal sections. For example, outer side surfaces of the gate barrier patterns 143 may be in contact with inner side surfaces of the gate insulating patterns 142. The gate barrier patterns 143 may include a barrier metal, such as titanium (Ti), titanium nitride (TiN), tanttalum (Ta), tanttalum nitride (TaN), or titanium tungsten (TiW).

The gate electrode patterns 144 may be formed on the gate barrier patterns 143. Side and bottom surfaces of the gate electrode patterns 144 may be surrounded by the gate barrier patterns 143. The gate electrode patterns 144 may include a highly conductive metal, such as tungsten (W) or copper (Cu). Top surfaces of the gate insulating patterns 142, top surfaces of the gate barrier patterns 143, and top surfaces of the gate electrode patterns 144 may be coplanar.

The gate spacers 150G may be in contact with side surfaces of the surface insulating patterns 141, outer surfaces of the gate insulating patterns 142, and a part of the top surfaces of the first portions 120a of the fin active regions 120, top surfaces of the first epitaxial layers 127a, and side surfaces of the third epitaxial layers 127c.

The fin active region spacers 150F may be in contact with side surfaces of the fin active regions 120, and the top surface of the isolation region 130. For example, side surfaces of the fin active region spacers 150F may be in contact with side surfaces of the second portions 120b of the fin active regions 120, and bottom surfaces of the fin active region spacers 150F may be in contact with the top surface of the isolation region 130.

Referring to FIG. 3A, the fin active region spacers 150F may include the inner fin active region spacers 151F that are located between the fin active regions 120, and the outer fin active region spacers 153F that are located on the outer side surfaces of the outermost fin active regions 120 of the group of the fin active regions 120. Lower widths of the inner fin active region spacers 151F may be substantially the same as intervals between the fin active regions 120. Accordingly, the top surface of the isolation region 130 that is located between the fin active regions 120 may not be exposed.

Top surfaces of the inner fin active region spacers 151F may have concave bowl shapes. Gaps AG may be formed between the second epitaxial layers 127b and the top surfaces of the inner fin active region spacers 151F. The gaps AG may be referred herein as air gaps. For example, the air gaps AG may be formed between the first and second lower surfaces S3 and S4 and the top surfaces of the inner fin active region spacers 151F. Although the gaps are referred to herein as "air gaps", as understood in the art, the air gaps AG need not include air, but may contain a vacuum or be filled with a gas other than air, such as nitrogen, argon, etc.

Uppermost levels UL of the inner fin active region spacers 151F may be located at a higher level than uppermost levels UL of the outer fin active region spacers 153F. Uppermost levels UL of the inner fin active region spacers 151F and the outer fin active region spacers 153F may be located at a higher level than interfaces between the second portions 120b of the fin active regions 120 and the first epitaxial layers 127a. Accordingly, lower side surfaces of the inner fin active region spacers 151F and the outer fin active region spacers 153F may be in contact with the side surfaces of the second portions 120b of the fin active regions 120. Upper portions of the inner fin active region spacers 151F and the outer fin active region spacers 153F may protrude from surfaces of the second portions 120b of the fin active regions 120. The uppermost levels UL of the inner fin active region spacers 151F and the outer fin active region spacers 153F may be located at a higher level than surfaces of the first epitaxial layers 127a on the second portions 120b of the fin active regions 120. The lowermost levels LL of the inner fin active region spacers 151F may be located at a lower level than interfaces between the second portions 120b of the fin active regions 120 and the first epitaxial layers 127a.

A vertical thickness h1 of the inner fin active region spacers 151F may be greater than a vertical thickness h2 of the outer fin active region spacers 153F. The vertical thickness h1 of the inner fin active region spacers 151F may denote distances from bottom surfaces of the inner fin active region spacers 151F in contact with the surface of the isolation region 130 to the uppermost levels UL of the inner fin active region spacers 151F. The vertical thickness h2 of the outer fin active region spacers 153F may denote distances from bottom surfaces of the outer fin active region spacers 153F in contact with the surface of the isolation region 130 to the uppermost levels UL of the outer fin active region spacers 153F.

As described above, lateral lengths of the first lower surface S3 and the second lower surface S4 of the protruding parts P epitaxially grown on the outer fin active region spacers 153F, may be longer than lateral lengths of the first lower surface S3 and the second lower surface S4 of the protruding parts P epitaxially grown on the inner fin active region spacers 151F due to the uppermost levels UL of the inner fin active region spacers 151F being located at a higher level than the uppermost levels UL of the outer fin active region spacers. In certain embodiments, lateral lengths of the first upper surface S1 and the second upper surface S2 of the protruding parts P epitaxially grown on the outer fin active region spacers 153F, may be longer than lateral lengths of the first upper surface S1 and the second upper surface S2 of the protruding parts P epitaxially grown on the inner fin active region spacers 151F. For example, lateral growth of the second epitaxial layers 127b may be controlled by the vertical thickness of the fin active region spacers 150F.

The vertical thickness h1 of the inner fin active region spacers 151F and/or the vertical thickness h2 of the outer fin active region spacers may be less than or equal to 30 nm. When the vertical thickness h1 of the inner fin active region spacers 151F and the vertical thickness h2 of the outer fin active region spacers exceed 30 nm, the second epitaxial layers 127b may not be connected to each other by reducing the lateral growth of the second epitaxial layers 127b.

The gate spacers 150G and the fin active region spacers 150F may include silicon nitride (SiN), silicon oxynitride (SiON), silicon oxycarbide (SiOC), silicon oxycarbonitride (SiOCN), or silicon borocarbonitride (SiBCN).

The contact patterns 190 may be formed on the source/drain areas 127. For example, each of the contact patterns 190 may be formed so as to cover the source/drain areas 127 connected to each other in a bridge shape. Accordingly, each of the contact patterns 190 may be in contact with a plurality of source/drain areas 127.

The contact patterns 190 may include a silicide layer 191, contact barrier patterns 193, and contact plugs 195.

The silicide layer 191 may be conformally formed on the source/drain areas 127. The silicide layer 191 may be directly formed on the source/drain areas 127. For example, the silicide layer 191 may be in direct contact with the second epitaxial layers 127b of the source/drain areas 127. The silicide layer 191 may include tungsten silicide (WSi), nickel silicide (NSi), titanium silicide (TiSi), cobalt silicide (CoSi), or another metal silicide. Referring to FIG. 2, a top surface of the silicide layer 191 may be substantially coplanar with top surfaces of the first and the second epitaxial layers 127a and 127b. In certain embodiments, the top surface of the silicide layer 191 may be located at a higher level than the top surfaces of the first and the second epitaxial layers 127a and 127b.

The contact barrier patterns 193 may be formed on the silicide layer 191 to have U-shaped longitudinal sections. The contact barrier patterns 193 may include titanium (Ti), titanium nitride (TiN), tantalum (Ta), tantalum nitride (TaN), or another barrier metal.

The contact plugs 195 may be formed on bottom surfaces and inner walls of the contact barrier patterns 193 to be surrounded by the contact barrier patterns 193. The contact plugs 195 may include tungsten (W), copper (Cu), titanium (Ti), or a metal compound. Top surfaces of the contact plugs 195 may be coplanar with top surfaces of the contact barrier patterns 193.

The semiconductor device 100A may further include a lower interlayer insulating layer 160, a lower stopper layer 165, an intermediate interlayer insulating layer 170, an upper stopper layer 175, and an upper interlayer insulating layer 180.

The lower interlayer insulating layer 160 may be formed between the gate spacers 150G on both side surfaces of the gate patterns 140 and both side surfaces of the contact patterns 190 to cover the source/drain areas 127. A top surface of the lower interlayer insulating layer 160, top surfaces of the gate patterns 140, and top surfaces of the gate spacers 150G may be coplanar. The lower interlayer insulating layer 160 may include silicon oxide.

The lower stopper layer 165 may be formed on the lower interlayer insulating layer 160. The lower stopper layer 165 may be passed through by the contact patterns 190. The lower stopper layer 165 may include silicon nitride.

The intermediate interlayer insulating layer 170 may be formed on the lower stopper layer 165. The intermediate interlayer insulating layer 170 may be passed through by the contact patterns 190. A top surface of the intermediate interlayer insulating layer 170 may be substantially coplanar with the top surfaces of the contact patterns 190. The intermediate interlayer insulating layer 170 may include silicon oxide.

The upper stopper layer 175 may be formed on the intermediate interlayer insulating layer 170. The upper stopper layer 175 may include silicon oxide.

The upper interlayer insulating layer 180 may be formed on the upper stopper layer 175. The upper interlayer insulating layer 180 may include silicon oxide.

The semiconductor device 100A according to an embodiment of the inventive concept has been described above. The semiconductor device 100A can include fin active regions 120 having single crystalline silicon germanium (SiGe). Accordingly, hole mobility in a channel area 125 may be increased by stably applying a compressive strain to the channel area 125. As a result, electrical characteristics of the semiconductor device may be improved.

For example, the semiconductor device 100A may include a strain buffer layer 110 having the germanium content lower than the germanium content of the fin active region 120 between the substrate 101 and the fin active regions 120. The strain buffer layer 110 may be helpful to reduce a problem caused by a stacking fault that occurs in the fin active regions 120 when the fin active regions 120 are directly formed on the substrate 101 and have a high germanium content. As a result, the compressive strain applied to a channel area 125 may not be decreased by use of the strain buffer layer 110.

For example, in the semiconductor device 100A, lateral lengths of the epitaxial growth source/drain areas 127 may be controlled by controlling the heights of the fin active region spacers 150F on side surfaces of the fin active regions 120. As a result, the contact area between the source/drain areas 127 and contact patterns 190 may be increased.

Figure 3B:
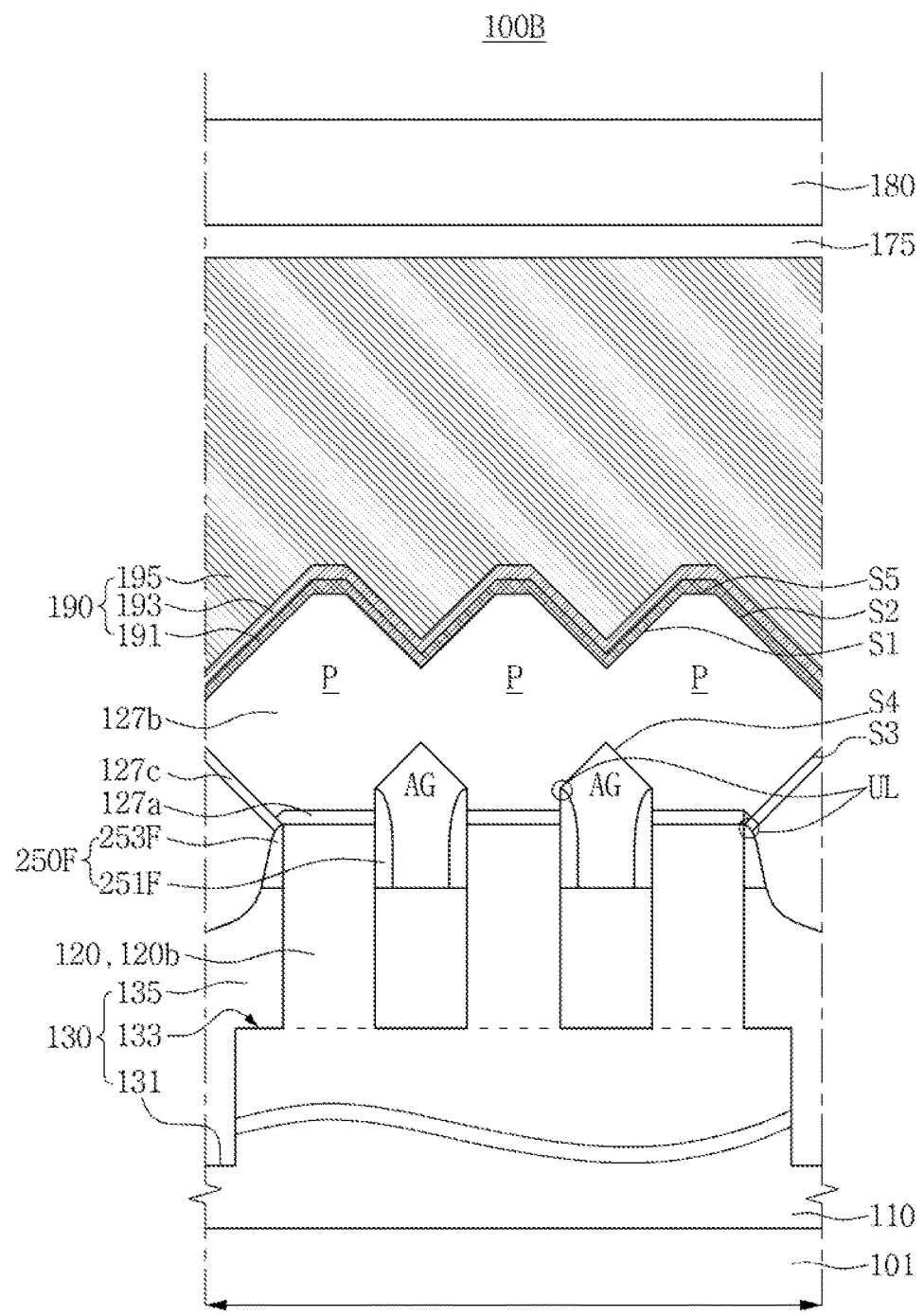

FIG. 3B is a cross-sectional view of a semiconductor device 100B according to an embodiment of the inventive concept. For example, FIG. 3B is a cross-sectional view taken along line II-II' of FIG. 1. Detailed descriptions of the same contents as those of the above-described embodiments will be omitted from the below descriptions.

Referring to FIG. 3B, the semiconductor device 100B may include inner fin active region spacers 251F on side surfaces of the fin active regions 120 between the fin active regions 120 and outer fin active region spacers 253F on outer side surfaces of the outermost fin active regions 120. Inner side surfaces of the inner fin active region spacers 251F may be in contact with the side surfaces of the fin active regions 120, and bottom surfaces of the inner fin active region spacers 251F may be in contact with parts of surfaces of isolation regions 130. Accordingly, the surfaces of the isolation regions 130 that are located between the inner fin active region spacers 251F may be exposed. As a result, air gaps AG may be formed between the outer side surfaces of the inner fin active region spacers 251F, the surface of the isolation region 130, and first and second lower surfaces S3 and S4 of second epitaxial layers 127b. The air gaps AG may be vacuum or filled with air or a gas such as nitrogen gas, argon gas, etc.

Uppermost levels UL of the inner fin active region spacers 251F may be located at a higher level than interfaces between second portions 120b of the fin active regions 120 and first epitaxial layers 127a. The uppermost levels UL of the outer fin active region spacers 253F may be located at substantially the same level as or a lower level than or the interfaces between the second portions 120b of the fin active regions 120 and the first epitaxial layers 127a.

Figure 3C:
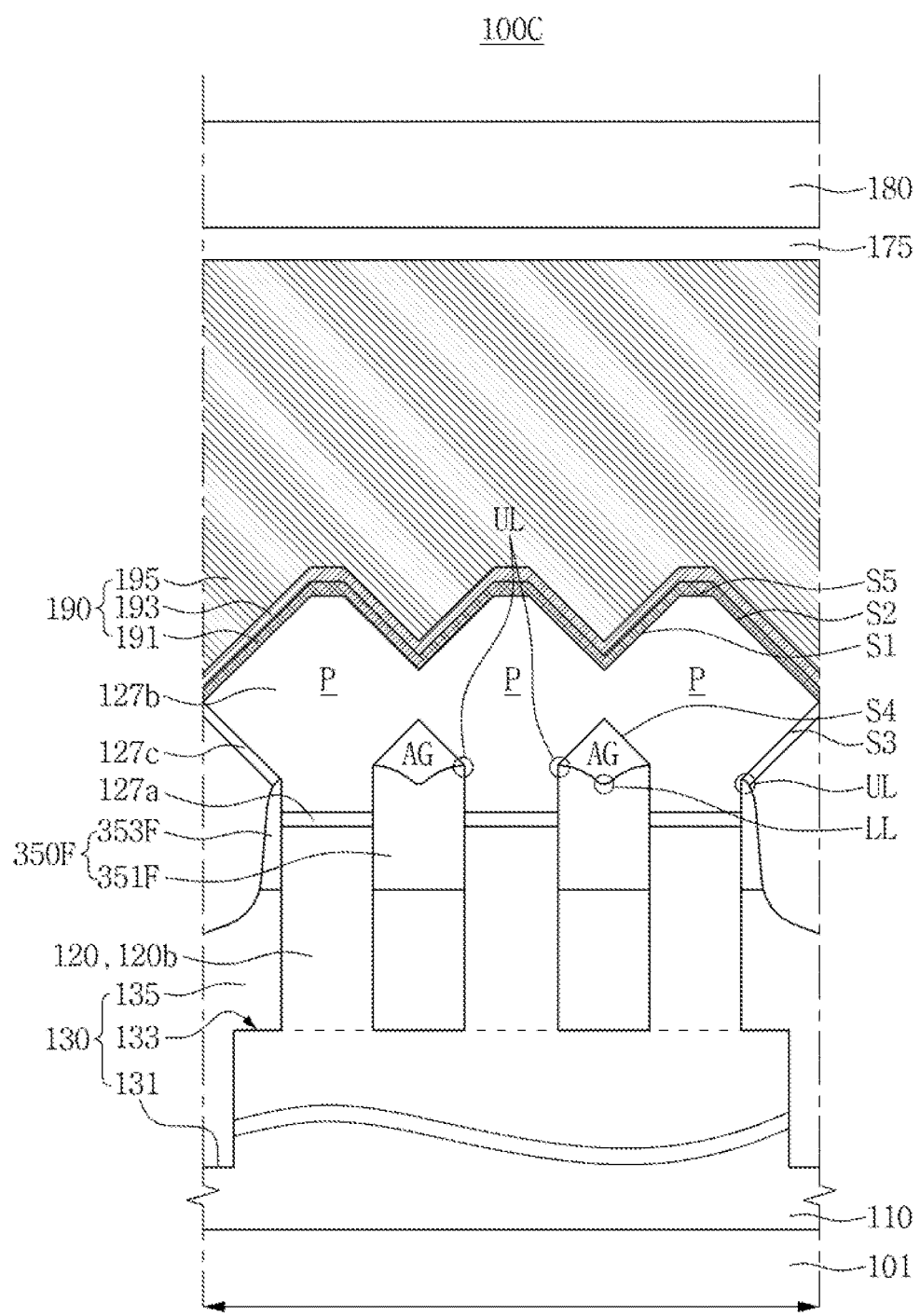

FIG. 3C is a cross-sectional view of a semiconductor device 100C according to an embodiment of the inventive concept. For example, FIG. 3C is a cross-sectional view taken along line II-II' of FIG. 1. Detailed descriptions of the same contents as those of the above-described embodiments will be omitted from the below descriptions.

Referring to FIG. 3C, the semiconductor device 100C may include inner fin active region spacers 351F almost filling between fin active regions 120, compared to the semiconductor device 100A in FIG. 3A. This is because intervals between the fin active regions 120 are smaller than intervals between fin active regions 120 of the semiconductor device 100A in FIG. 3A. Top surfaces of the inner fin active region spacers 351F may have concave bowl shapes. Top surfaces of the inner fin active region spacers 351F may have a relatively shallow concave bowl shape, compared to the semiconductor device 100A in FIG. 3A. Accordingly, relatively small sized air gaps AG may be formed between the top surfaces of the inner fin active region spacers 351F and second epitaxial layers 127b. The air gaps AG may be vacuum or filled with air or a gas such as nitrogen gas, argon gas, etc.

Figure 4A:
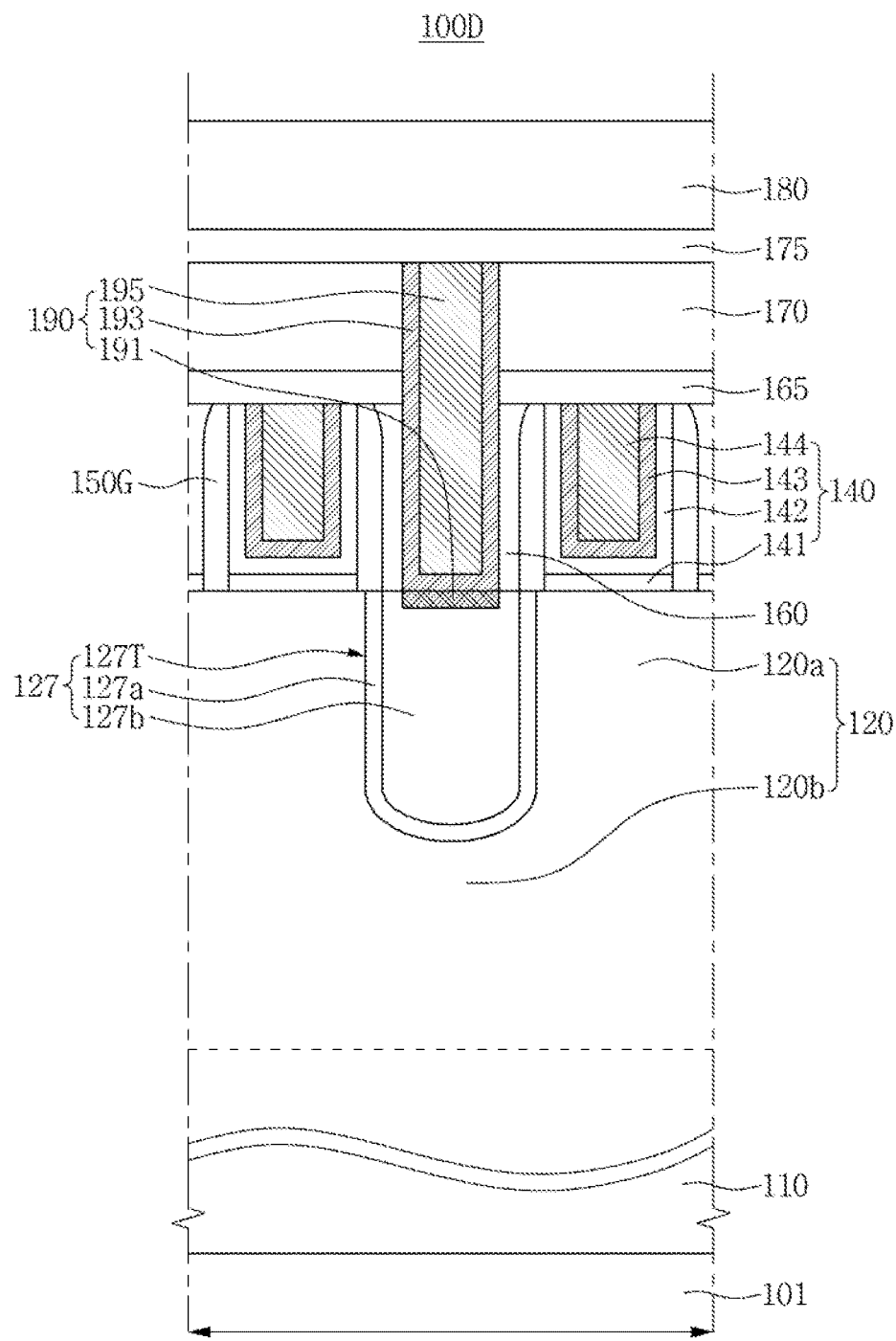
Figure 4B:
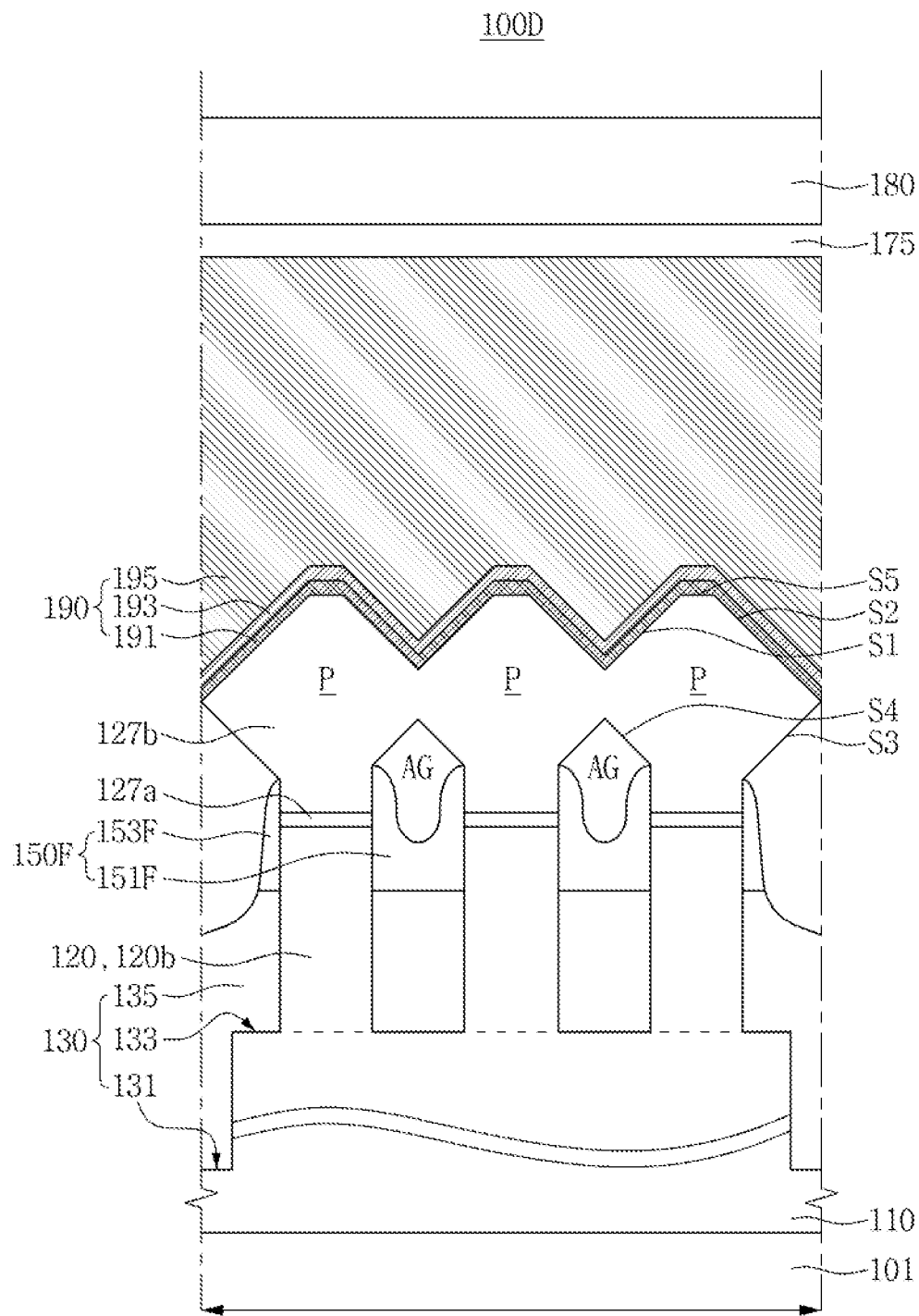

FIGS. 4A and 4B are cross-sectional views of a semiconductor device 100D according to an embodiment of the inventive concept. For example, FIG. 4A is cross-sectional view taken along line I-I' of FIG. 1 and FIG. 4B is cross-sectional view taken along line II-II' of FIG. 1. Detailed descriptions of the same contents as those of the above-described embodiments will be omitted from the below descriptions.

Referring to FIGS. 1, 4A and 4B, in the semiconductor device 100D, the third epitaxial layers 127c disposed on second epitaxial layers 127b may be omitted, compared to the semiconductor device 100A in FIG. 3A.

FIGS. 5A to 20B are views illustrating methods of fabricating a semiconductor device according to embodiments of the inventive concept. For example, FIGS. 5A to 20A are cross-sectional views taken along line I-I' of FIG. 1, FIGS. 5B to 20B are cross-sectional views taken along line II-II' of FIG. 1.

Figure 5A:
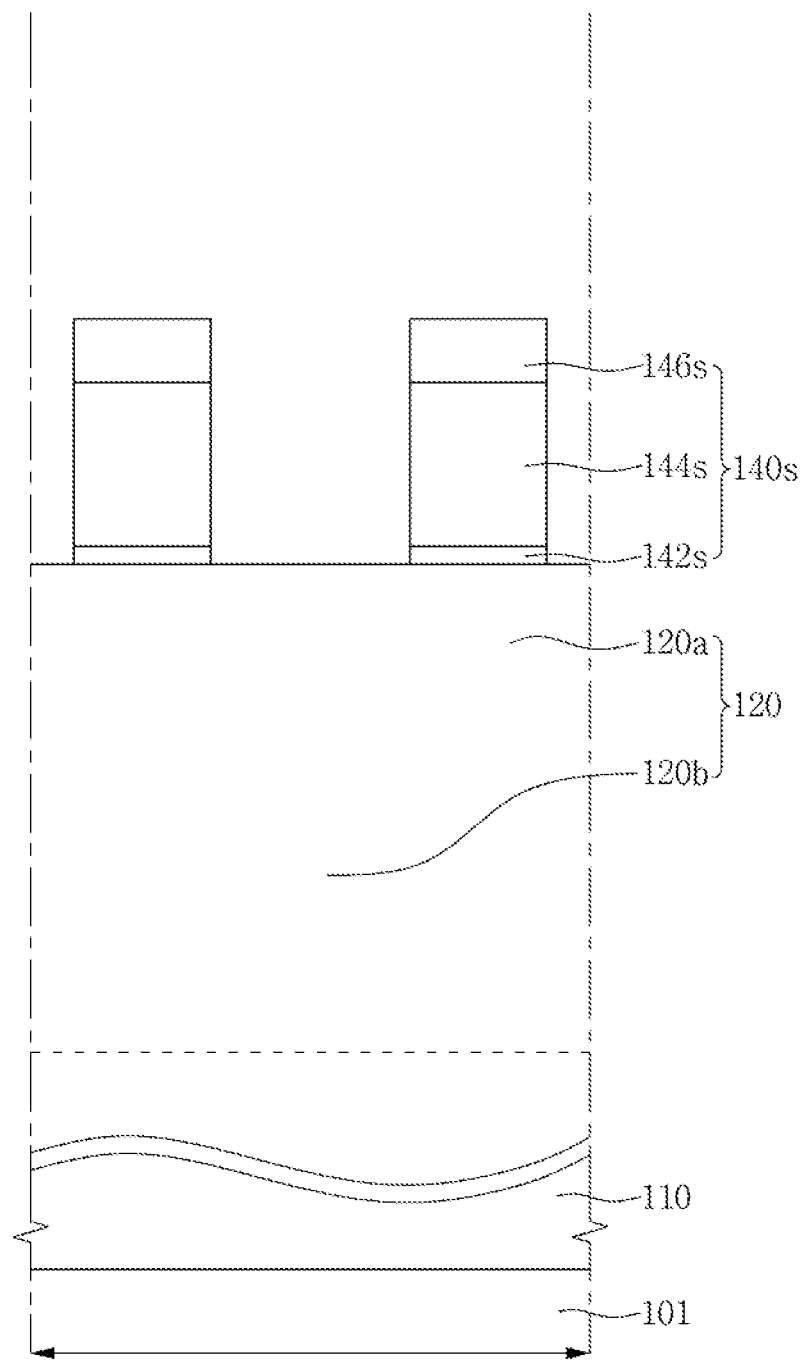
FIGS. 5A to 21B are cross-sectional views taken along lines I-I' and II-II' of FIG. 1 for describing methods of fabricating a semiconductor device according to embodiments of the inventive concept.
Figure 5B:
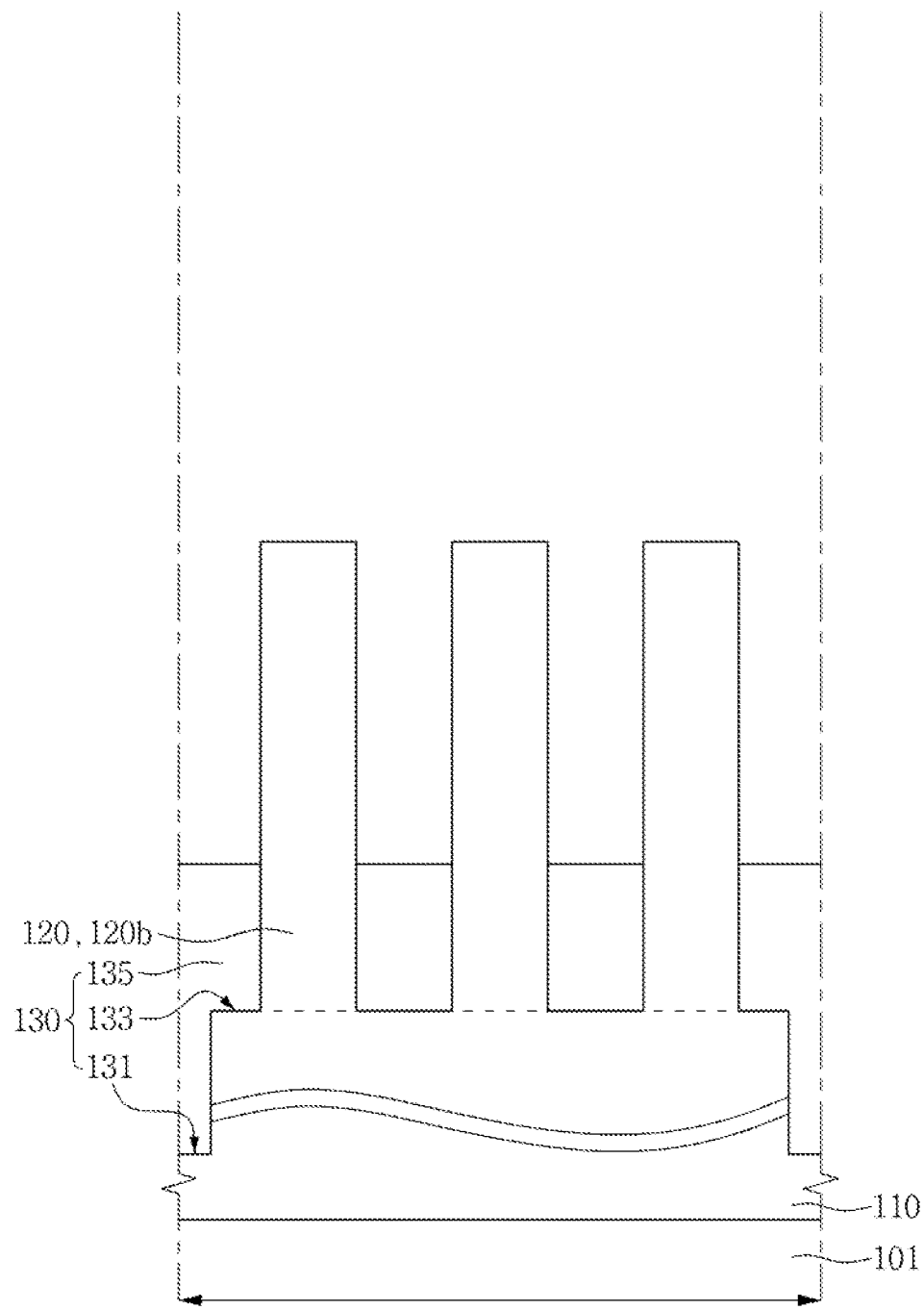

Referring to FIGS. 5A and 5B, a method of fabricating a semiconductor device 100A in accordance with an embodiment of the inventive concept may include preparing a substrate 101, forming a strain buffer layer 110 on the substrate 101, and forming fin active regions 120, an isolation region 130, and sacrificial gate patterns 140s on the strain buffer layer.

The substrate 101 may include a single crystalline semiconductor substrate such as a silicon wafer or SOI wafer.

The strain buffer layer 110 may be formed on the substrate 101 by performing an epitaxial growth process. The strain buffer layer 110 may include epitaxial growth single crystalline silicon germanium (SiGe). A vertical thickness of the strain buffer layer 110 may be about 1 um to 2 um. The vertical thickness of the strain buffer layer 110 may denote a distance from a bottom surface of the strain buffer layer 110 in contact with the substrate 101 to a top surface of the strain buffer layer 110. The strain buffer layer 110 may include SiGe having germanium less than or equal to 50%.

The fin active regions 120 may be formed on the strain buffer layer 110 parallel to each other. The forming of the fin active regions 120 on the strain buffer layer 110 may include forming an epitaxial layer on the strain buffer layer 110 by performing an epitaxial growth process, forming a recess mask on the epitaxial layer, and forming the fin active regions 120 and trenches by selectively etching the epitaxial layer using the recess mask as an etch mask. The trenches may include deep trenches 131 and shallow trenches 133. The depth of the shallow trenches 133 may be substantially the same as the vertical thickness of the fin active regions 120. Accordingly, a top surface of the strain buffer layer 110 may be exposed by the bottom surfaces of the shallow trenches 133. In certain embodiments, the depth of the shallow trenches 133 may be smaller than the vertical thickness of the fin active regions 120.

The fin active regions 120 may include epitaxial growth single crystalline silicon germanium (SiGe). The germanium content of the fin active regions 120 may be higher than the germanium content of the strain buffer layer 110. For example, the fin active regions 120 may include single crystalline silicon germanium (SiGe) having germanium in a range of 20% to 60%.

The fin active regions 120 may include first portions 120a overlapping the sacrificial gate patterns 140s, and second portions 120b not overlapping the sacrificial gate patterns 140s and exposing surfaces of the fin active regions 120.

The forming of the isolation region 130 may include filling the deep trenches 131 and the shallow trenches 133 with a trench insulator 135, planarizing the surface of the trench insulator 135 by performing a planarization process, such as chemical mechanical polishing (CMP), to expose a surface of the recess mask, and recessing the top surface of the trench insulator 135 by performing an etch-back process so that the top surface of the trench insulator 135 is lower than the top surface of the fin active regions 120. The trench insulator 135 may include silicon oxide. The trench insulator 135 may fully fill the deep trenches 131, and partially fill the shallow trenches 133. Accordingly, a part of the fin active regions 120 may protrude from the surface of the isolation region 130. For example, lower side surfaces of the fin active regions 120 may be surrounded by the isolation region 130, and top surfaces and upper side surfaces of the fin active regions 120 may not be surrounded by the isolation region 130 and may be exposed.

The sacrificial gate patterns 140s may include sacrificial gate insulating patterns 142s on surfaces of the fin active regions 120, sacrificial gate electrode patterns 144s on the sacrificial gate insulating patterns 142s, and sacrificial gate mask patterns 146s on the sacrificial gate electrode patterns 144s. The sacrificial gate insulating patterns 142s may include a natural oxide layer that is formed by oxidizing the surfaces of the fin active regions 120, thermally oxidized silicon, or silicon oxide that is deposited by performing an ALD process. The sacrificial gate electrode patterns 144s may include polysilicon. The sacrificial gate mask patterns 146s may include silicon nitride.

Figure 6A:
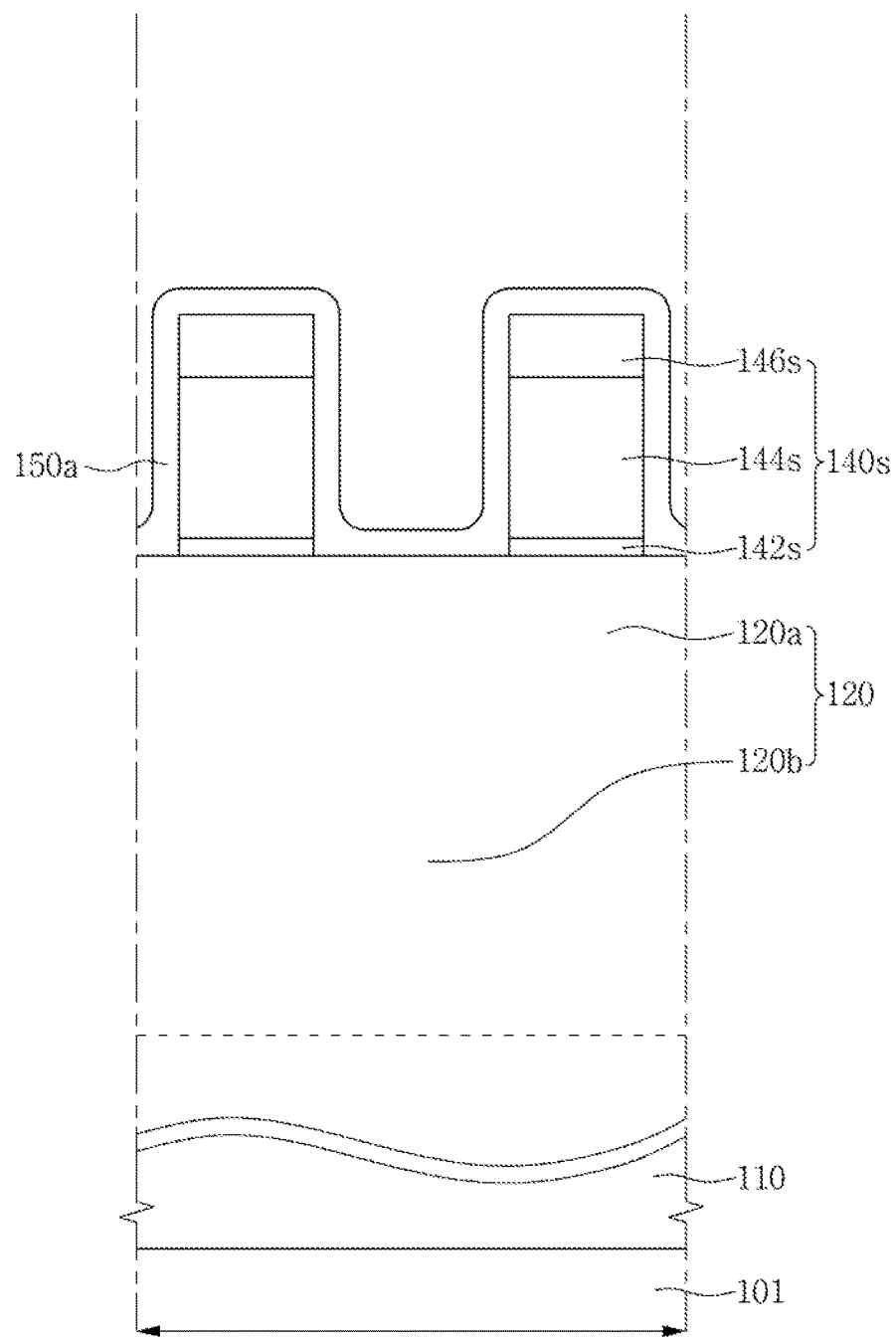
Figure 6B:
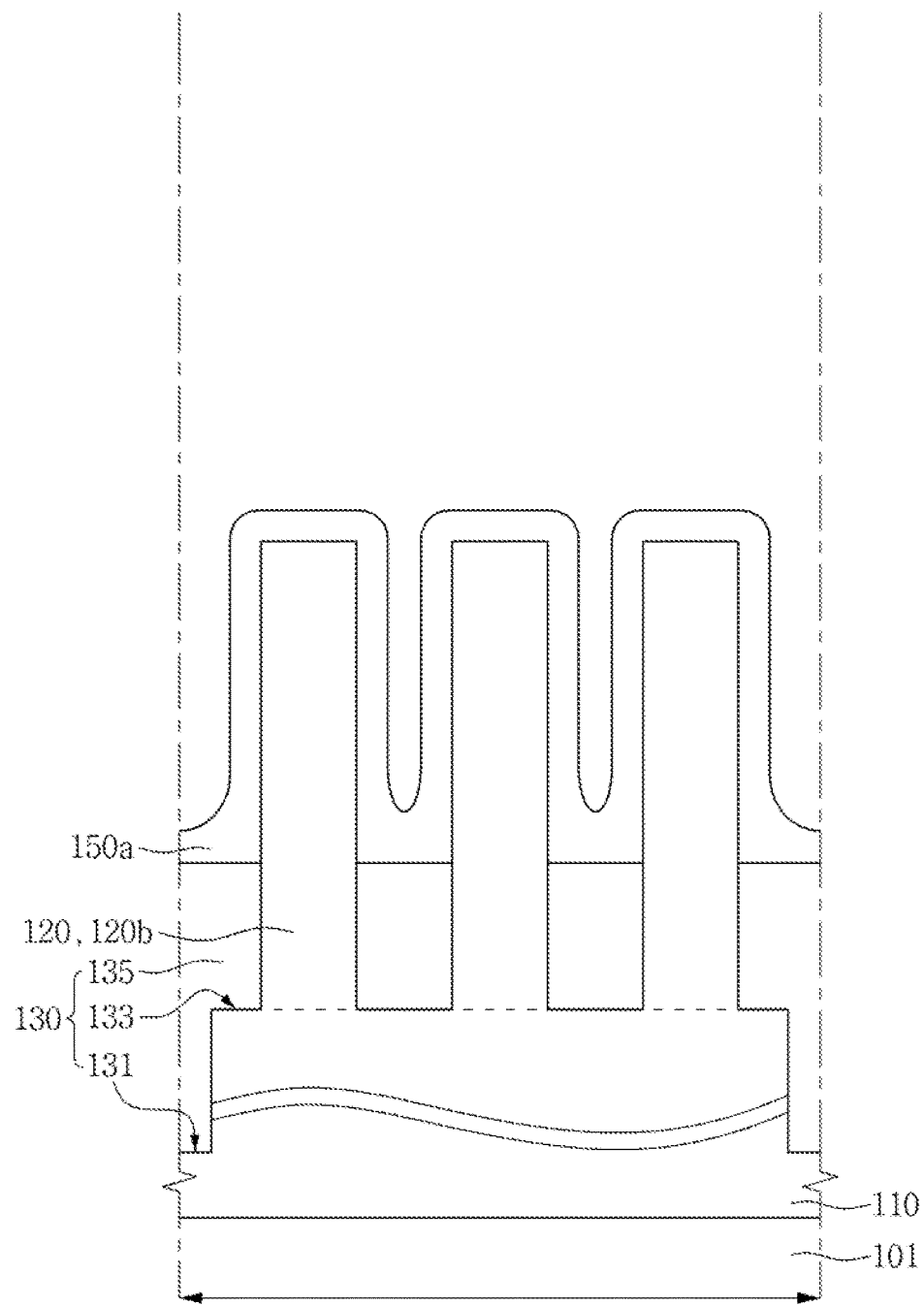

Referring to FIGS. 6A and 6B, the method may include conformally forming a spacer material layer 150a on top and side surfaces of the sacrificial gate patterns 140s, the exposed top and side surfaces of the second portions 120b of the fin active regions 120, and a surface of the isolation region 130. The spacer material layer 150a may include silicon nitride (SiN), silicon oxynitride (SiON), silicon oxycarbide (SiOC), silicon oxycarbonitride (SiOCN), or silicon borocarbonitride (SiBCN). The spacer material layer 150a may be formed by performing an ALD process.

Figure 7A:
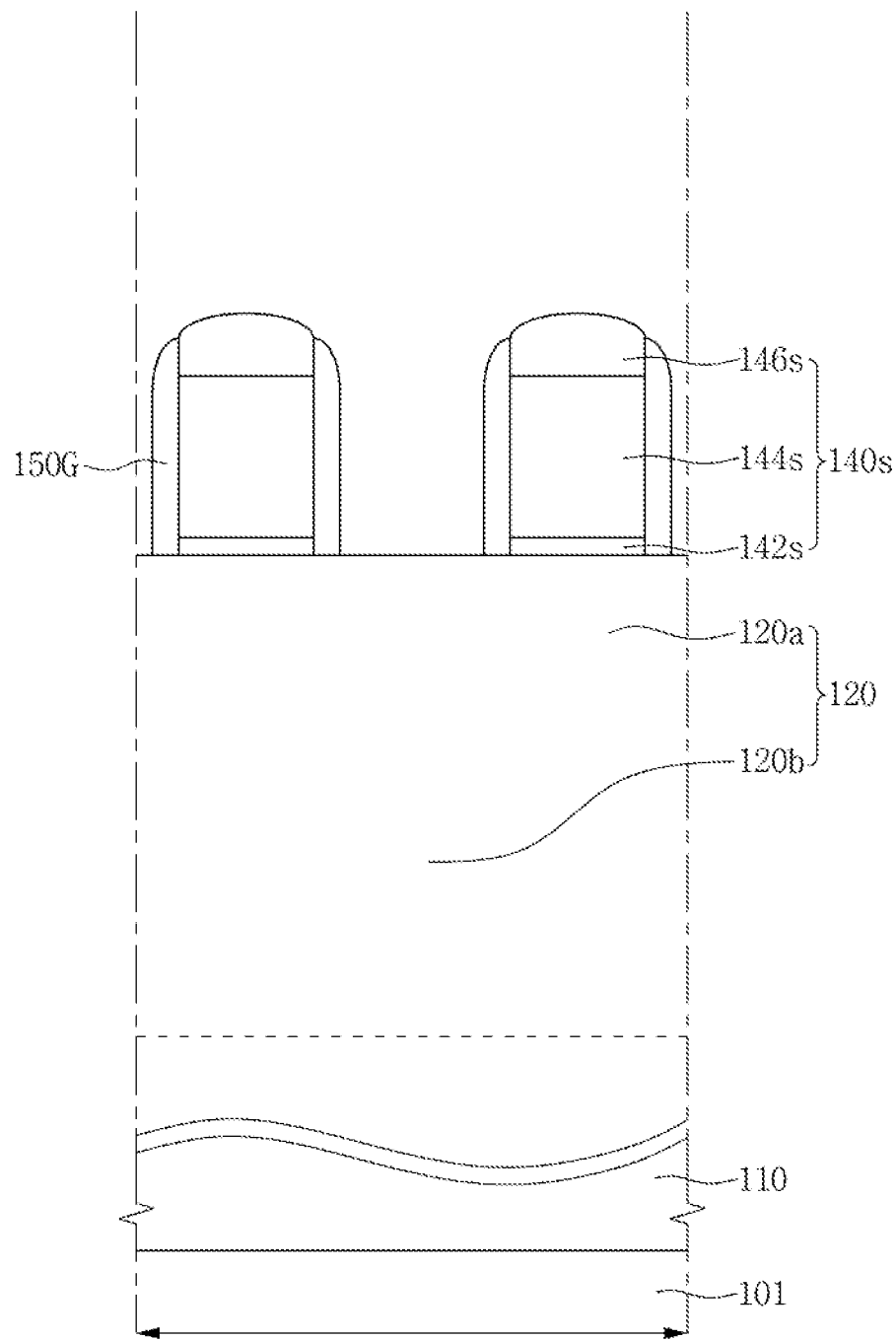
Figure 7B:
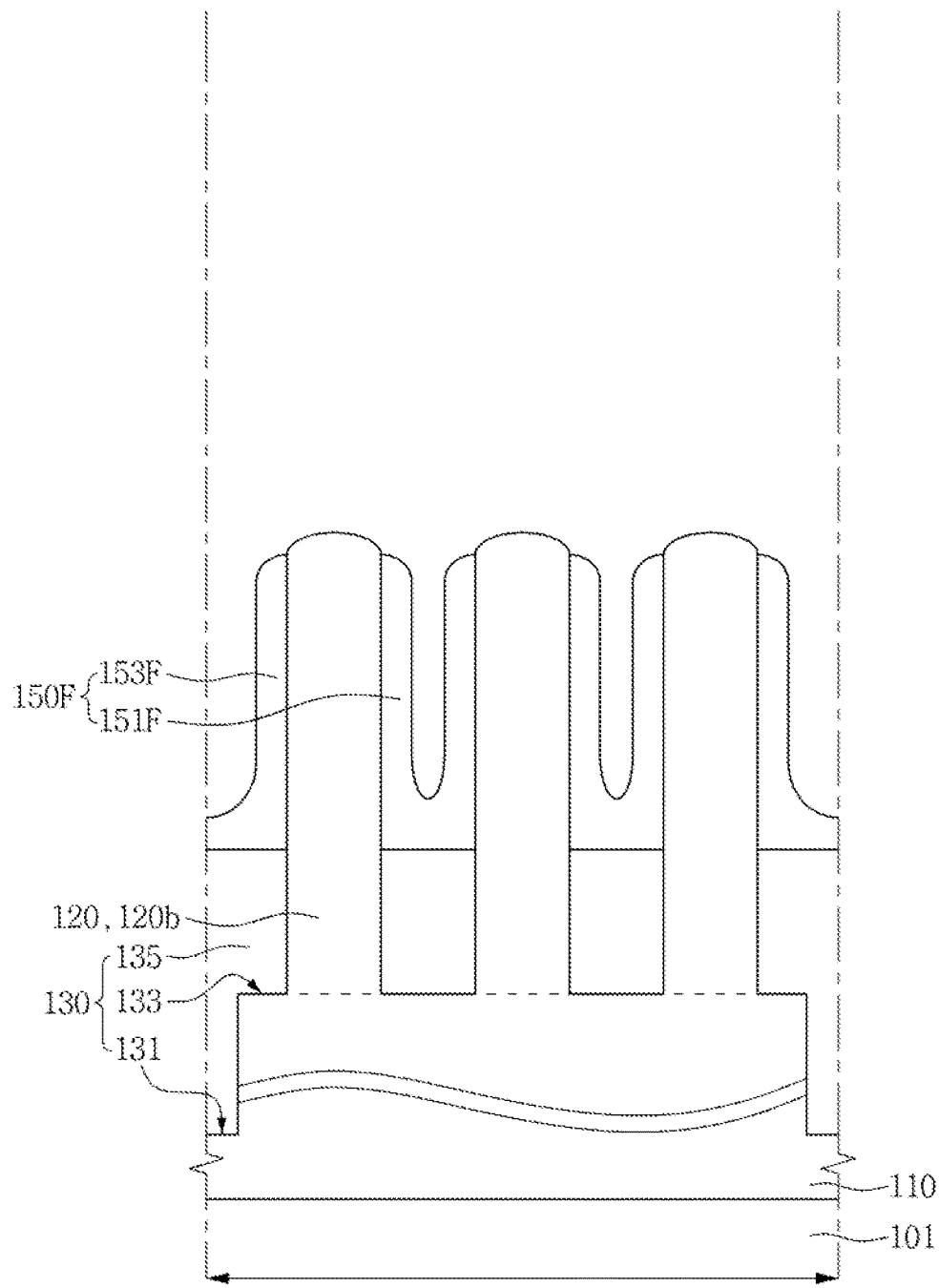

Referring to FIGS. 7A and 7B, the method may include forming gate spacers 150G on side surfaces of the sacrificial gate patterns 140s and fin active region spacers 150F on side surfaces of the fin active regions 120 by removing a part of the spacer material layer 150a by performing an etching process. The fin active region spacers 150F may include inner fin active region spacers 151F between the fin active regions 120 and outer fin active region spacers 153F on outer side surfaces of outermost fin active regions 120 of the fin active regions 120. Top surfaces of the inner fin active region spacers 151F may have a shape of a bowl elongated toward the isolation region 130. The inner fin active region spacers 151F and the outer fin active region spacers 153F may cover a surface of the isolation region 130.

Surfaces of the sacrificial gate mask patterns 146s and surfaces of the fin active regions 120 may be exposed by removing the spacer material layer 150a on top surfaces of the sacrificial gate patterns 140s and top surfaces of the fin active regions 120. The thickness of the sacrificial gate mask patterns 146s may become thinner.

Figure 8A:
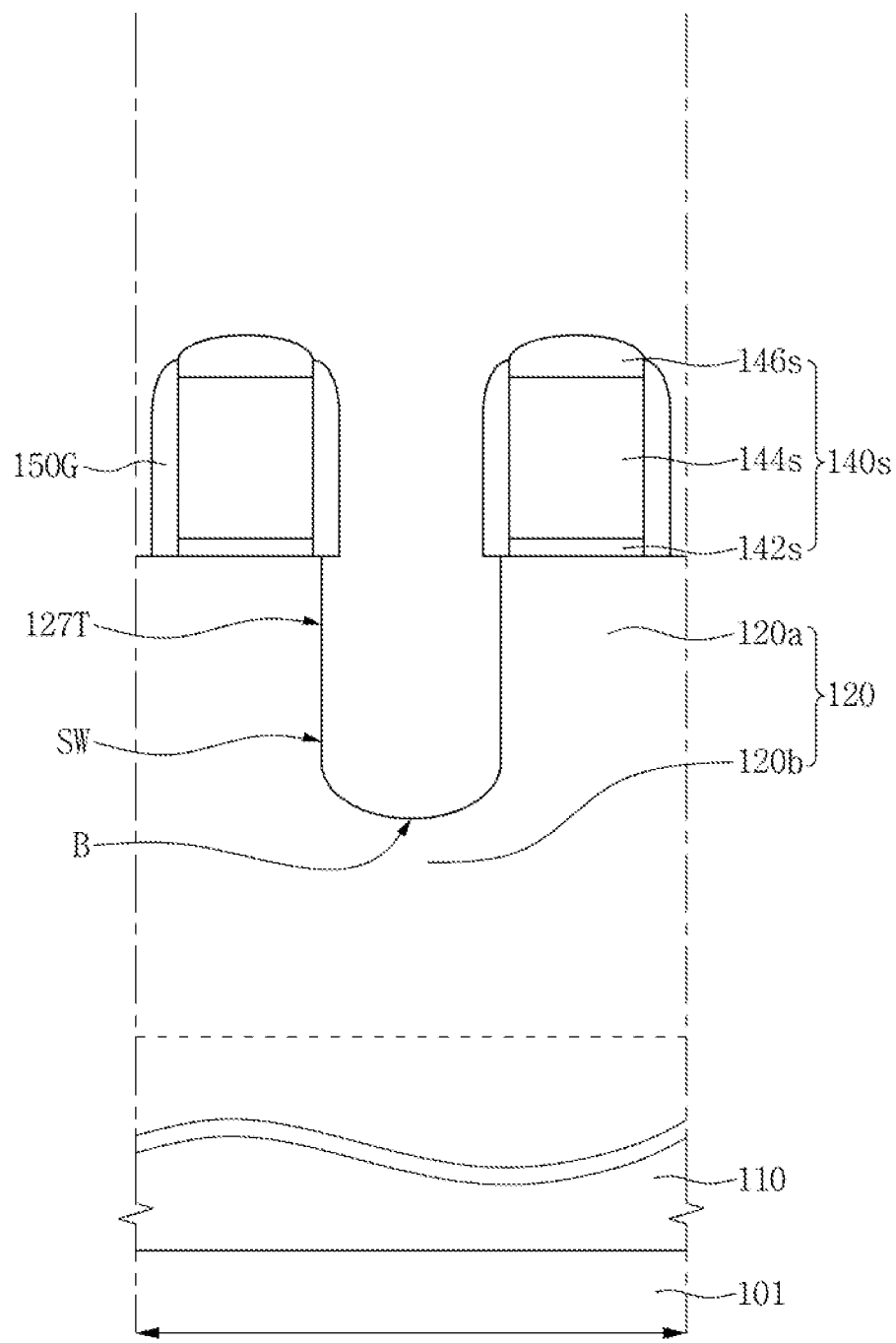
Figure 8B:
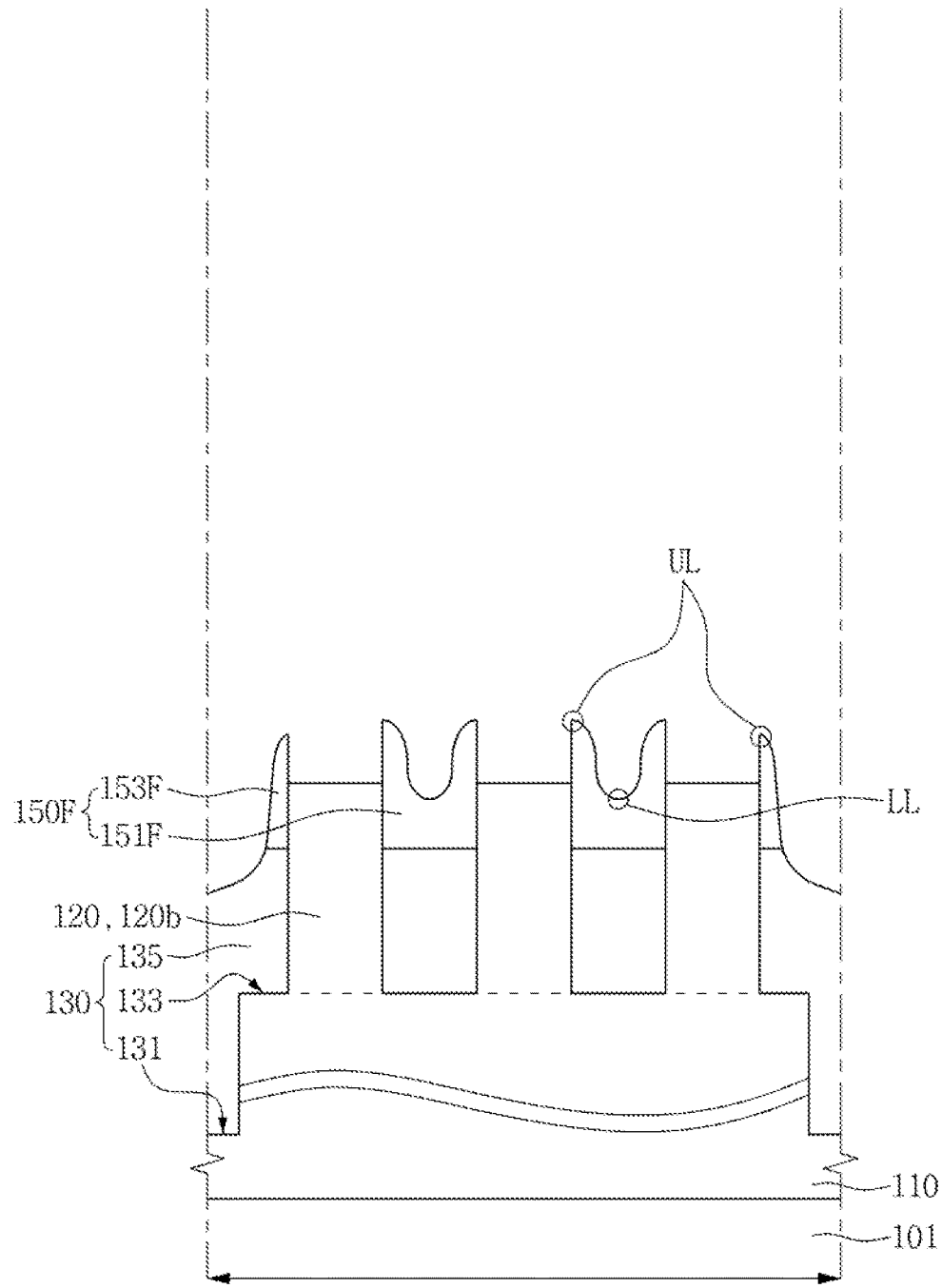

Referring to FIGS. 8A and 8B, the method may include forming source/drain trenches 127T by removing a part of the second portions 120b of the fin active regions 120 by performing an etching process. The source/drain trenches 127T may be formed between the first portions 120a of the fin active regions 120. For example, the source/drain trenches 127T may be formed in the fin active regions 120 between the sacrificial gate patterns 140s.

At this time, the thickness of the sacrificial gate mask patterns 146s may become thinner. During this process, the thickness of the gate spacers 150G may become thinner, and the height of the gate spacers 150G may become lower. In this process, top surfaces of the inner fin active region spacers 151F may have concave bowl-shapes having shallow depths and wide widths. During this process, the thicknesses of the outer fin active region spacers 153F may become thinner and the heights of the outer fin active region spacers 153F may become lower. For example, parts of the outer fin active region spacers 153F may be removed. For example, the outer fin active region spacers 153F vertically overlapping the deep trenches 131 of the isolation region 130 may be removed.

Uppermost levels UL of top surfaces of the inner fin active region spacers 151F may be different from uppermost levels UL of the outer fin active region spacers 153F. For example, the uppermost levels UL of top surfaces of the inner fin active region spacers 151F may be located at a higher level than the uppermost levels UL of the outer fin active region spacers 153F. This is because the outer fin active region spacers 153F that are located in trenches having a relatively wide width are etched relatively faster than the inner fin active region spacers 151F because the inner fin active region spacers 151F are formed in shallow trenches 133 and the outer fin active region spacers 153F are formed in shallow trenches 133 connected with the deep trenches 131. Lowermost levels LL of top surfaces of the inner fin active region spacers 151F may be located at a lower level than top surfaces of the second portions 120b of the fin active regions 120.

As described above, when the uppermost levels UL of top surfaces of the inner fin active region spacers 151F are located at a higher level than the uppermost levels UL of the outer fin active region spacers 153F, the vertical thicknesses of the inner fin active region spacers 151F may be less than or equal to 30 nm. The vertical thicknesses of the inner fin active region spacers 151F may denote distances from bottom surfaces of the inner fin active region spacers 151F in contact with the surface of the isolation region 130 to the uppermost levels UL of the top surfaces of the inner fin active region spacers 151F. Horizontal widths of lower portions of the inner fin active region spacers 151F may be substantially the same as intervals between the fin active regions 120. Accordingly, the surface of the isolation regions 130 between the fin active regions 120 may not be exposed.

Referring to FIG. 8A, bottom surfaces B of the source/drain trenches 127T may have a round shape. Sidewalls SW of the source/drain trenches 127T may vertically overlap with the gate spacers 150G. Referring to FIG. 8B, the bottom surfaces B of the source/drain trenches 127T, i.e. top surfaces of the second portions 120b of the fin active regions 120, may be located at a lower level than the uppermost levels UL of the top surfaces of the inner fin active region spacers 151F and the uppermost levels UL of the outer fin active region spacers 153F. This is because fin active regions 120 that include SiGe are etched faster than the spacer material layer 150a. The surface of the isolation region 130 may be located at a lower level than the bottom surfaces B of the source/drain trenches 127T, i.e. top surfaces of the second portions 120b of the fin active regions 120.

In this process, the etching amount of the fin active region spacers 150F may be controlled by varying etching conditions. For example, the vertical thickness of the fin active region spacers 150F may be controlled by varying etching conditions. For example, a semiconductor device 100B in FIG. 3B may be formed by increasing an etching amount of the fin active region spacers 150F in the process and then performing subsequent processes.

Figure 9A:
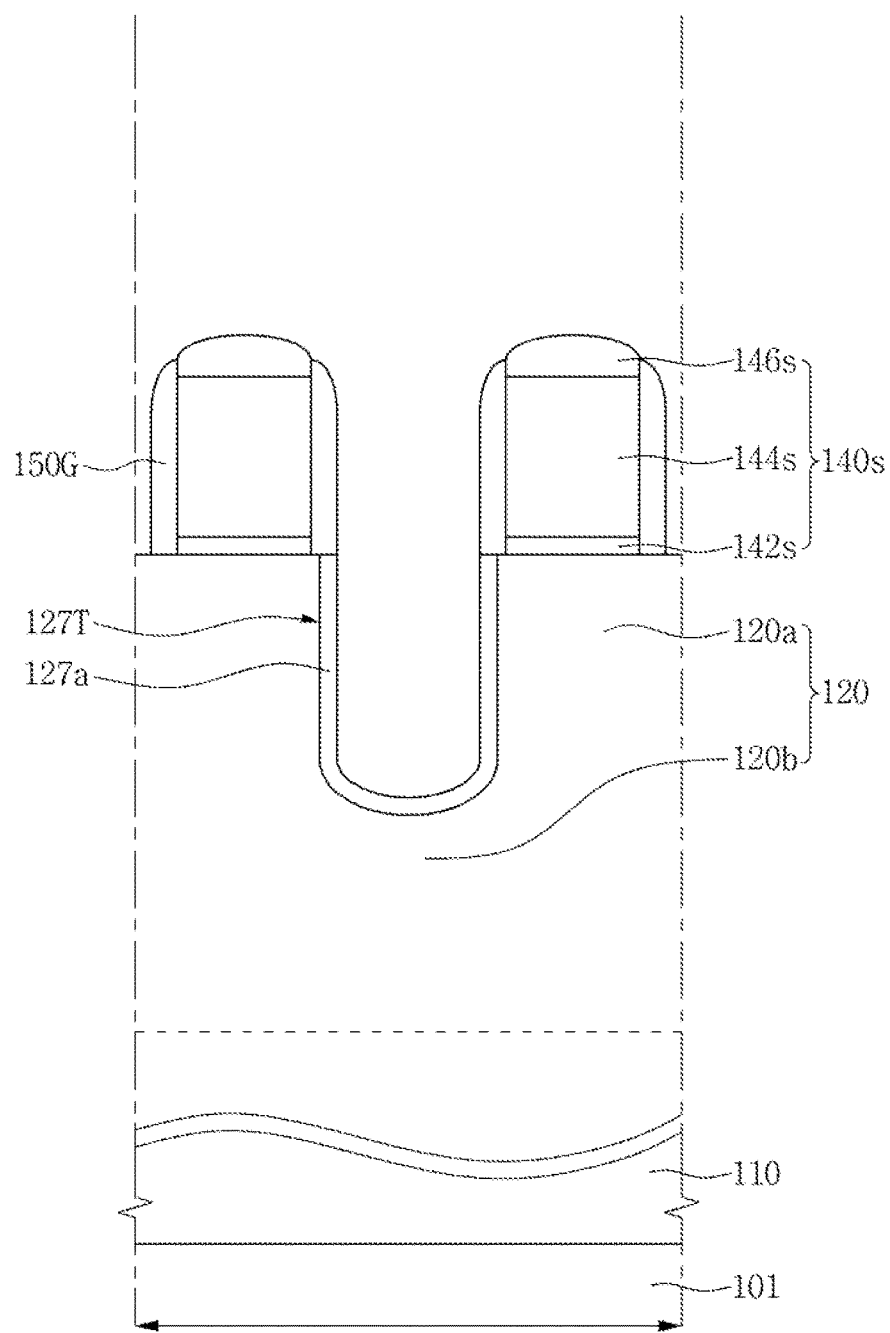
Figure 9B:
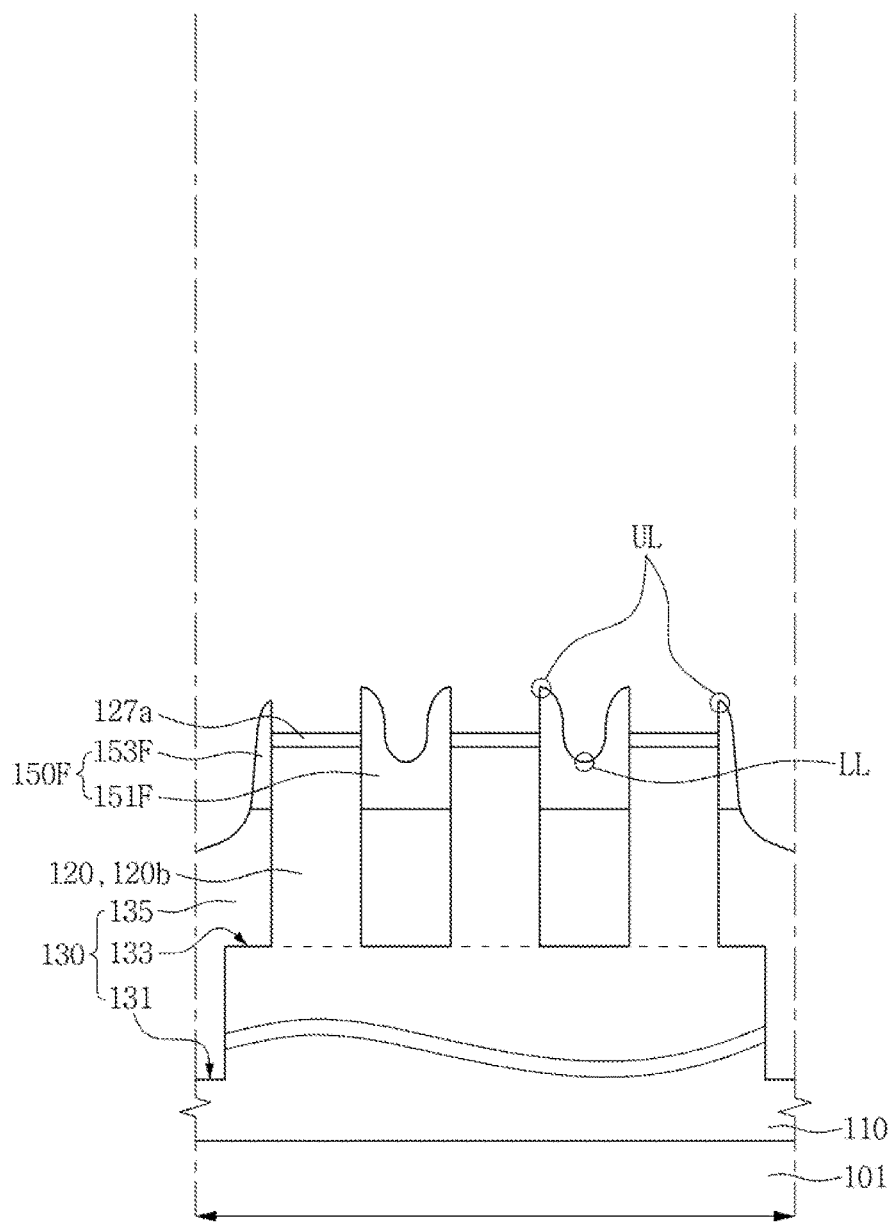

Referring to FIGS. 9A and 9B, the method may include conformally forming first epitaxial layers 127a on the inner walls of the source/drain trenches 127T by performing a first selective epitaxial growth (SEG) process. The first epitaxial layers 127a may include single crystalline silicon germanium (SiGe). The germanium content of the first epitaxial layers 127a may be higher than the germanium content of the fin active regions 120. For example, the first epitaxial layers 127a may include single crystalline silicon germanium (SiGe) having germanium in the range of 25% to 65%. Referring to FIG. 9B, surfaces of the first epitaxial layers 127a on the bottom surfaces B of the source/drain trenches 127T, i.e. top surfaces of the second portions 120b of the fin active regions 120, may be located at a lower level than the uppermost levels UL of the top surfaces of the inner fin active region spacers 151F.

Figure 10A:
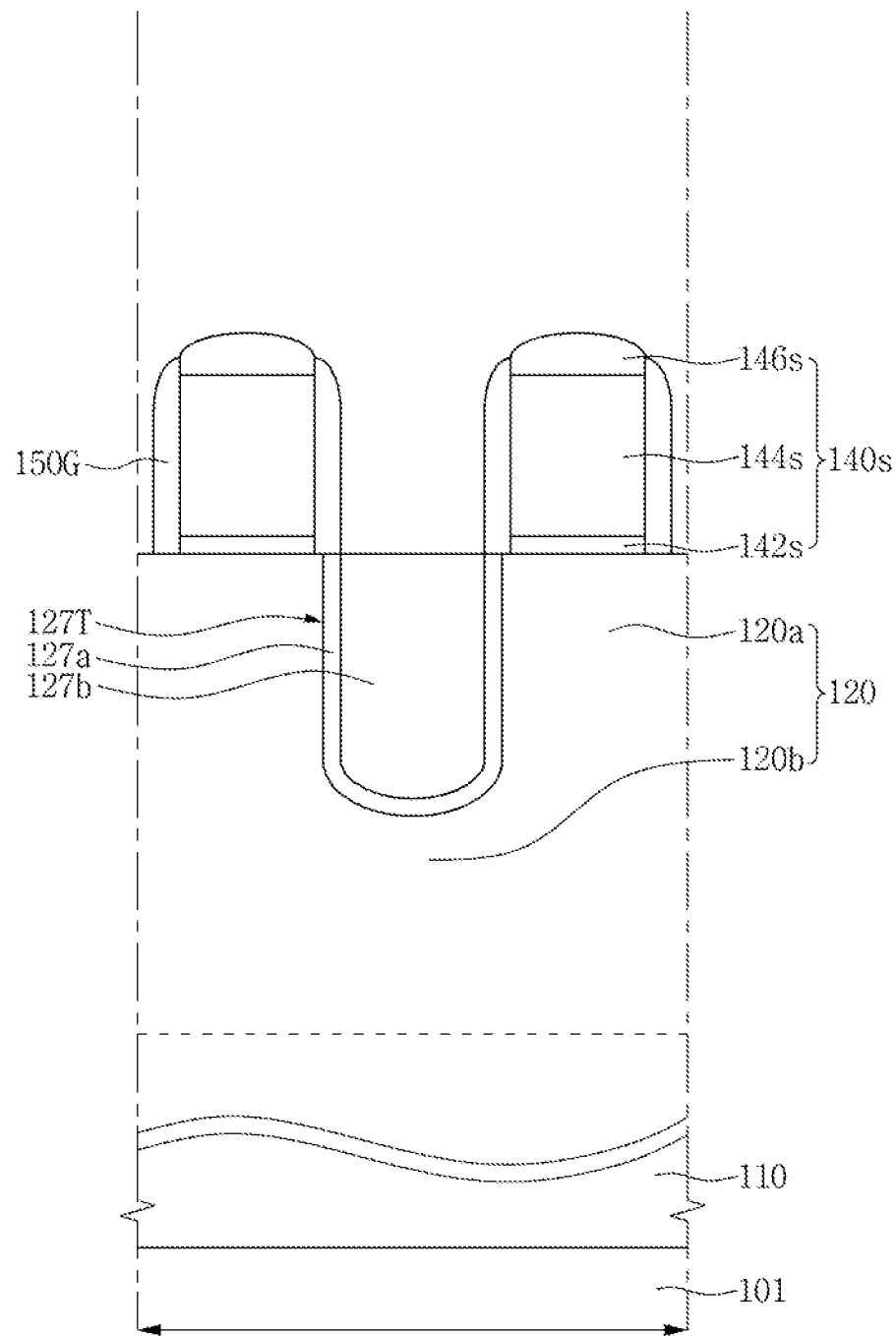
Figure 10B:
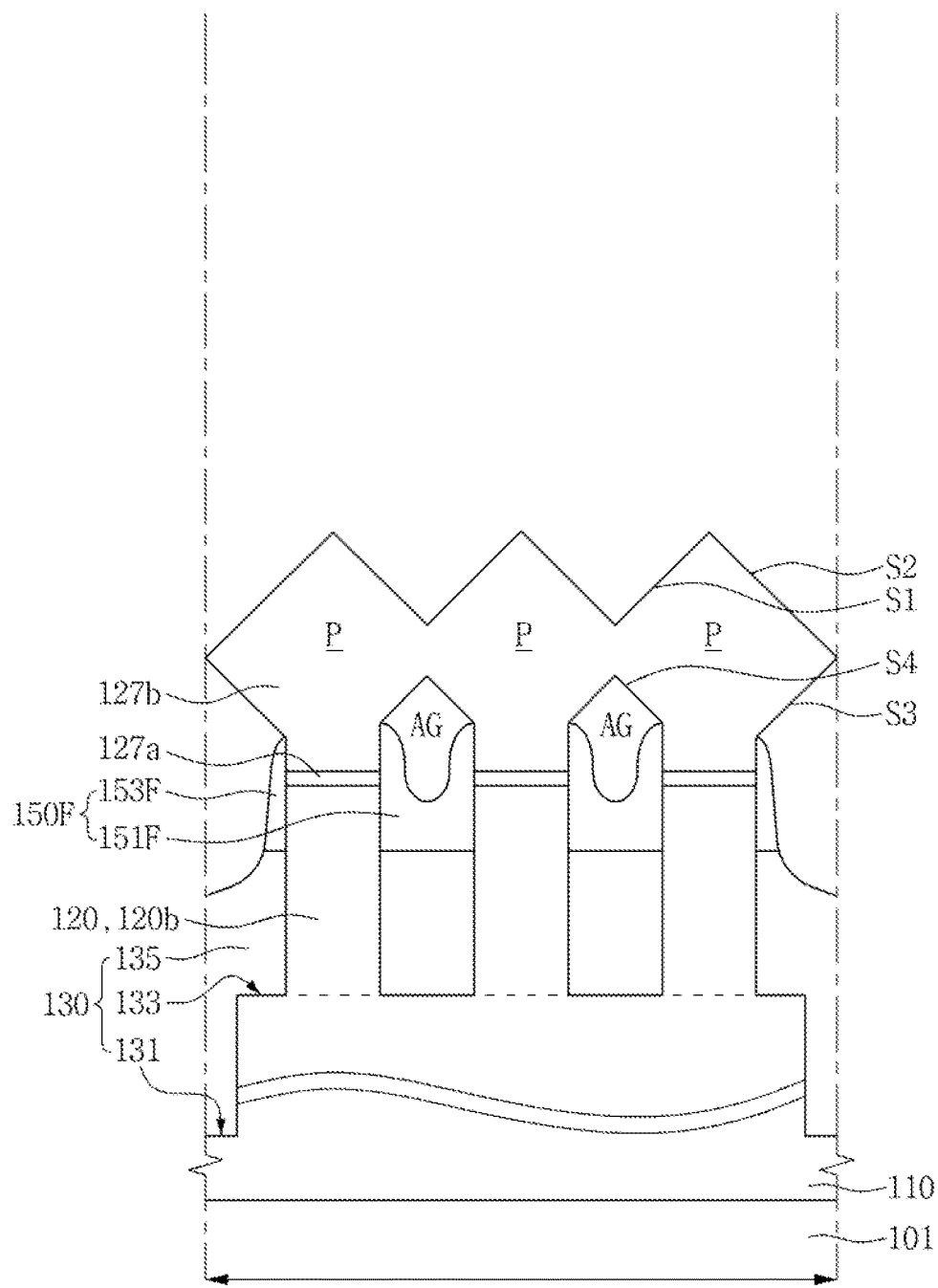

Referring to FIGS. 10A and 10B, the method may include forming second epitaxial layers 127b on the first epitaxial layers 127a by performing a second SEG process to fill the source/drain trenches 127T. The second epitaxial layers 127b may include single crystalline silicon germanium (SiGe). The germanium content of the second epitaxial layers 127b may be higher than the germanium content of the first epitaxial layers 127a. For example, the second epitaxial layers 127b may include single crystalline silicon germanium (SiGe) having germanium in the range of 30% to 100%.

Referring to FIG. 10A, top surfaces of the second epitaxial layers 127b may be substantially coplanar with the top surfaces of the first portions 120a of the fin active regions 120. Referring to FIG. 10B, the second epitaxial layers 127b may include protruding parts P having diamond-shaped longitudinal sections. The protruding parts P of the second epitaxial layers 127b may include first upper surfaces S1, second upper surfaces S2, first lower surfaces S3, and second lower surfaces S4. The first upper surfaces S1, the second upper surfaces S2, the first lower surfaces S3, and the second lower surfaces S4 may be inclined planes, for example, {111} crystallographic planes. The first upper surfaces S1 may be parallel to the first lower surfaces S3 in a first diagonal direction. The second upper surfaces S2 may be parallel to the second lower surfaces S4 in a second diagonal direction perpendicular to the first diagonal direction.

The protruding parts P of the second epitaxial layers 127b may be connected to each other in a bridge shape. For example, lower ends of the first upper surfaces S1 may be connected to lower ends of the second upper surfaces S2, and upper ends of the first lower surfaces S3 may be connected to upper ends of the second lower surfaces S4. As described above, the uppermost levels UL of the inner fin active region spacers 151F and the uppermost levels UL of the outer fin active region spacers 153F may be different from each other. Accordingly, lateral lengths of the first and second lower surfaces S3 and S4 of the protruding parts P grown on the inner fin active region spacers 151F and lateral lengths of the first and second lower surfaces S3 and S4 of the protruding parts P grown on the outer fin active region spacers 153F may be different from each other. Lateral lengths of the first and second upper surfaces S1 and S2 of the protruding parts P grown on the inner fin active region spacers 151F and lateral lengths of the first and second upper surfaces S1 and S2 of the protruding parts P grown on the outer fin active region spacers 153F may be different from each other.

For example, the lateral lengths of the first lower surfaces S3 of the protruding parts P epitaxially grown on the outer fin active region spacers 153F may be longer than the lateral lengths of the first lower surfaces S3 of the protruding parts P epitaxially grown on the inner fin active region spacers 151F. The lateral lengths of the second lower surfaces S4 of the protruding parts P epitaxially grown on the outer fin active region spacers 153F may be longer than the lateral lengths of the epitaxial growth second lower surfaces S4 of the protruding parts P epitaxially grown on the inner fin active region spacers 151F. The lateral lengths of the first upper surfaces S1 of the protruding parts P epitaxially grown on the outer fin active region spacers 153F may be longer than the lateral lengths of the first upper surfaces S1 of the protruding parts P epitaxially grown on the inner fin active region spacers 151F. The lateral lengths of the second upper surfaces S2 of the protruding parts P epitaxially grown on the outer fin active region spacers 153F may be longer than the lateral lengths of the second upper surfaces S2 of the protruding parts P epitaxially grown on the inner fin active region spacers 151F.

For example, when the vertical thickness of the fin active region spacers 150F becomes smaller, the lateral growth of the second epitaxial layers 127b is increased, and when the vertical thickness of the fin active region spacers 150F becomes greater, the lateral growth of the second epitaxial layers 127b is reduced. Referring to FIG. 3A, horizontal widths W1 of each of the second epitaxial layers 127b may be less than or equal to 60 nm. The horizontal widths W1 of the second epitaxial layers 127b may denote distances between lateral vertices of each of the second epitaxial layers 127b. Horizontal widths W2 of merged portions of each of the second epitaxial layers 127b may be less than or equal to 30 nm.

Figure 11A:
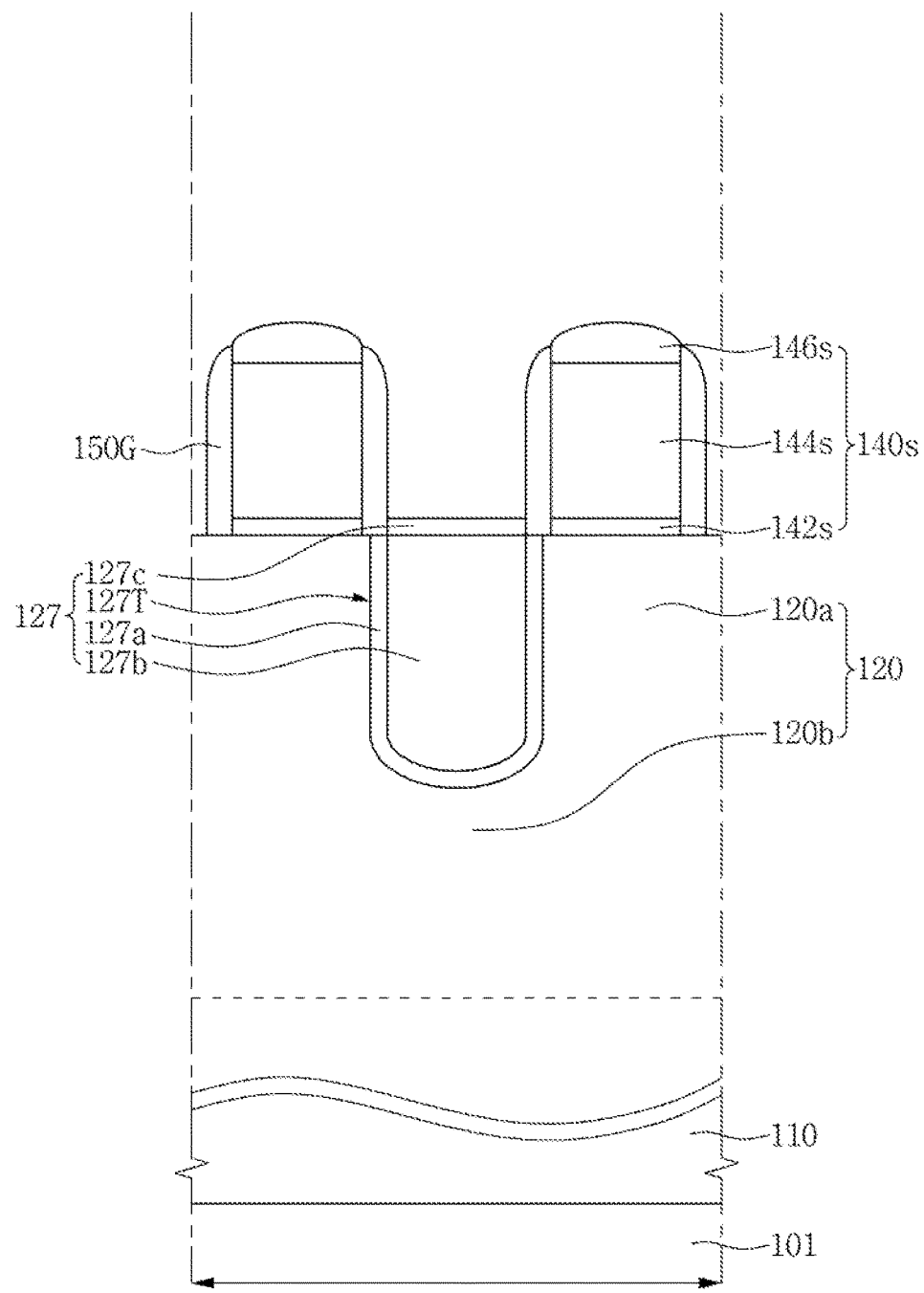
Figure 11B:
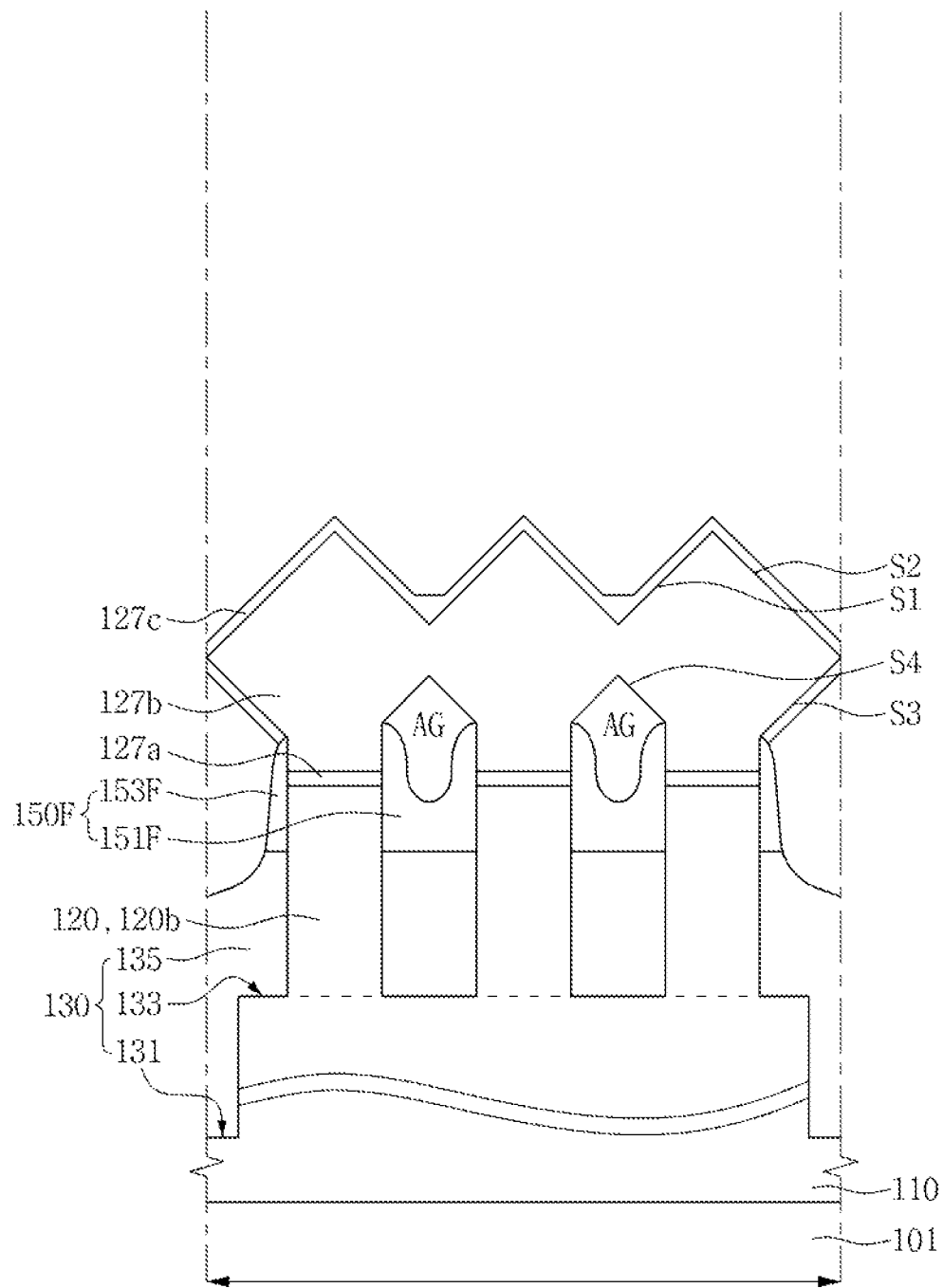

Referring to FIGS. 11A and 11B, the method may include forming third epitaxial layers 127c on the second epitaxial layers 127b by performing a third SEG process. The third epitaxial layers 127c may not be formed on the first and second lower surfaces S3 and S4 of the second epitaxial layers 127b between the fin active regions 120. The germanium content of the third epitaxial layers 127c may be lower than the germanium content of the second epitaxial layers 127b. The third epitaxial layers 127c may be used as stopper to form contact holes in a subsequent process. In this process, source/drain areas 127 including the first epitaxial layers 127a, the second epitaxial layers 127b, and the third epitaxial layers 127c may be formed in the source/drain trenches 127T.

Meanwhile, a semiconductor device 100D in FIGS. 4A and 4B may be formed by performing the subsequent processes without performing the above third SEG process.

Figure 12A:
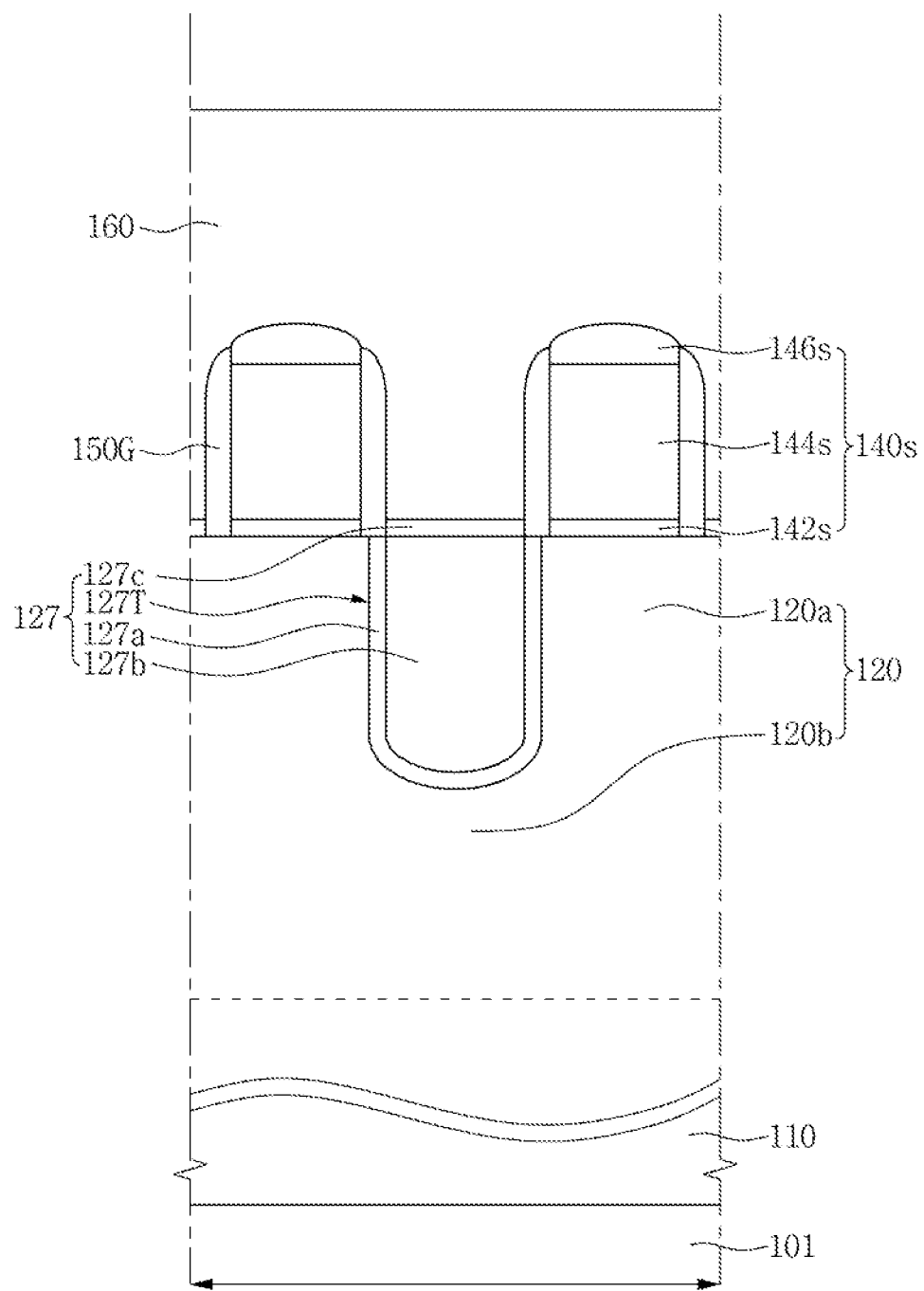
Figure 12B:
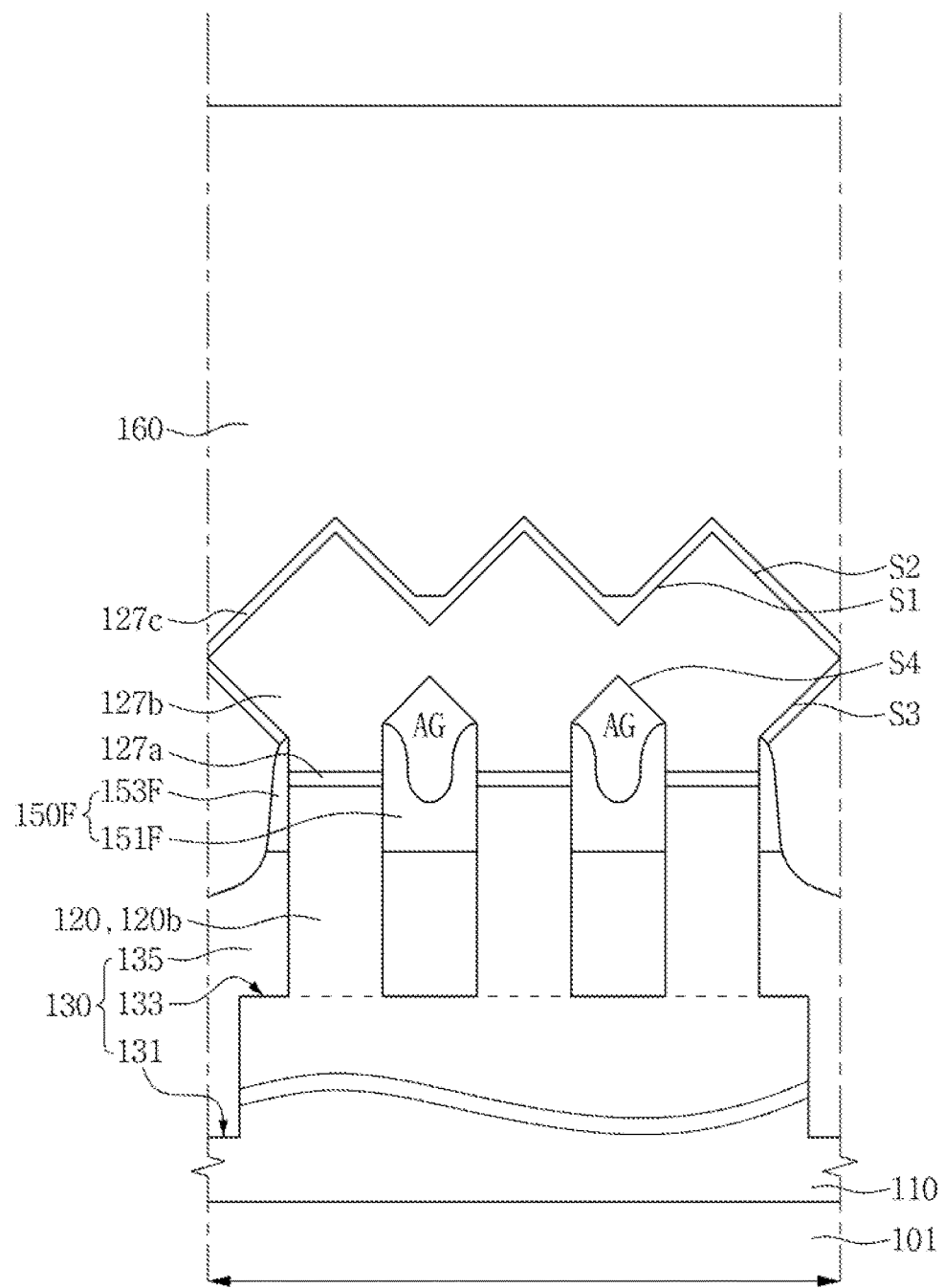

Referring to FIGS. 12A and 12B, the method may include forming a lower interlayer insulating layer 160 by performing a deposition process to cover the sacrificial gate patterns 140s and the source/drain areas 127. The lower interlayer insulating layer 160 may include silicon oxide. At this time, air gaps AG may be formed between the first and second lower surfaces S3 and S4 of the second epitaxial layers 127b and top surfaces of the inner fin active region spacers 151F having concave shapes. The air gaps AG may be vacuum or filled with air or a gas such as nitrogen gas, argon gas, etc.

Figure 13A:
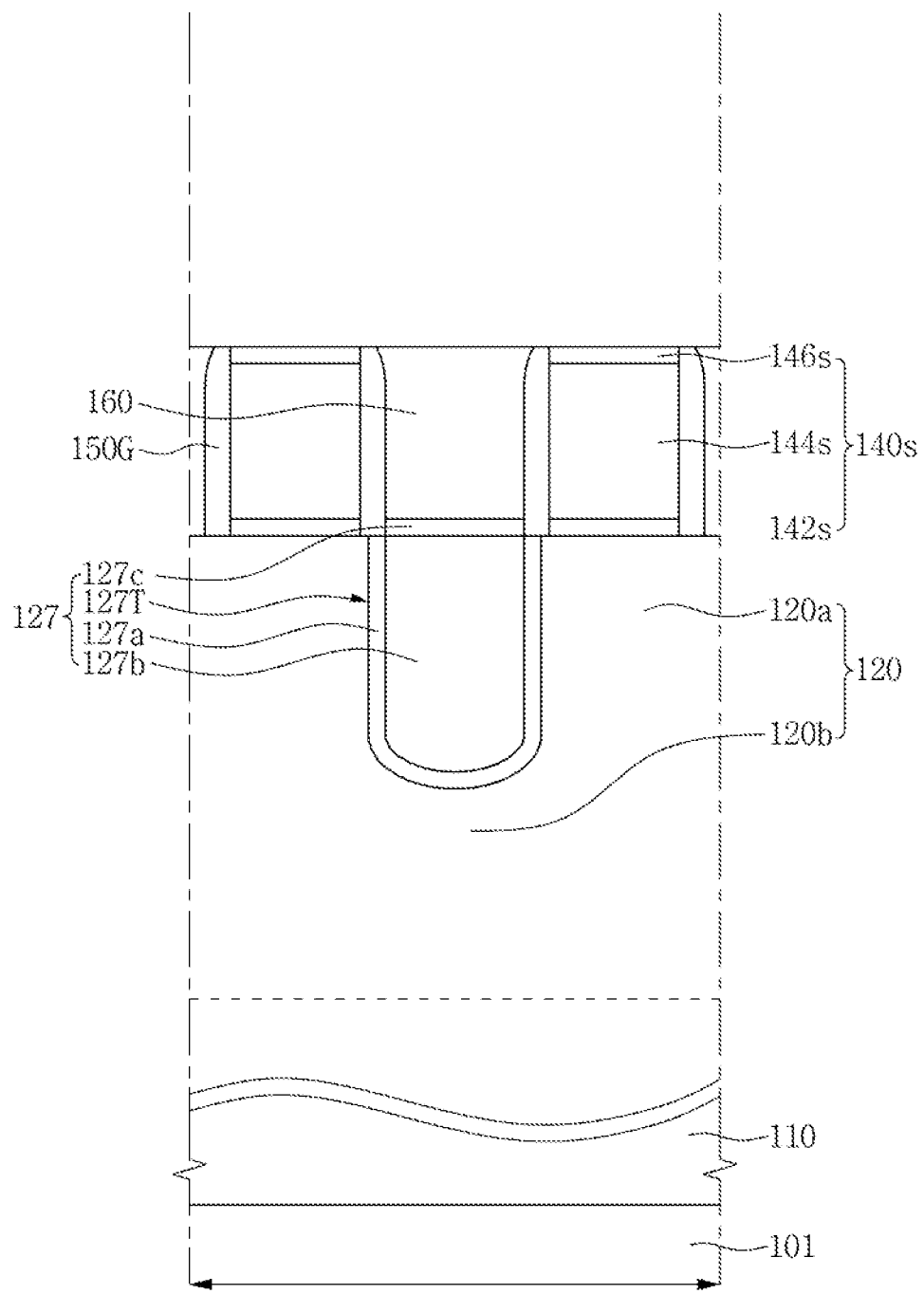
Figure 13B:
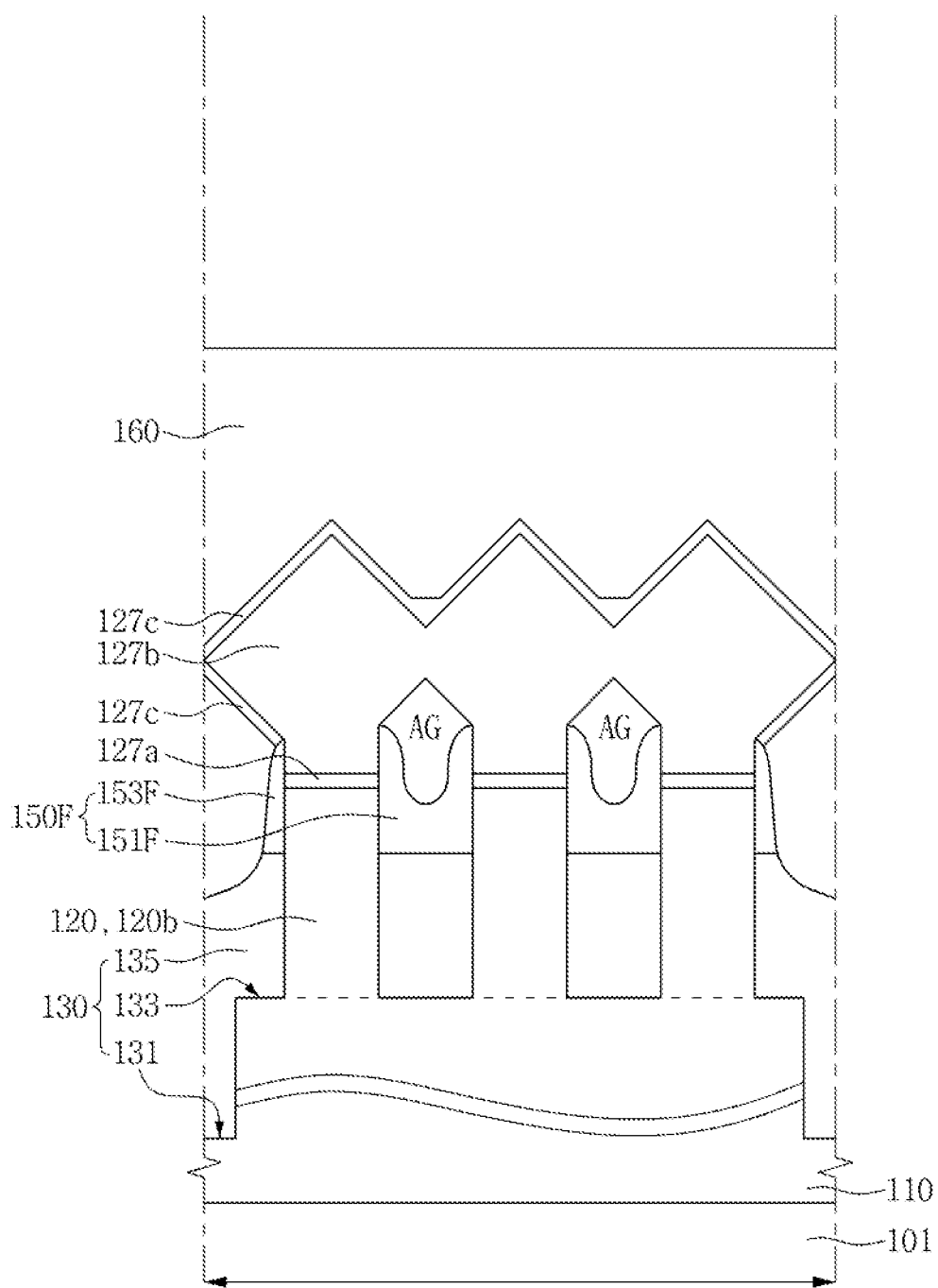

Referring to FIGS. 13A and 13B, the method may include planarizing the lower interlayer insulating layer 160 by performing a planarization process such as CMP to expose the sacrificial gate mask patterns 146s.

Figure 14A:
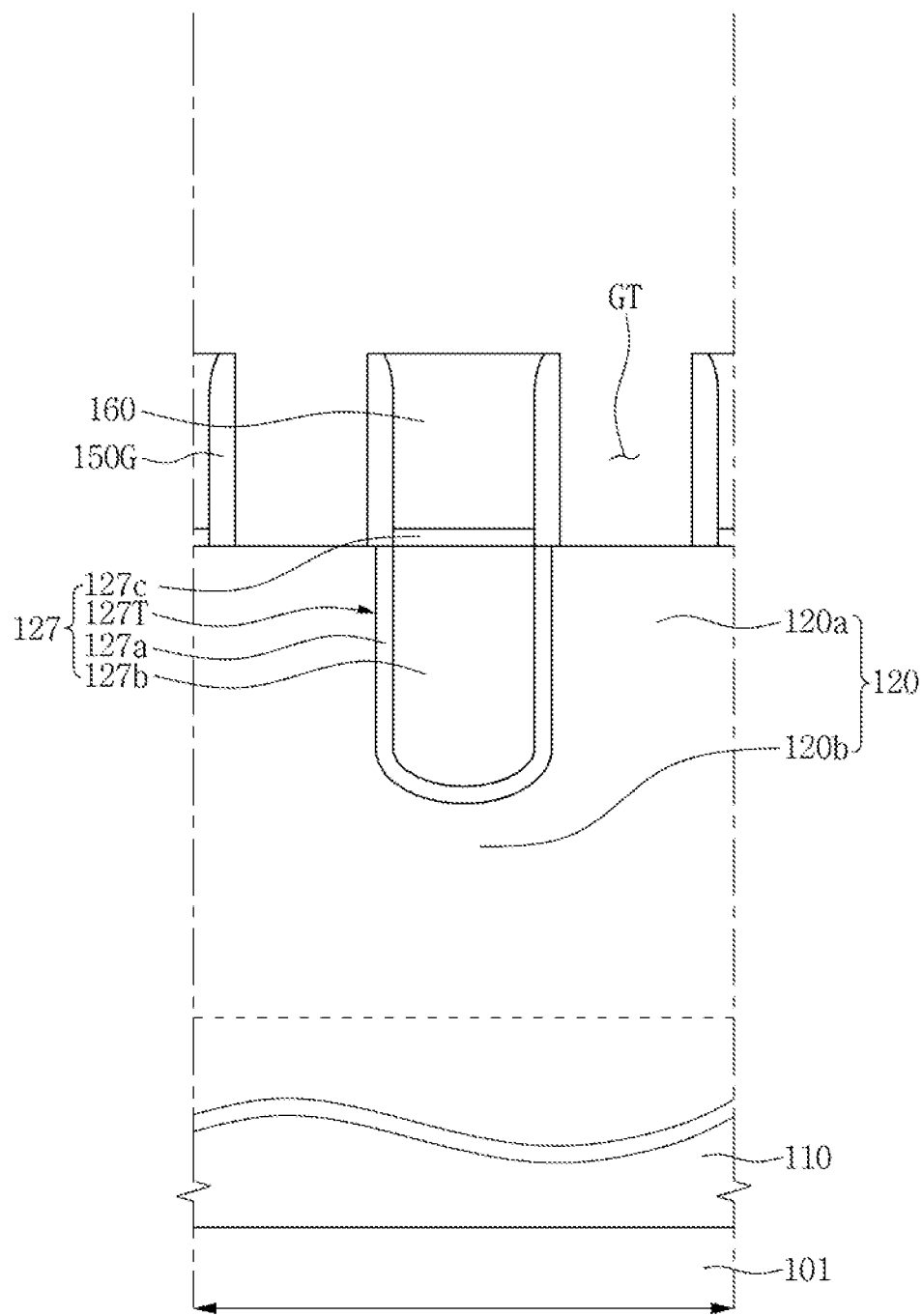
Figure 14B:
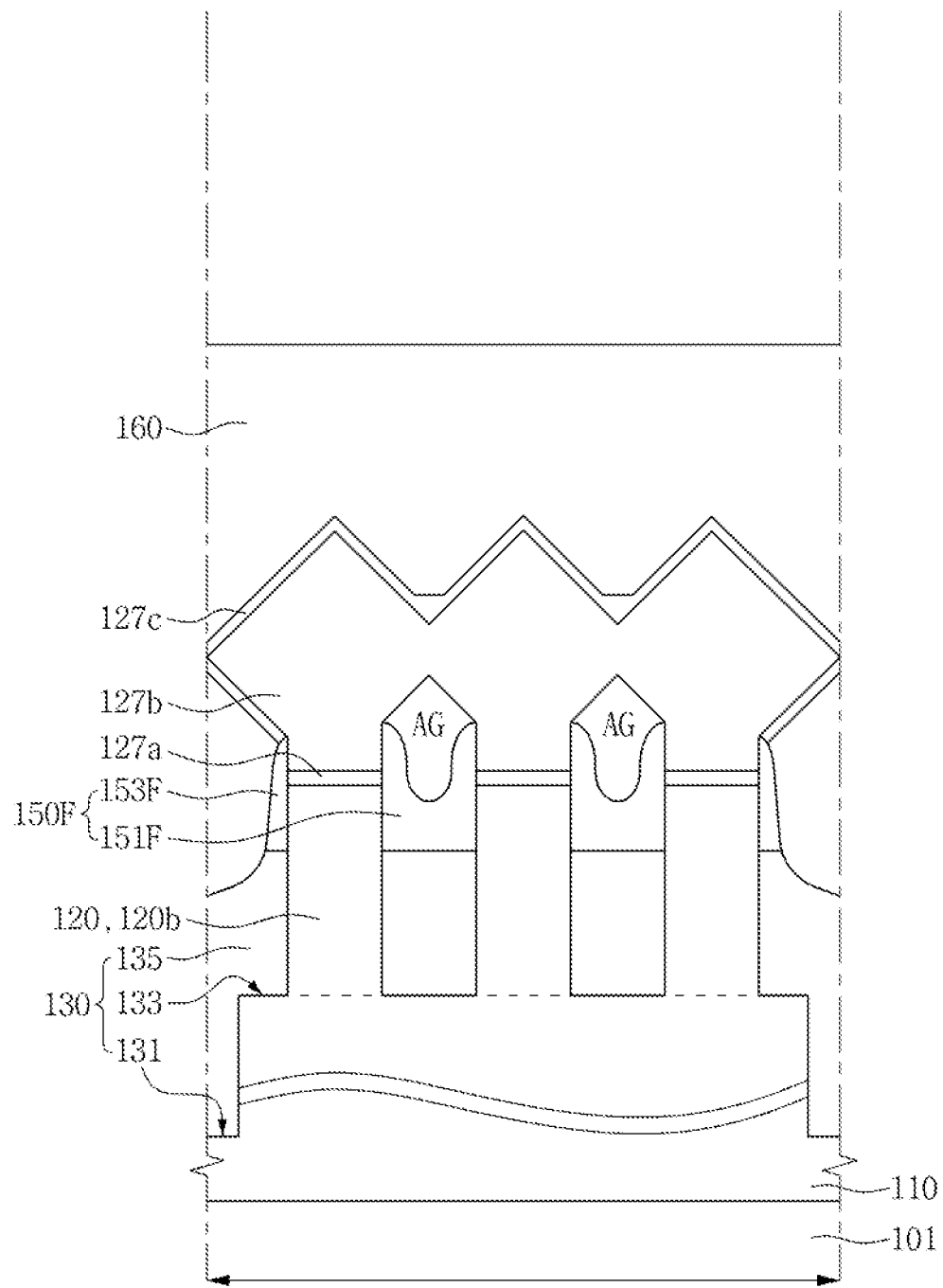

Referring to FIGS. 14A and 14B, the method may include forming gate trenches GT by removing the sacrificial gate mask patterns 146s, the sacrificial gate electrode patterns 144s, and the sacrificial gate insulating patterns 142s.

Figure 15A:
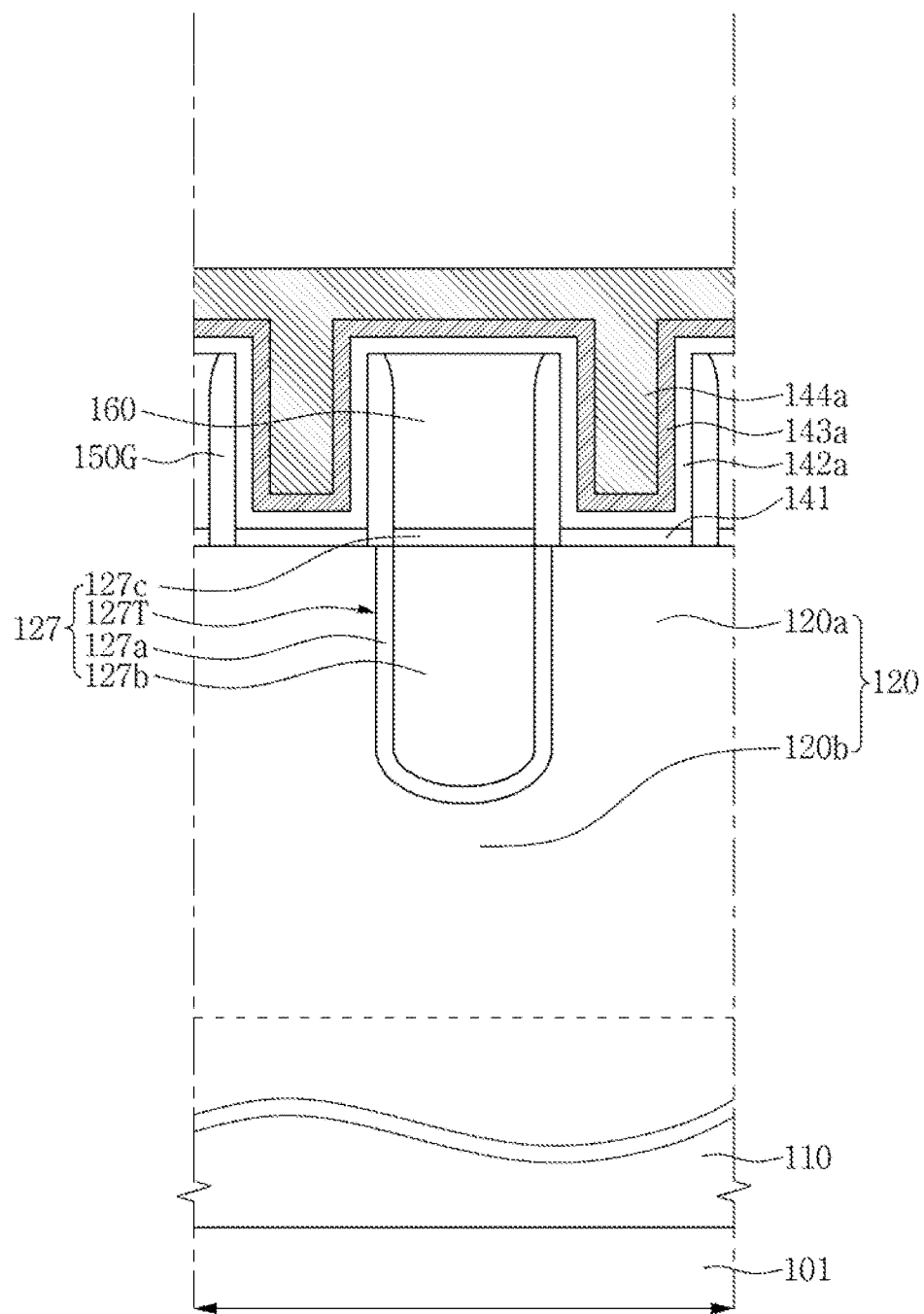
Figure 15B:
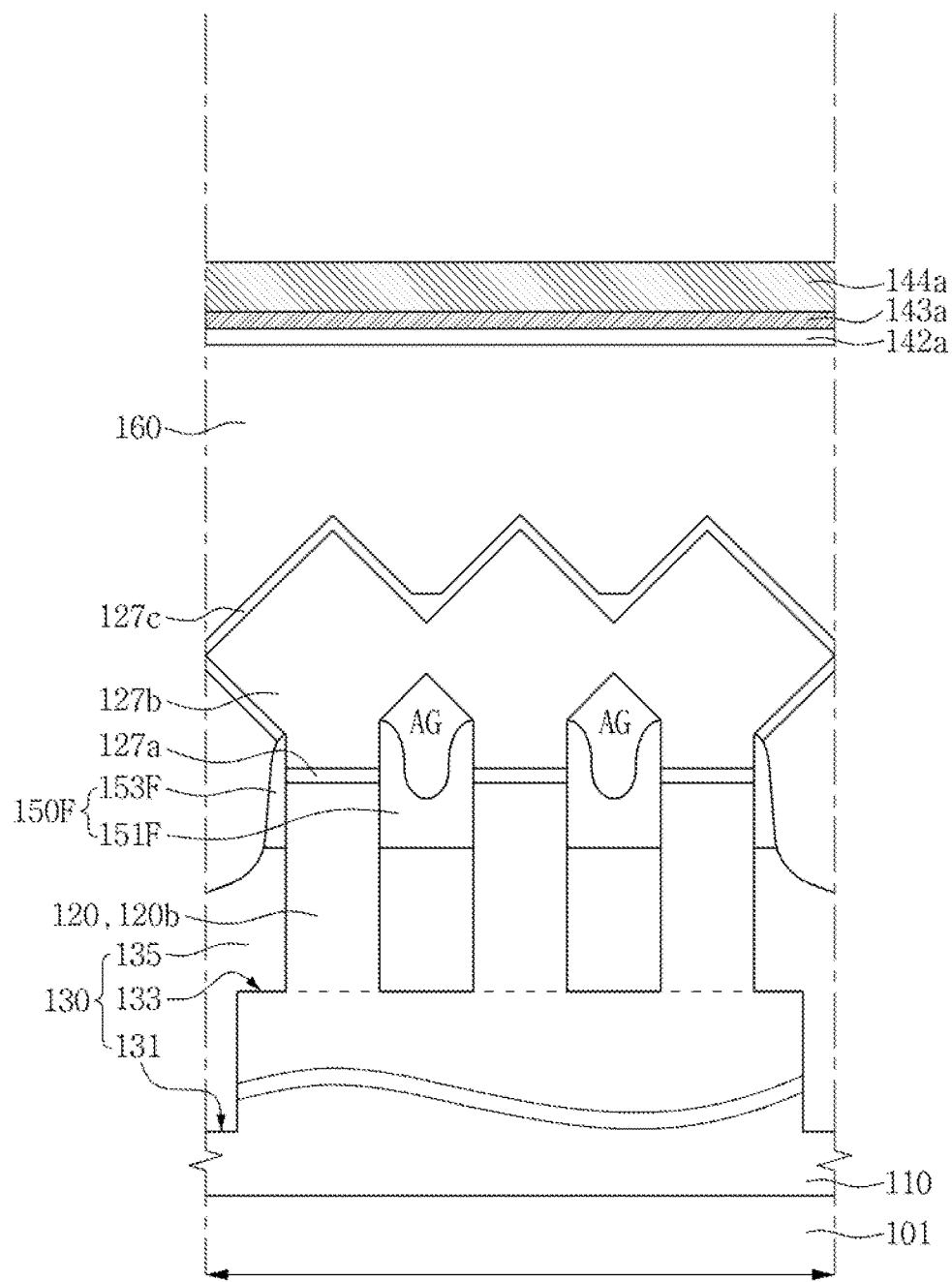

Referring to FIGS. 15A and 15B, the method may include forming surface insulating patterns 141, a gate insulating layer 142a, a gate barrier layer 143a, and a gate electrode layer 144a.

The surface insulating patterns 141 may include a natural oxide layer that is formed by oxidizing the surfaces of the fin active regions 120, thermally oxidized silicon, or silicon oxide that is deposited by performing an ALD process.

The gate insulating layer 142a may be conformally formed on inner side surfaces of the gate spacers 150G, surfaces of the surface insulating patterns 141, the top surfaces of the gate spacers 150G, and the top surface of the lower interlayer insulating layer 160 by performing a deposition process. The gate insulating layer 142a may include a high-k dielectric insulator, such as hafnium oxide (HfO), taluminum oxide (AlO), zirconium oxide (ZrO), lanthanum oxide (LaO), or another metal oxide.

The gate barrier layer 143a may be conformally formed on the gate insulating layer 142a by performing a deposition process. The gate barrier layer 143a may include a barrier metal, such as titanium (Ti), titanium nitride (TiN), tanttalum (Ta), tanttalum nitride (TaN), or titanium tungsten (TiW).

The gate electrode layer 144a may be formed on the gate barrier layer 143a by performing a deposition process to fill the gate trenches GT. The gate electrode layer 144a may include a metal, such as tungsten (W).

Figure 16A:
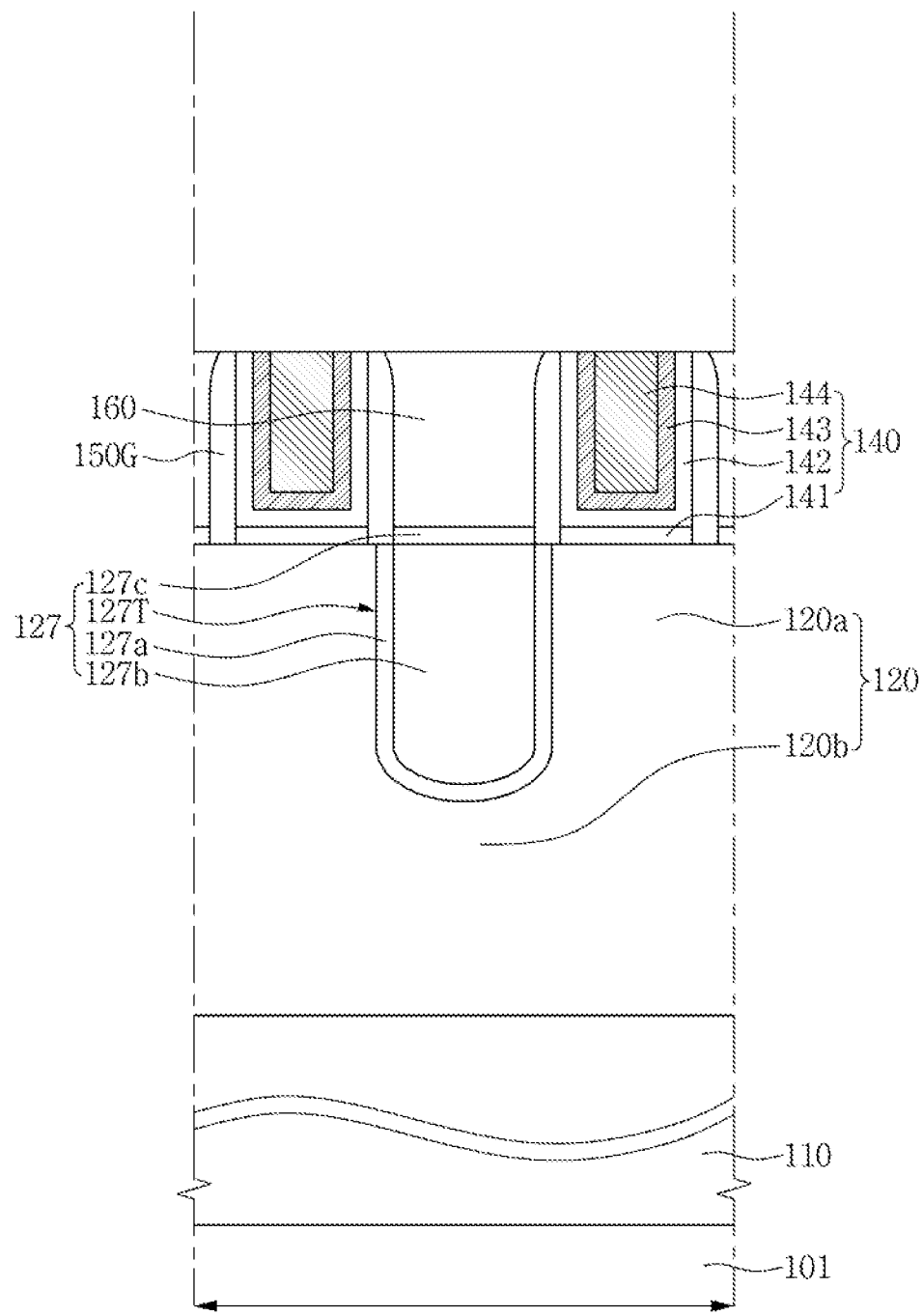
Figure 16B:
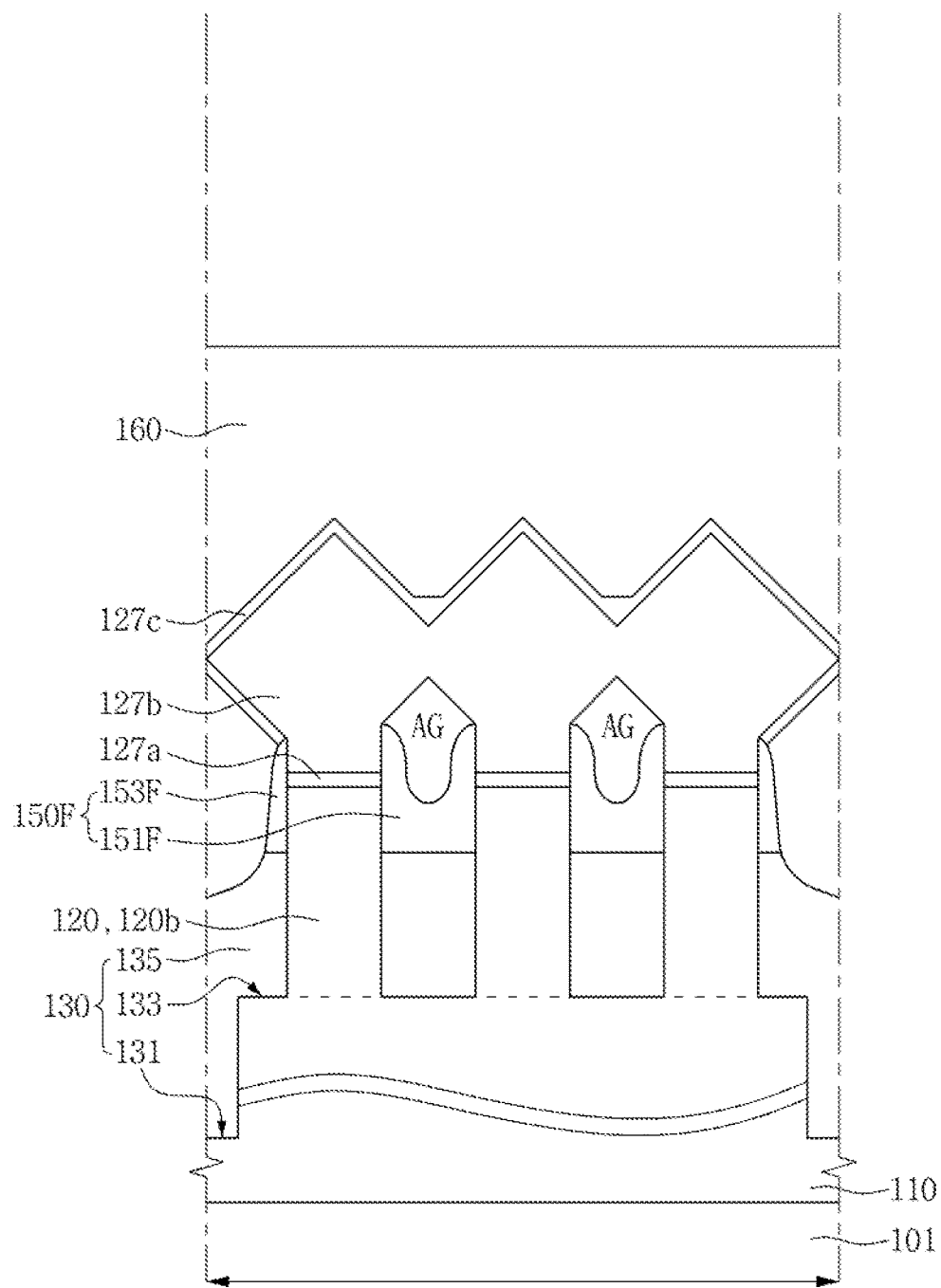

Referring to FIGS. 16A and 16B, the method may include forming gate patterns 140 that include the surface insulating patterns 141, gate insulating patterns 142, gate barrier patterns 143, and gate electrode patterns 144 by removing the gate electrode layer 144a, the gate barrier layer 143a, and gate insulating layer 142a on the lower interlayer insulating layer 160 by performing a planarization process, such as a CMP process.

Figure 17A:
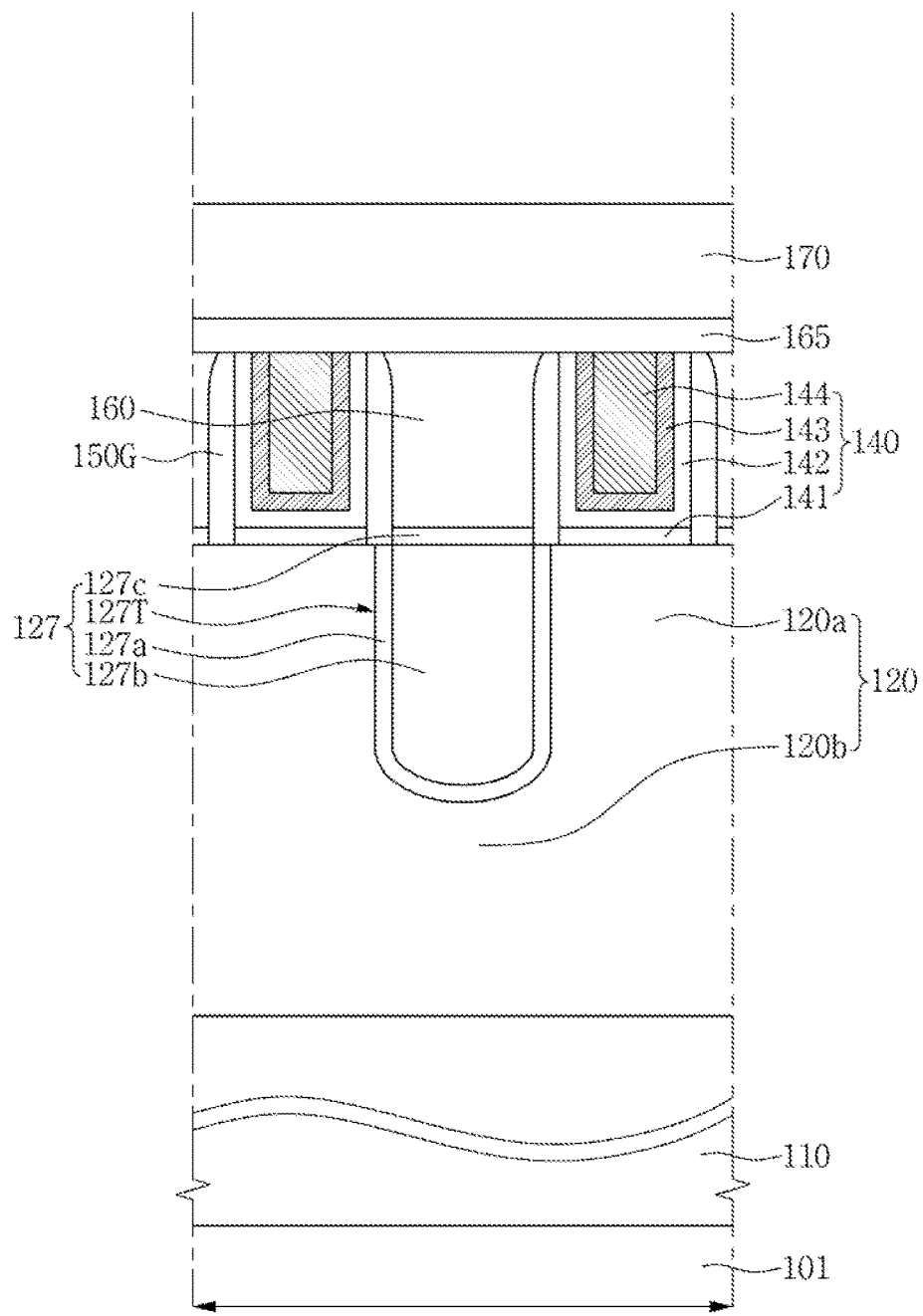
Figure 17B:
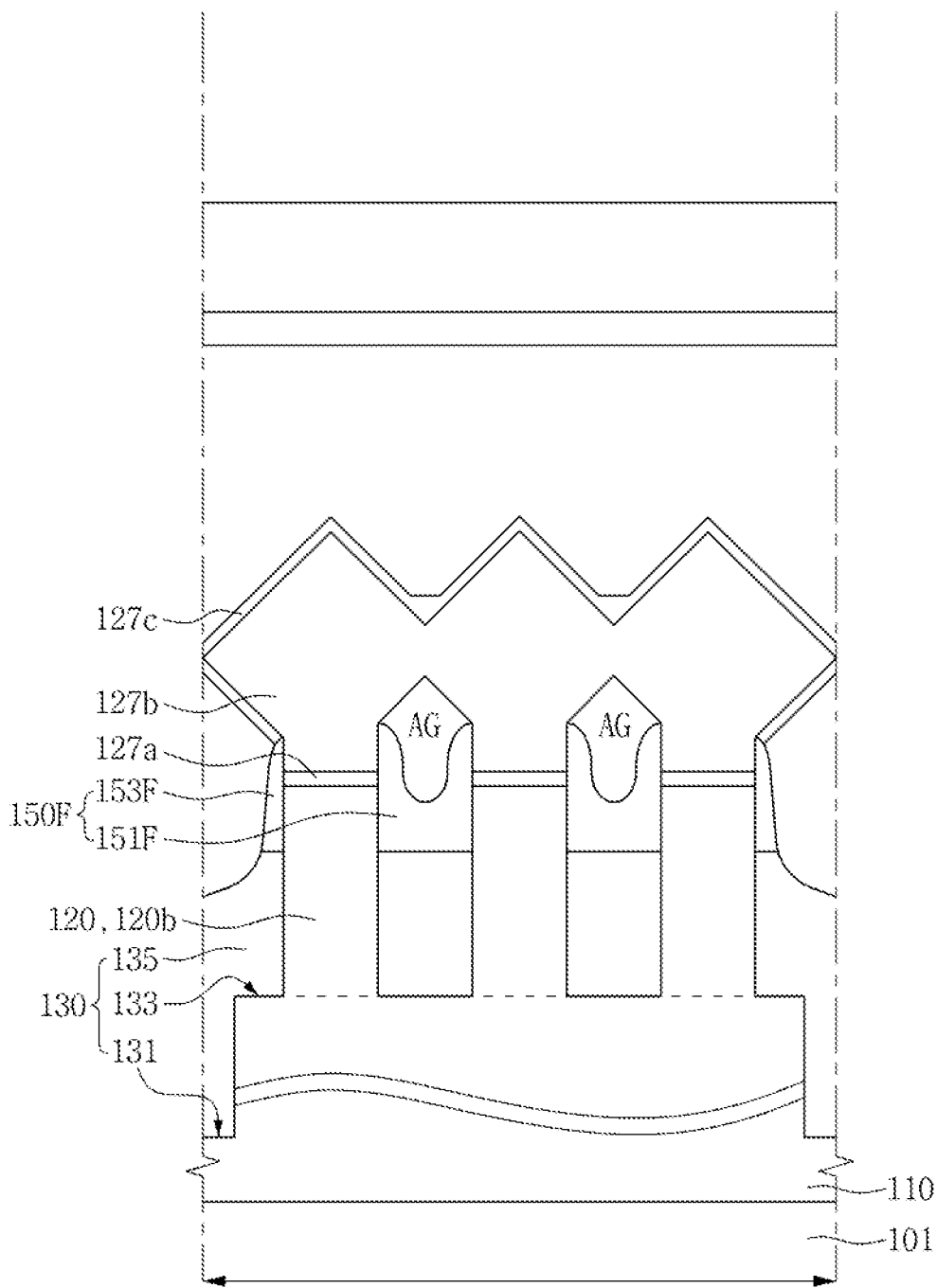

Referring to FIGS. 17A and 17B, the method may include forming a lower stopper layer 165 on the lower interlayer insulating layer 160 and the gate patterns 140 by performing a deposition process, and forming an intermediate interlayer insulating layer 170 on the lower stopper layer 165 by performing a deposition process. The lower stopper layer 165 may include silicon nitride. The intermediate interlayer insulating layer 170 may include silicon oxide.

Figure 18A:
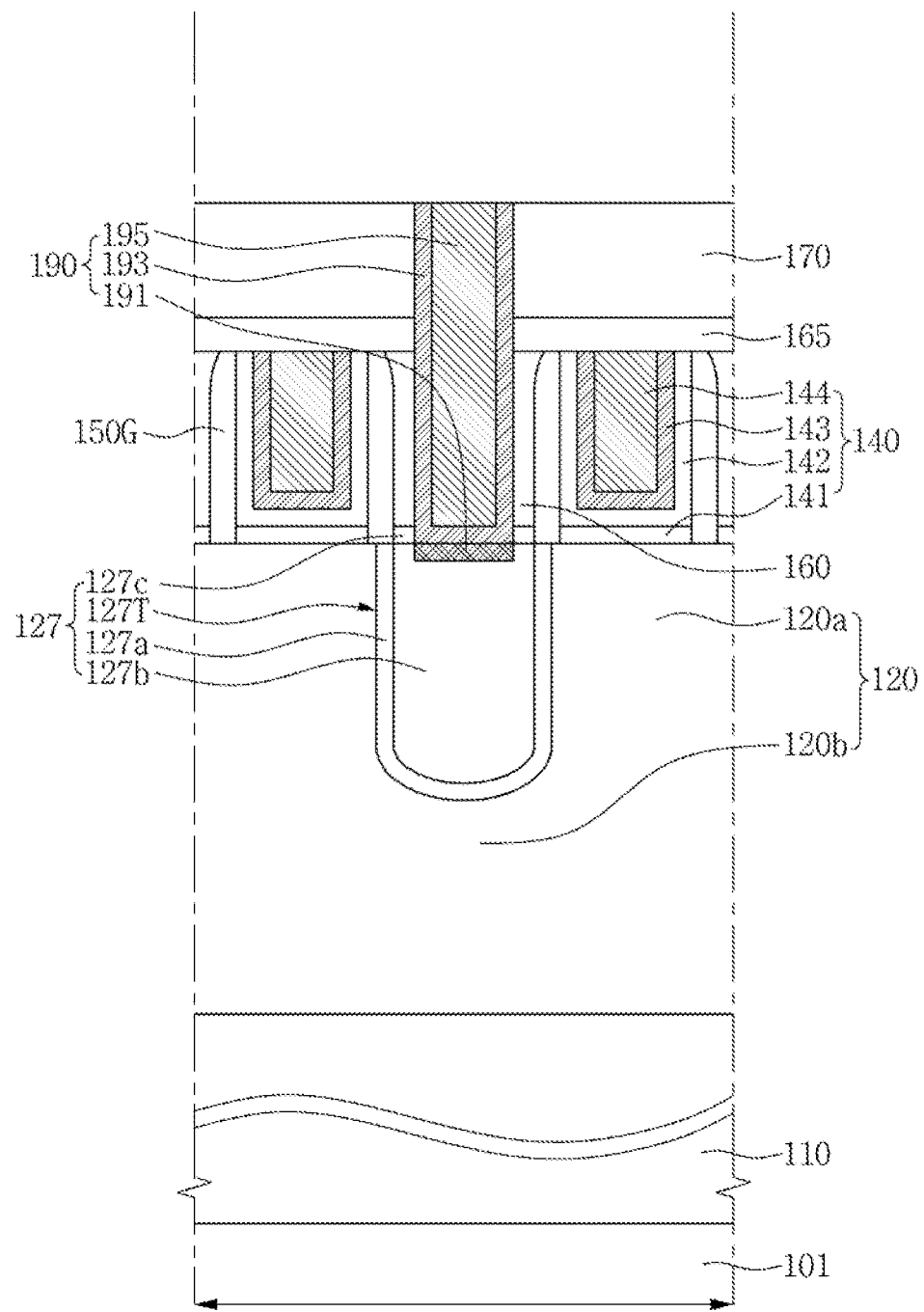
Figure 18B:
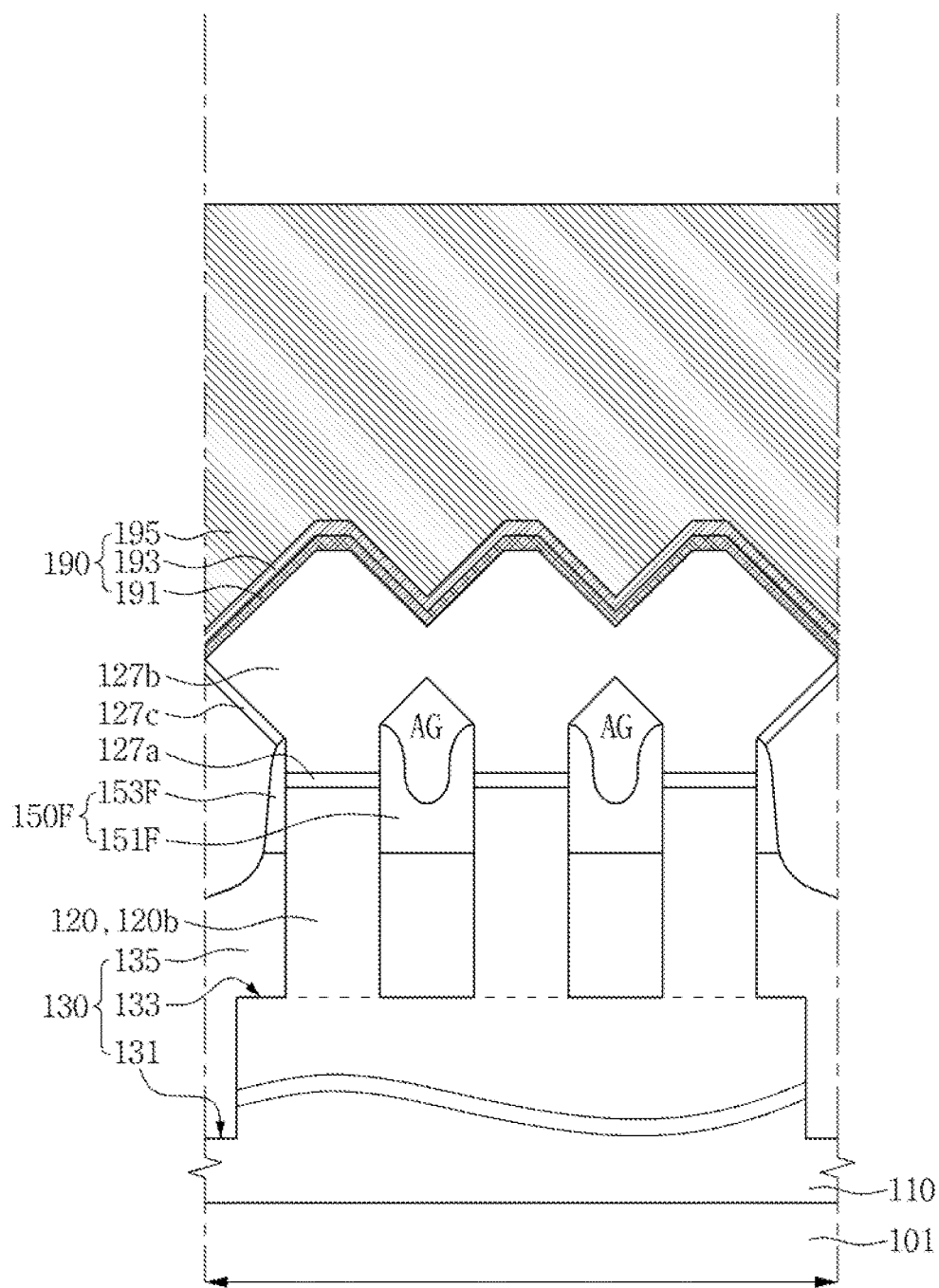

Referring to FIGS. 18A and 18B, the method may include forming contact patterns 190 being in contact with the source/drain areas 127. The forming of the contact patterns 190 may include the following process.

First, the process may include forming contact holes exposing the surfaces of the second epitaxial layers 127b and passing through the intermediate interlayer insulating layer 170, the lower stopper layer 165, the lower interlayer insulating layer 160, and the third epitaxial layers 127c by performing an etching process. At this time, upper ends of the second epitaxial layers 127b may be recessed. Accordingly, the upper ends of the second epitaxial layers 127b may be flat as shown in FIG. 18B.

Next, the process may include forming a silicide layer 191 on surfaces of the second epitaxial layers 127b exposed by the contact holes by performing a silicidation process. The silicide layer 191 may include tungsten silicide (WSi), nickel silicide (NSi), titanium silicide (TiSi), cobalt silicide (CoSi), or another metal silicide.

Next, the process may include forming a contact barrier layer and a contact plug layer on the silicide layer 191 in the contact holes by performing a deposition process.

The contact barrier layer may be conformally formed on a surface of the silicide layer 191, inner walls of the contact holes, and a surface of the intermediate interlayer insulating layer 170. The contact barrier layer may include a barrier metal, such as titanium (Ti), titanium nitride (TiN), tanttalum (Ta), or tanttalum nitride (TaN). The contact plug layer may be formed on the contact barrier layer to fill the contact holes. The contact plug layer may include tungsten (W), copper (Cu), titanium (Ti), or a metal compound.

Next, the process may include forming the contact patterns 190 including the silicide layer 191, contact barrier patterns 193, and contact plugs 195 by removing the contact plug layer and the contact barrier layer on the intermediate interlayer insulating layer 170 by performing a planarization process such as CMP.

Referring again to FIGS. 2 and 3A, the method may include entirely forming an upper stopper layer 175 by performing a deposition process and forming an upper interlayer insulating layer 180 on the upper stopper layer 175 by performing a deposition process. The upper stopper layer 175 may include silicon nitride. The upper interlayer insulating layer 180 may include silicon oxide.

FIGS. 19A to 21B are views illustrating methods of fabricating a semiconductor device 100C according to exemplary embodiments of the inventive concept. For example, FIGS. 19A to 21A are cross-sectional views taken along line I-I' of FIG. 1, FIGS. 19B to 21B are cross-sectional views taken along line II-II' of FIG. 1. Detailed descriptions of the same contents as those of the above-described embodiments will be omitted.

First, referring to FIGS. 5A and 5B, the method of fabricating the semiconductor device 100C in accordance with the embodiment of the inventive concept may include providing a substrate 101, forming a strain buffer layer 110 on the substrate 101, and forming fin active regions 120, an isolation region 130, and sacrificial gate patterns 140s on the strain buffer layer. The fin active regions 120 may include first portions 120a overlapping the sacrificial gate patterns 140s and second portions 120b between the sacrificial gate patterns 140s.

Figure 19A:
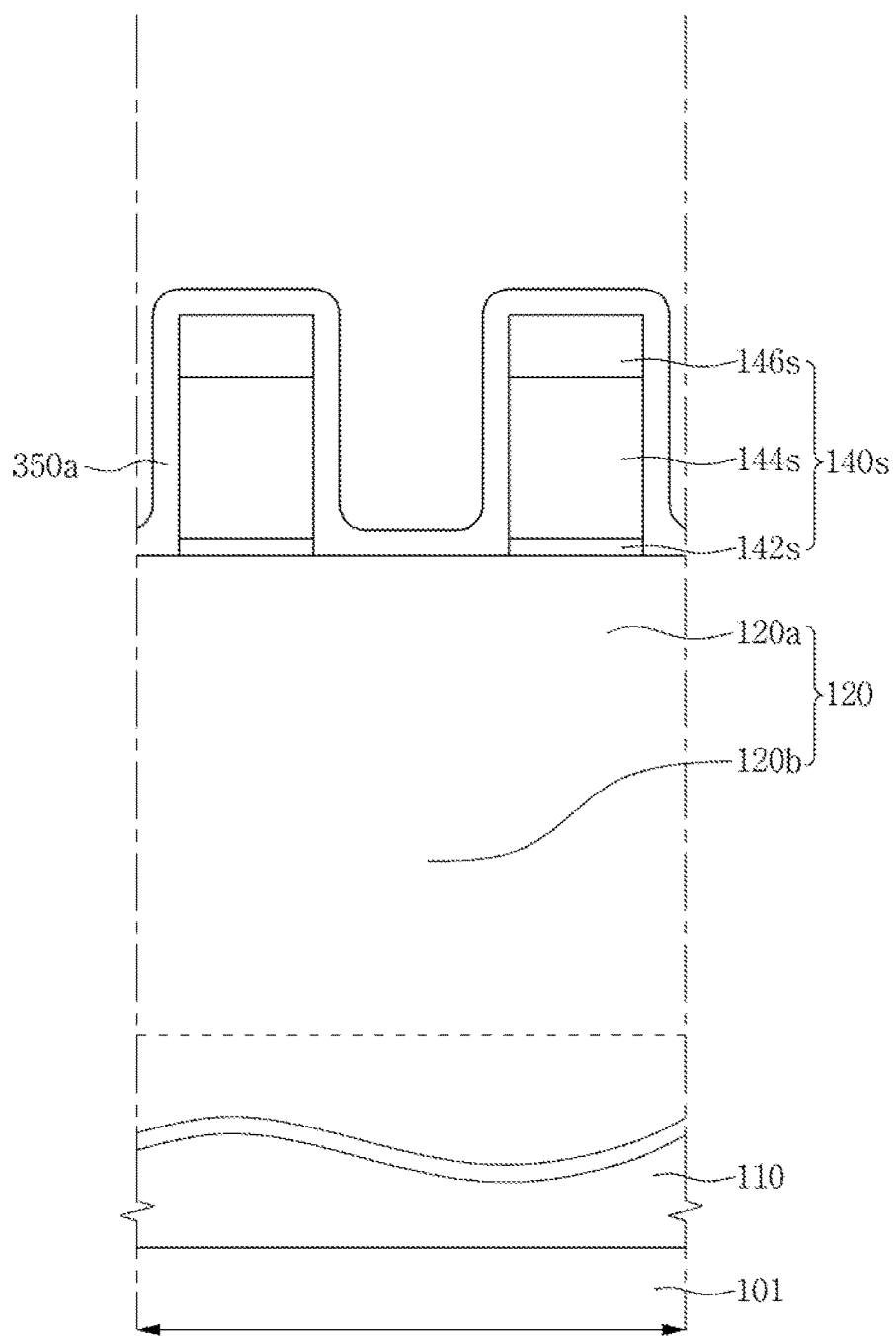
Figure 19B:
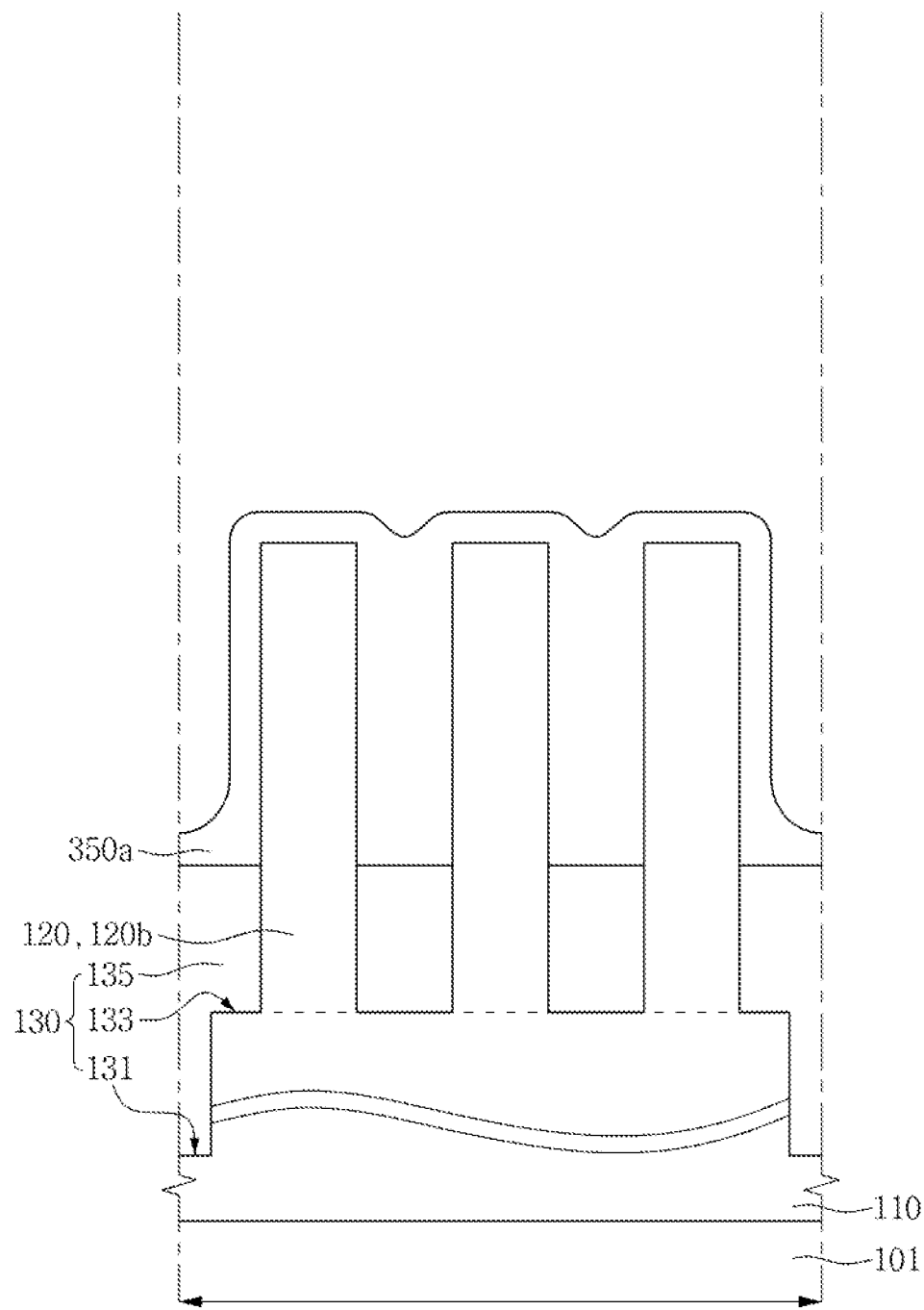

Next, referring to FIGS. 19A and 19B, the method may include a spacer material layer 350a on the sacrificial gate patterns 140s, the fin active regions 120, and the isolation region 130. At this time, the spacer material layer 350a may be conformally formed on top and side surfaces of the sacrificial gate patterns 140s, a surface of the isolation region 130, top surfaces of the fin active regions 120, and outer side surfaces of outermost fin active regions 120 of the fin active regions 120, and fill between the fin active regions 120. This is because intervals between the fin active regions 120 are small, compared to the semiconductor device 100A in FIG. 3A. At this time, a part of the surface of the spacer material layer 350a on the top surface of the fin active regions 120 may have concave shallow bowl shapes. For example, the parts overlapping the isolation region 130 between the fin active regions 120 of the surface of the spacer material layer 350a may have concave shallow bowl shapes.

Figure 20A:
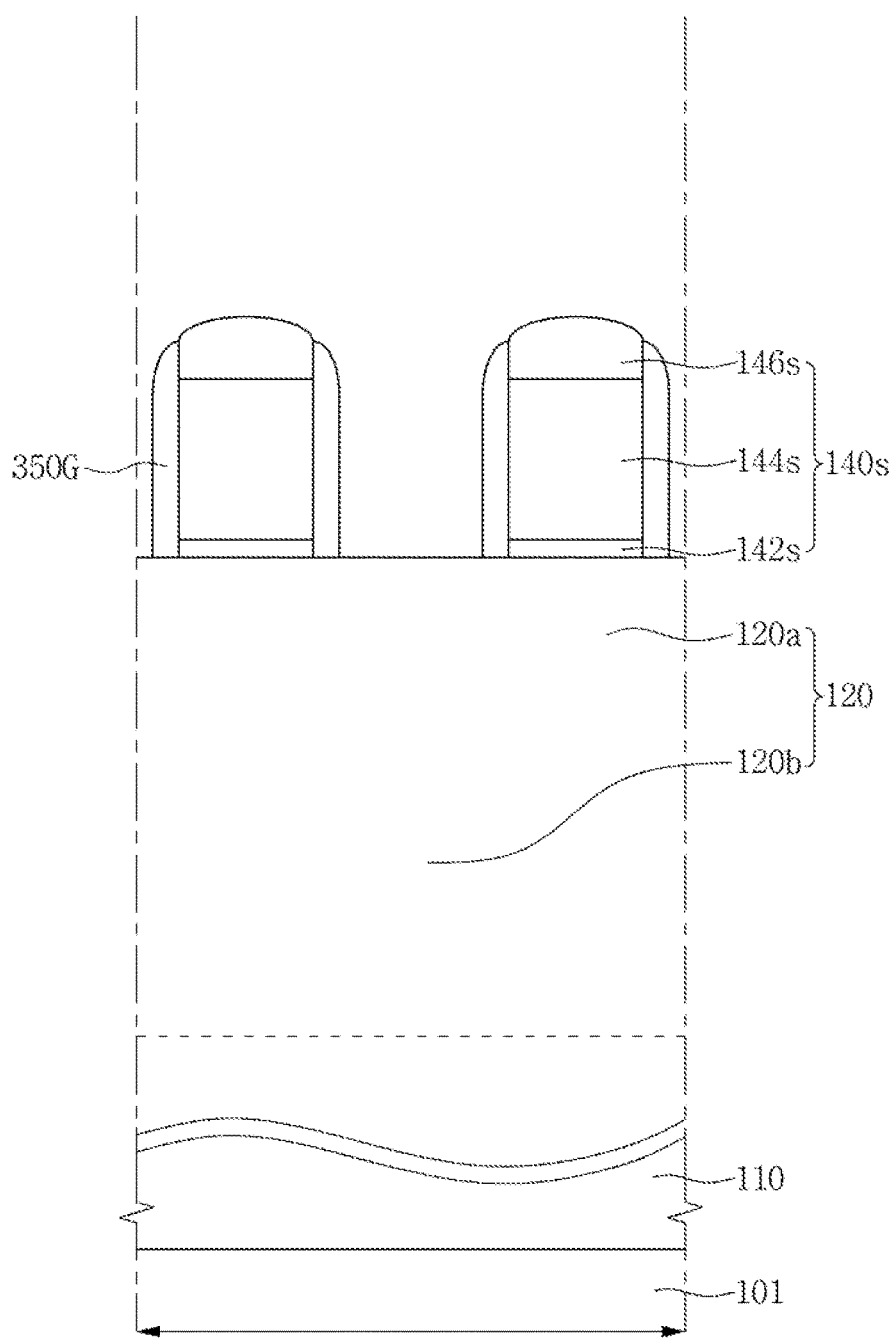
Figure 20B:
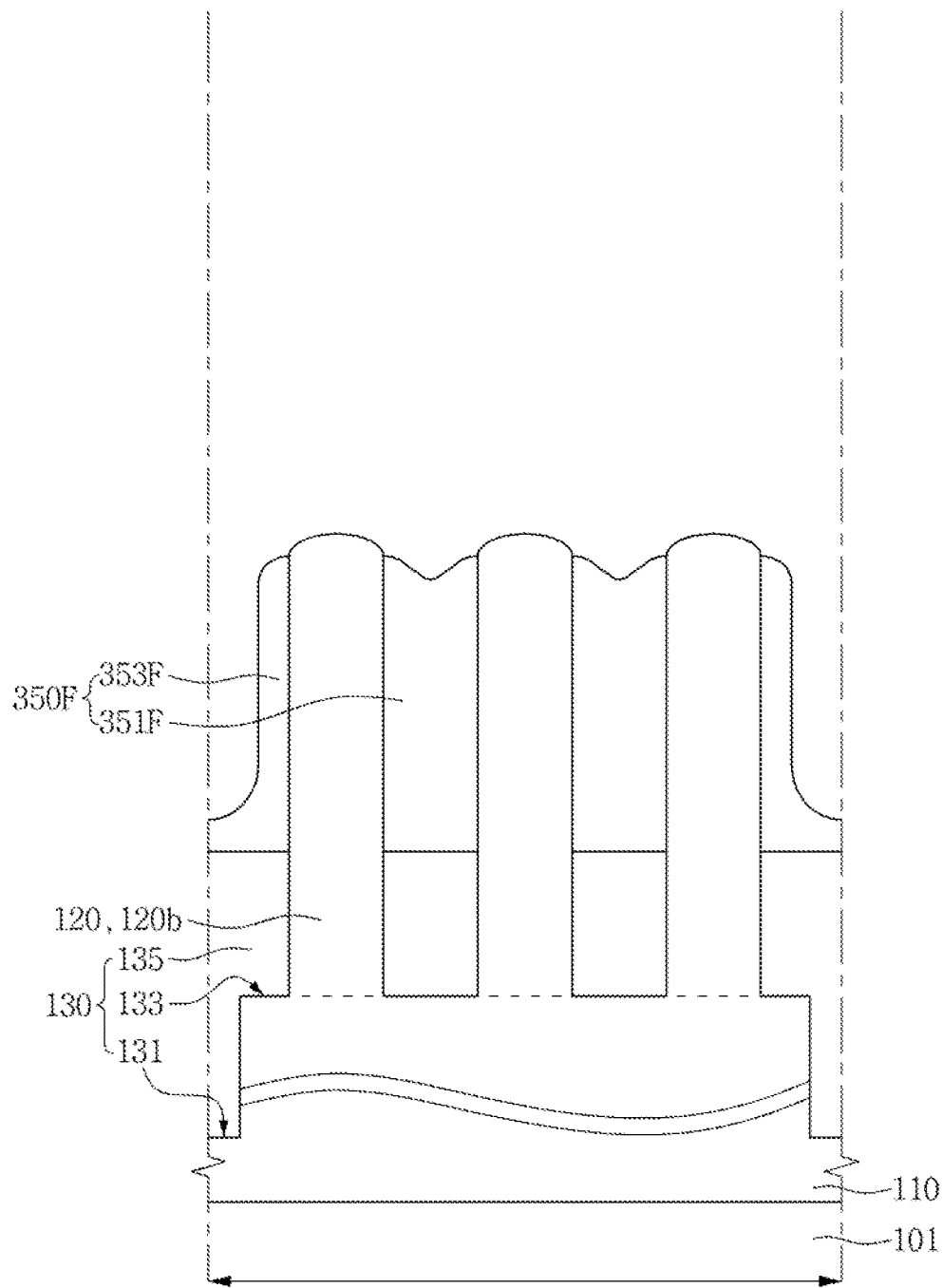

Referring to FIGS. 20A and 20B, the method include forming gate spacers 350G on the side surfaces of the sacrificial gate patterns 140s and fin active region spacers 350F on the side surfaces of the fin active regions 120 by partially removing the spacer material layer 350a by performing an etching process. The fin active region spacers 350F may include inner fin active region spacers 351F between the fin active regions 120 and outer fin active region spacers 353F on the outer side surfaces of the outermost fin active regions 120 of the fin active regions 120. The inner fin active region spacers 351F may fill between the fin active regions 120.

Figure 21A:
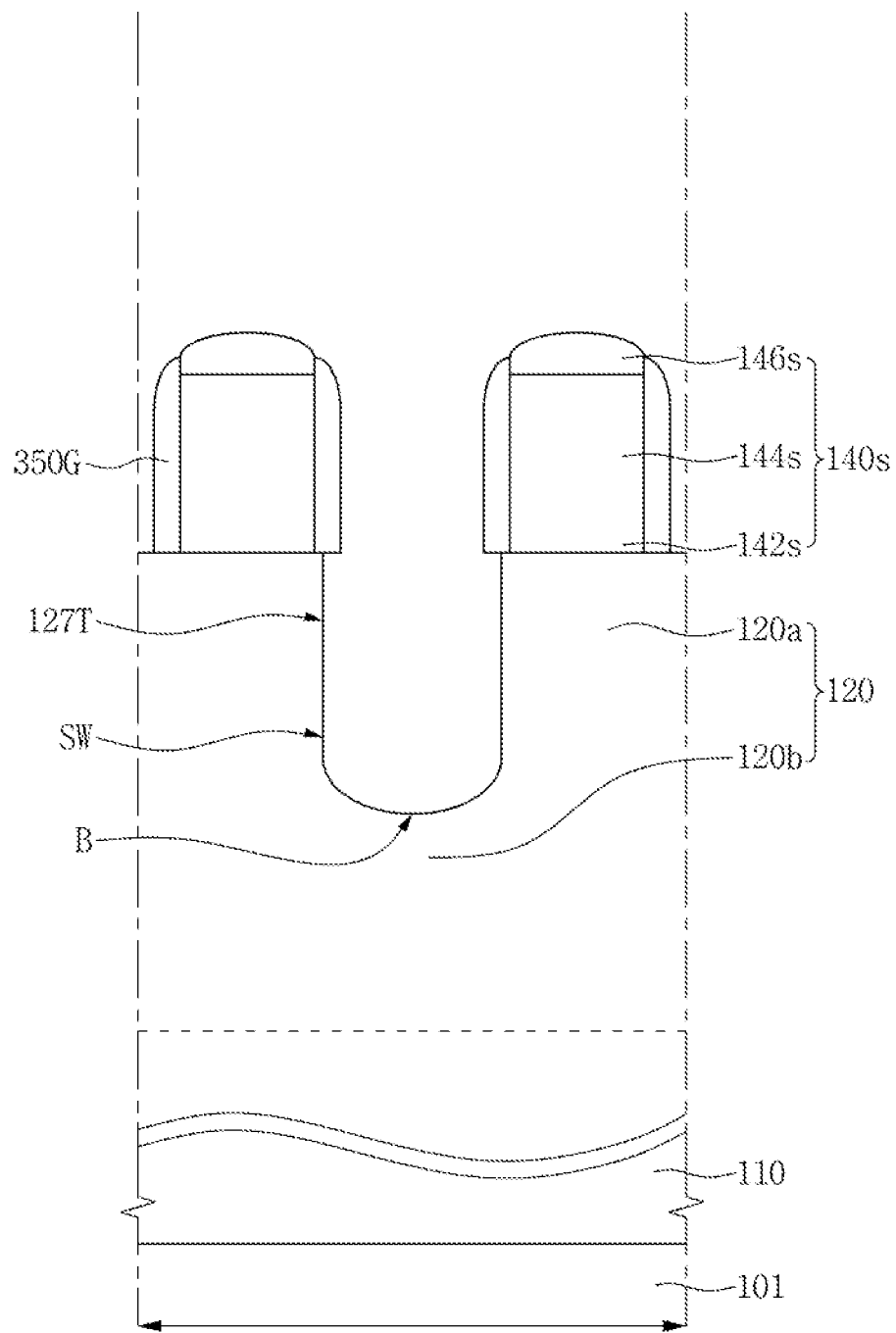
Figure 21B:
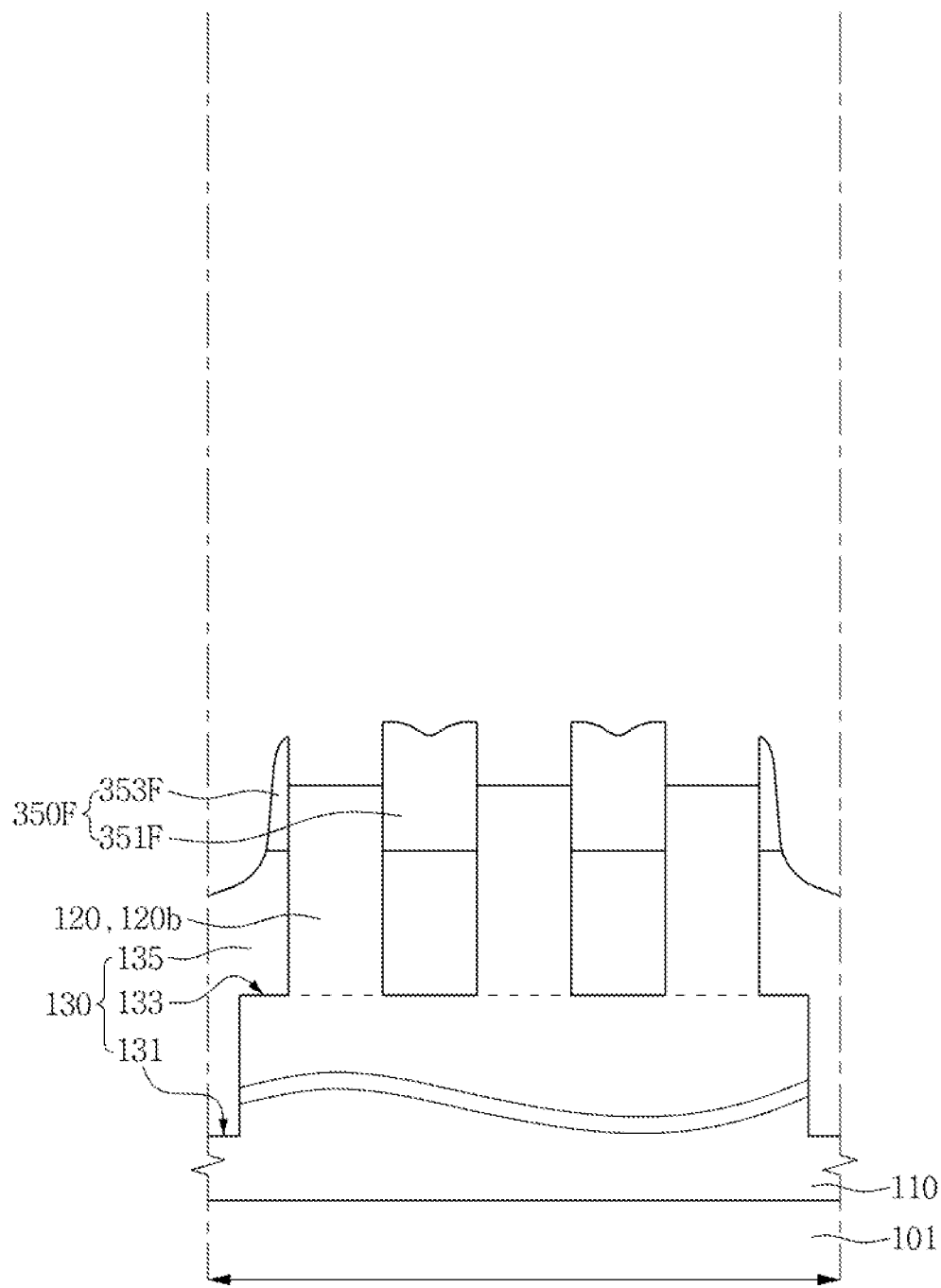

Referring to FIGS. 21A and 21B, the method may include forming source/drain trenches 127T by removing a part of the second portions 120b of the fin active regions 120 by performing an etching process. Heights of the inner fin active region spacers 351F and the outer fin active region spacers 353F may become lower.

Thereafter, the method may include forming a semiconductor device 100C in FIG. 3C by performing processes described in FIGS. 9A to 18B.

Figure 22:
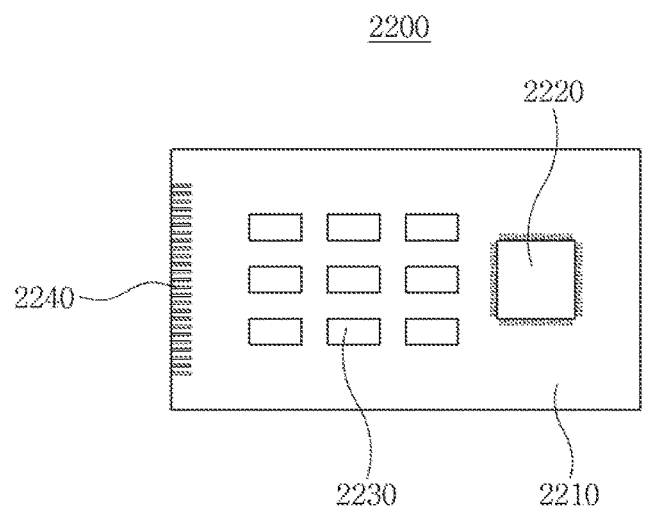
FIG. 22 is a diagram conceptually showing a semiconductor module according to an embodiment of the inventive concept.

FIG. 22 is a diagram conceptually showing a semiconductor module 2200 in accordance with an embodiment of the inventive concept. Referring to FIG. 22, the semiconductor module 2200 in accordance with an embodiment of the inventive concept may include a processor 2220 and semiconductor devices 2230 mounted on a module substrate 2210. The processor 2220 or the semiconductor devices 2230 may include at least one of the semiconductor devices 100A to 100D according to the various embodiments of the inventive concept. Conductive input/output terminals 2240 may be disposed on at least one side of the module substrate 2210.

Figure 23:
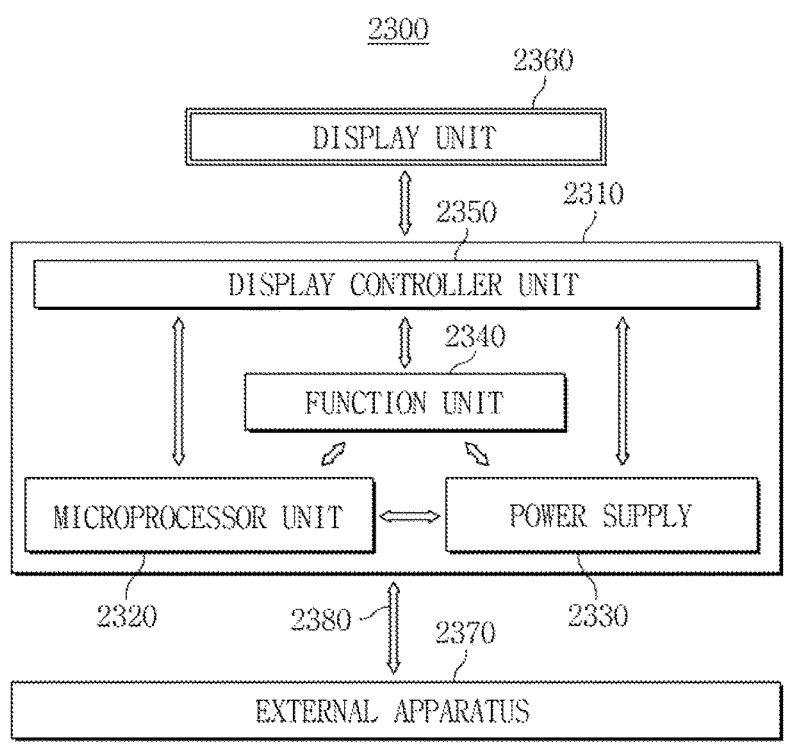
FIGS. 23 and 24 are block diagrams conceptually showing electronic systems according to certain embodiments of the inventive concept.

FIG. 23 is a block diagram conceptually showing an electronic system 2300 in accordance with an embodiment of the inventive concept. Referring to FIG. 23, the electronic system 2300 in accordance with the embodiment of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may be a system board or motherboard including a printed circuit board (PCB) and/or a case. The microprocessor unit 2320, the power supply 2330, the function unit 2340, and the display controller unit 2350 may be mounted or disposed on a top surface or an inside of the body 2310. The display unit 2360 may be disposed on the top surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processing unit (CPU) or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include at least one of the semiconductor devices 100A to 100D according to the various embodiments of the inventive concept.

Figure 24:
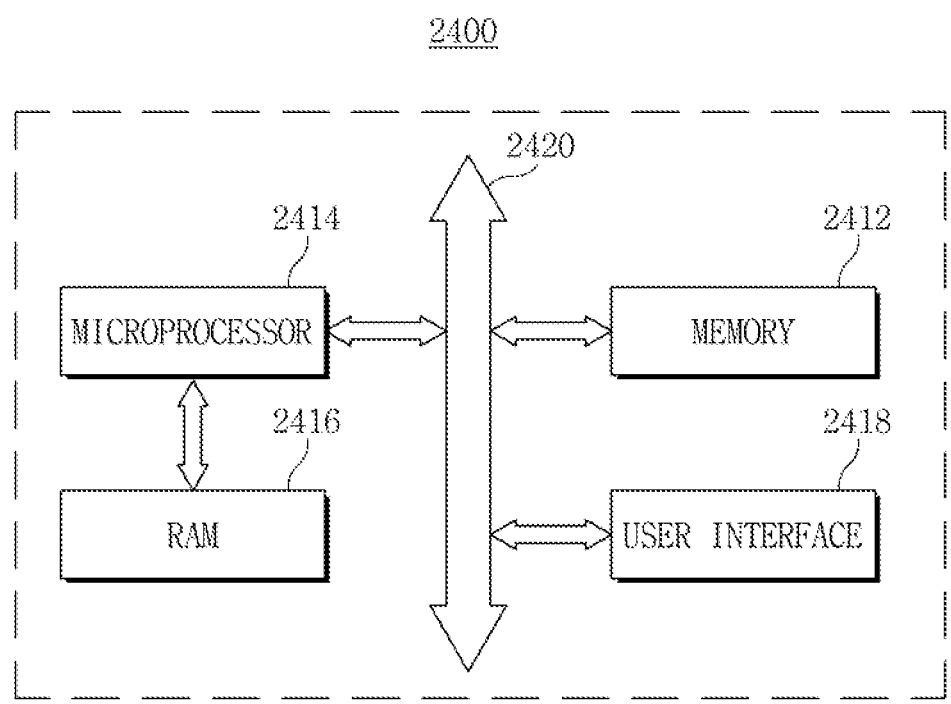

Referring to FIG. 24, an electronic system 2400 in accordance with an embodiment of the inventive concept may include a microprocessor 2414, a memory 2412, and a user interface 2418, which perform data communication using a bus 2420. The microprocessor 2414 may include a CPU or an AP (Application Processor). The electronic system 2400 may further include a random access memory (RAM) 2416 that directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100A to 100D according to the various embodiments of the inventive concept.

A semiconductor device according to the embodiment of the inventive concept may include fin active regions having single crystalline silicon germanium (SiGe). Accordingly, hole mobility in a channel area can be increased by stably applying compressive strain to the channel area. As a result, electrical characteristics of the semiconductor device can be improved.

Further, the semiconductor device according to the embodiment of the inventive concept can include a strain buffer layer having a germanium content lower than the germanium content of the fin active region between a substrate and the fin active regions. Accordingly, the stacking fault occurring in the fin active regions may be reduced, compared to that of fin active regions having high germanium content directly formed on the substrate. As a result, the decrease of compressive strain that is applied to channel areas may be reduced.

Furthermore, in the semiconductor devices according to the embodiments of the inventive concept, lateral lengths of epitaxial growth source/drain areas may be controlled by controlling the height of fin active region spacer on a side surface of the fin active region. As a result, the contact areas between the source/drain areas and contact patterns may be increased.

Although a few embodiments have been described, those skilled in the art will readily appreciate that many modifications are possible without departing from the novel teachings and advantages. Accordingly, all such modifications are intended to be included within the scope of this inventive concept as defined in the claims.

What is claimed is:

1. A semiconductor device comprising:
   fin active region patterns disposed on a substrate and extending parallel to each other;
   an isolation region disposed between the fin active region patterns;
   gate patterns crossing the fin active region patterns and extending parallel to each other;
   source/drain areas on the fin active region patterns between the gate patterns;
   fin active region spacers on the isolation region between the fin active region patterns and contacting side surfaces of the fin active region patterns; and
   air gaps between downwardly facing surfaces of the source/drain areas and above top surfaces of the fin active region spacers,
   wherein, with respect to a cross sectional view taken parallel to an extending direction of the gate patterns, uppermost levels of the fin active region spacers are higher than interfaces between the fin active region patterns and the source/drain areas, and interfaces between the isolation region and the fin active region spacers are lower than bottom surfaces of the source/drain areas.

2. The semiconductor device of claim 1, wherein, with respect to a cross sectional view taken parallel to an extending direction of the gate patterns, top surfaces of the fin active region spacers comprise concave bowl shapes.

3. The semiconductor device of claim 2, wherein, with respect to a cross sectional view taken parallel to an extending direction of the gate patterns, lowermost levels of the top surfaces of the fin active region spacers are lower than top surfaces of the fin active region patterns.

4. The semiconductor device of claim 2, wherein, with respect to a cross sectional view taken parallel to an extending direction of the gate patterns, uppermost levels of the top surfaces of the fin active region spacers are higher than top surfaces of the fin active region patterns.

5. The semiconductor device of claim 1,
   wherein the fin active region patterns comprise source/drain trenches,
   and wherein the source/drain areas include:
      first epitaxial layers conformally formed on inner walls of the source/drain trenches; and
      second epitaxial layers formed on the first epitaxial layers to fill the source/drain trenches.

6. The semiconductor device of claim 5, wherein the second epitaxial layers have protruding parts protruding over the fin active region spacers, and the source/drain areas further include third epitaxial layers partially formed on upper surfaces and lower surfaces of the protruding parts of the second epitaxial layers.

7. The semiconductor device of claim 5, further comprising contact patterns on the source/drain areas,
   wherein the contact patterns are in direct contact with the second epitaxial layers.

8. The semiconductor device of claim 1, wherein the source/drain areas include protruding parts protruding over the fin active region spacers, and the protruding parts of neighboring source/drain areas are connected to each other.

9. The semiconductor device of claim 1, wherein the fin active region patterns include epitaxial single crystalline silicon germanium (SiGe).

10. The semiconductor device of claim 9, further comprising a strain buffer layer disposed on the substrate,
    wherein the strain buffer layer includes epitaxial single crystalline silicon germanium (SiGe) that has a germanium percentage less than a germanium percentage of the fin active region patterns.

11. A semiconductor device comprising:
    fin active region patterns disposed on a substrate and extending parallel to each other in a first direction, the fin active region patterns comprising first and second outermost fin active region patterns and inner fin active region patterns disposed between the first and second outermost fin active region patterns;
    an isolation region disposed adjacent to the fin active region patterns;
    gate patterns on first portions of fin active region patterns;
    source/drain areas contacting second portions of the fin active region patterns;
    inner fin active region spacers on side surfaces of the inner fin active region patterns; and
    outer fin active region spacers disposed on outer side surfaces of the first and second outermost fin active region patterns,
    wherein side surfaces of the inner fin active region spacers are in contact with the side surfaces of the inner fin active region patterns, and
    bottom surfaces of the inner fin active region spacers are in contact with a surface of the isolation region, and uppermost levels of the inner fin active region spacers are higher than top surfaces of the second portions of the fin active region patterns and uppermost levels of the outer fin active region spacers are lower than the uppermost levels of the inner fin active region spacers.

12. The semiconductor device of claim 11, wherein the uppermost levels of the outer fin active region spacers are substantially at the same height.

13. The semiconductor device of claim 11, further comprising air gaps interposed between the inner fin active region spacers, lower surfaces of protruding parts of the source/drain areas, and the surface of the isolation region.

14. A semiconductor device comprising:
a strain buffer layer disposed on a substrate;
fin active regions disposed on the strain buffer layer and extending parallel to each other in a first direction;
an isolation region disposed on the strain buffer layer between the fin active regions, wherein a top surface of the isolation region is lower than top surfaces of the fin active regions;
gate patterns disposed on the fin active regions and extending parallel to each other in a second direction perpendicular to the first direction;
epitaxial material disposed on the fin active regions between the gate patterns;
inner fin active region spacers interposed between and on side surfaces of the fin active regions; and
outer fin active region spacers disposed on outer side surfaces of outermost fin active regions of the fin active regions,
wherein the epitaxial material disposed on the fin active regions comprises first oblique downwardly facing surfaces extending from respective top surfaces of the inner fin active region spacers and second oblique downwardly facing surfaces extending from respective top surfaces the outer fin active region spacers, and
wherein bottom edges of the first oblique downwardly facing surfaces are higher than bottom edges of the second oblique downwardly facing surfaces.

15. The semiconductor device of claim 14,
wherein the epitaxial material includes protruding parts that protrude above the inner fin active region spacers and the outer fin active region spacers, and wherein the protruding parts include first upper surfaces and first lower surfaces that are parallel to each other in a first direction and second upper surfaces and second lower surfaces that are parallel to each other in a second direction different from the first direction,
wherein the first lower surfaces and second lower surfaces comprise the first and second oblique downwardly facing surfaces of the fin active regions.

16. The semiconductor device of claim 15,
wherein a lateral length of a first lower surface of the protruding part extending over a first outer fin active region spacer is greater than lateral lengths of the first lower surfaces of the protruding parts extending over the inner fin active region spacers, and
wherein a lateral length of a second lower surface of the protruding part extending over a second outer fin active region spacer is greater than lateral lengths of the second lower surfaces of the protruding parts extending over the inner fin active region spacers.

17. The semiconductor device of claim 16,
wherein a lateral length of a first upper surface of the protruding part extending over the first outer fin active region spacer is greater than lateral lengths of the first upper surfaces of the protruding parts extending over the inner fin active region spacers, and
wherein a lateral length of a second upper surfaces of the protruding part extending over the second outer fin active region spacer is are greater than lateral lengths of the second upper surfaces of the protruding parts extending over the inner fin active region spacers.

18. The semiconductor device of claim 14, further comprising gate spacers disposed on side surfaces of the gate patterns,
wherein the gate spacers, the inner fin active region spacers and the outer fin active region spacers are formed of the same material layer.

* * * * *